(12) United States Patent
Nishiyama et al.

(10) Patent No.: US 7,465,528 B2
(45) Date of Patent: *Dec. 16, 2008

(54) POSITIVE-WORKING PHOTOSENSITIVE COMPOSITION AND PATTERN FORMING METHOD USING THE SAME

(75) Inventors: Fumiyuki Nishiyama, Shizuoka (JP); Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/581,407

(22) Filed: Oct. 17, 2006

(65) Prior Publication Data

US 2007/0087288 A1   Apr. 19, 2007

(30) Foreign Application Priority Data

Oct. 17, 2005   (JP)   ............................ P2005-301731

(51) Int. Cl.
*G03F 7/039* (2006.01)
(52) U.S. Cl. .................... 430/270.1; 430/326; 430/921; 430/922
(58) Field of Classification Search ........................ None
See application file for complete search history.

(56) References Cited

U.S. PATENT DOCUMENTS

| | | | |
|---|---|---|---|
| 6,200,729 B1 * | 3/2001 | Aoai et al. | 430/270.1 |
| 2005/0042541 A1 * | 2/2005 | Hagihara et al. | 430/270.1 |
| 2005/0074690 A1 | 4/2005 | Liu et al. | |
| 2005/0147915 A1 * | 7/2005 | Dammel | 430/270.1 |
| 2005/0186503 A1 * | 8/2005 | Nishiyama et al. | 430/270.1 |
| 2006/0040203 A1 * | 2/2006 | Kodama et al. | 430/270.1 |
| 2006/0210916 A1 * | 9/2006 | Yamazaki et al. | 430/270.1 |
| 2007/0031757 A1 * | 2/2007 | Kodama et al. | 430/270.1 |
| 2007/0054217 A1 * | 3/2007 | Kodama et al. | 430/270.1 |
| 2007/0072118 A1 * | 3/2007 | Nishiyama et al. | 430/270.1 |

FOREIGN PATENT DOCUMENTS

| | | | |
|---|---|---|---|
| EP | 1536285 A2 * | 6/2005 | |
| EP | 1566692 A1 * | 8/2005 | |
| JP | 9-73173 A | 3/1997 | |
| JP | 2001-215704 A | 8/2001 | |
| JP | 2005266766 A * | 9/2005 | |

OTHER PUBLICATIONS

3M Fluorad TM Fluorosurfactant FC-4430, Product Information, from 3M Specialty Materials, St. Paul, MN issued Mar. 2002, 4 pages.*
Terrazas et al, Speciality Chemicals Magazine, Mar. 2004, vol. 24, No. 3, pp. 19-22 obtained from http://multimedia.3m.com/mws/mediawebserver?66666UuZjcFSLXTt48TXLXf_EVuQEcuZgVs6EVs6E666666—via a Google search.*
Materials: Feb. 2002—Products-Paint and Coatings Industry from www.pcimag.com/Articles/Products/)b53754db76a7010VgnVCM1000000f932a8c0, 3 pages.*

* cited by examiner

*Primary Examiner*—Cynthia Hamilton
(74) *Attorney, Agent, or Firm*—Sughrue Mion, PLLC

(57) ABSTRACT

A positive-working photosensitive composition that includes (A) a resin containing repeating units having diamantane structures and capable of decomposing under action of an acid to increase solubility in an alkali developer, (B) a compound capable of generating a specific organic acid upon irradiation with an actinic ray or radiation, and (C) a solvent.

9 Claims, No Drawings

POSITIVE-WORKING PHOTOSENSITIVE COMPOSITION AND PATTERN FORMING METHOD USING THE SAME

BACKGROUND OF THE INVENTION

1. Field of the Invention

The present invention relates to a positive-working photosensitive composition that is used in a manufacturing process of semiconductors, such as ICs, a process of producing circuit boards for LCDs and thermal heads and other photofabrication processes, and to a pattern forming method using such a composition. More specifically, the invention is concerned with a positive-working photosensitive composition suitable for the cases where far ultraviolet light of wavelengths not longer than 250 nm is used as an exposure light source or a beam of electrons is used as an irradiation source, and with a pattern forming method using such a composition.

2. Description of the Related Art

Chemical amplification photosensitive compositions are materials that form patterns on substrates by undergoing irradiation with actinic rays, such as far ultraviolet rays, or radiation to generate acids in the irradiated areas, and causing reaction utilizing the acids as catalysts to make a difference in developer solubility between the unirradiated and irradiated areas.

When KrF excimer laser is an exposure light source, resins containing as their basic skeletons poly(hydroxystyrene)s showing weak absorption in the region of 248 nm are mostly used as the main components. Therefore, such photosensitive compositions have high sensitivity and can form good-quality patterns at high resolution, compared with traditional compositions containing naphthoquinonediazide/navolak resin combinations.

However, when light sources of shorter wavelengths, such as ArF excimer laser (193 nm), are used for exposure, even the chemical amplification photosensitive compositions mentioned above are not satisfactory, because compounds having aromatic groups intrinsically show strong absorption at wavelengths around 193 nm.

Accordingly, resists containing resins having alicyclic hydrocarbon structures have been developed with the aim of using ArF excimer laser as an irradiation light source. For instance, the resist composition containing an acid-decomposable resin having adamantane structures is disclosed in JP-A-9-73173. However, as finer patterning has been required, reduction in resist film thickness has become necessary, and resists have been required to have higher dry etching resistance. U.S. Patent 2005/0074690 discloses the resins containing repeating units having diadamantane structures.

Although the dry etching resistance correlates with the carbon density in resin and can be enhanced by increasing the carbon density, the resin becomes more hydrophobic as the carbon density is increased, sometimes resulting in aggravation of development defectiveness and deterioration in pattern formability. As to a solution to this problem, JP-A-2001-215704 discloses that the resins having specified high-polar polymerizing units in addition to the polymerizing units of adamantane structures are effective in improving wettability with an alkaline developer.

Even when such a measure was taken, there still occurred a development defectiveness problem that, when fine patterns 100 nm or below in line width were formed, lines of the patterns formed were linked together by micro-bridges although the resolution was excellent, so breaks of lines were caused in the subsequent etching process to lower yields of devices, and besides, it was not said that the performance on a mask error factor (referred to as "MEF" hereinafter) as one of image performances was sufficient. The term "MEF" signifies a phenomenon that variations in mask accuracy are amplified by resist. From the viewpoint of ensuring compatibility between those performances, not only the structures of specified repeating units but also the formula design including a combination with a photo-acid generator as a photosensitive component is of importance.

SUMMARY OF THE INVENTION

Therefore, an object of the invention is to provide a positive-working photosensitive composition improved in development defectiveness and a mask error factor even in formation of fine patterns 100 nm or below in line width, and to provide a pattern forming method using such a composition.

It has been found that the foregoing problems can be solved by embodiments of the invention as described below.

(1) A positive-working photosensitive composition comprising:

(A) a resin that contains repeating units having diamantane structures and can decompose under action of an acid to increase solubility in an alkali developer;

(B) a compound that can generate an organic acid represented by formula (2), (3), (3'), (4) or (5) upon irradiation with an actinic ray or radiation; and (C) a solvent,

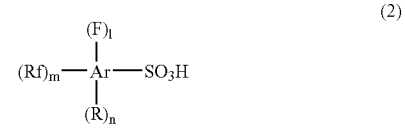

In formula (2), Rf represents an organic group having a fluorine atom, R represents a hydroxyl group or an organic group, Ar represents an aromatic group, l represents an integer of 1 to 6, m represents an integer of 0 to 4, and n represents an integer of 0 to 4, provided that m+n is an integer of 1 or above.

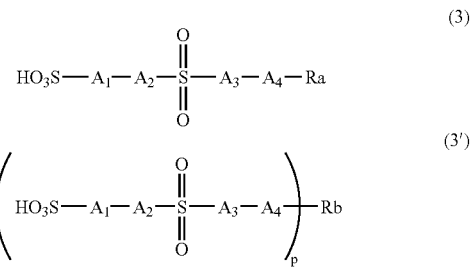

In formulae (3) and (3'), $A_1$ represents a divalent linkage group, $A_2$ and $A_3$ each independently represents a single bond, an oxygen atom or —N(Rx)—, Rx represents a hydrogen atom, an aryl group, an alkyl group or a cycloalkyl group, $A_4$ represents a single bond or —C(=O)—, Ra represents a hydrogen atom or an organic group, p represents 2 or 3, and Rb represents a p-valent linkage group, and when $A_3$ is —N(Rx)—, Ra and Rx, or Rb and Rx may combine with each other to form a ring.

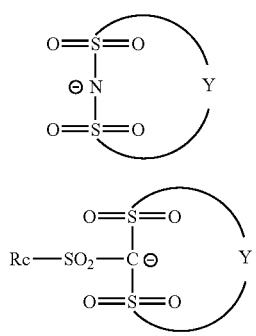

In formulae (4) and (5), Y represents an alkylene group substituted with at least one fluorine atom, and Rc represents an alkyl group or a cycloalkyl group.

(2) The positive-working photosensitive composition as described in (1), wherein the resin (A) has a weight-average molecular weight of 3,000 to 30,000 and a dispersion degree of 1.1 to 3.0.

(3) The positive-working photosensitive composition as described in (1) or (2), the resin (A) further comprises a repeating unit having an adamantane structure.

(4) The positive-working photosensitive composition as described in any of (1) to (3), wherein the resin (A) further comprises an acid-indecomposable repeating unit.

(5) The positive-working photosensitive composition as described in any of (1) to (4), wherein the solvent (C) comprises an alkylene glycol monoalkyl ether carboxylate.

(6) The positive-working photosensitive composition as described in (5), wherein the solvent (C) further comprises at least one additional solvent selected from solvents each having at least one functional group selected from a hydroxyl group, a ketone group, a lactone group, an ester group, an ether group or a carbonate group.

(7) The positive-working photosensitive composition as described in (6), wherein the alkylene glycol monoalkyl ether carboxylate is propylene glycol monomethyl ether acetate, and said at least one additional solvent is at least one solvent selected from propylene glycol monomethyl ether, cyclohexanone, γ-butyrolactone, butyl acetate or ethyl lactate.

(8) The positive-working photosensitive composition as described in any of (1) to (7), the resin (A) is a resin synthesized by drop polymerization.

(9) A pattern forming method comprising: forming a photosensitive film from the positive-working photosensitive composition as described in any of (1) to (8); and exposing and developing the photosensitive film.

DETAILED DESCRIPTION OF THE INVENTION

Best modes for carrying out the invention are illustrated below.

Additionally, the term "group (atomic group)" used in this specification is intended to include both unsubstituted and substituted ones when neither word substituted nor unsubstituted is added thereto. For instance, the term "alkyl group" is intended to include not only an alkyl group having no substituent (an unsubstituted alkyl group) but also an alkyl group having a substituent or substituents (a substituted alkyl group).

[1] (A): Resin that Contains Repeating Units Having Diamantane Structures and can Decompose Under Action of Acid to Increase Solubility in Alkali Developer (Also Referred to as Resin of Component (A))

The resin of Component (A) is a resin having at least one kind of groups capable of decomposing under action of an acid to increase solubility in an alkali developer (hereinafter referred to as "acid-decomposable groups" also). Such acid-decomposable groups may be present in repeating units having diamantane structures or other repeating units.

Examples of an acid-decomposable group include groups prepared by protecting hydrogen atoms of alkali-soluble groups, such as a carboxyl group and a hydroxyl group, with groups capable of splitting off under action of an acid.

Examples of a group capable of splitting off under action of an acid include —C($R_{36}$)($R_{37}$)($R_{38}$), —C($R_{36}$)($R_{37}$)(O$R_{39}$) and —($R_{01}$)($R_{02}$)(O$R_{39}$).

In the above formulae, $R_{36}$ to $R_{39}$ each represent an alkyl group, a cycloalkyl group, an aryl group, an aralkyl group or an alkenyl group independently. $R_{36}$ and $R_{37}$ may combine with each other to form a ring.

$R_{01}$ and $R_{02}$ each represent a hydrogen atom, an alkyl group, a cycloalkyl group, an aryl group, an aralkyl group or an alkenyl group independently.

The repeating units having diamantane structures (Aa) are preferably repeating units selected from the following (Aa-1) or (Aa-2).

(Aa-1): Repeating units that have acid-decomposable groups and contain diamantane structures in the groups capable of splitting off from the acid-decomposable groups under action of an acid.

(Aa-2): Repeating units that have diamantane structures and are insensitive to the action of acid or alkali.

The repeating units (Aa-1) or (Aa-2) may have substituents, and examples of such substituents include alkyl groups and polar functional groups. Of these repeating units, those having structures in which each individual diamantane is substituted by a polar group are preferred over others. Examples of such a polar group include a hydroxyl group, a carboxyl group, a cyano group, an amido group, a sulfonamido group and a sulfonylimido group, and the hydroxyl group is preferable to the others.

(Aa-1): Repeating Units that Have Acid-decomposable Groups and Contain Diamantane Structures in Groups Capable of Splitting Off from the Acid-Decomposable Groups Under Action of Acid The groups having diamantane structures and capable of splitting off under action of an acid are preferably groups represented by any of the following formulae (DpI) to (DpV). And repeating units having acid-decomposable groups prepared by protecting hydrogen atoms of alkali-soluble groups with any of groups represented by formula (DpI) to (DpV) may be suitable as the repeating units that have acid-decomposable groups and contain diamantane structures in groups capable of splitting off from the acid-decomposable groups under action of acid.

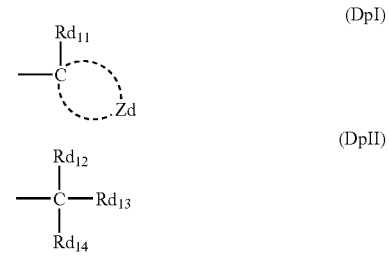

-continued

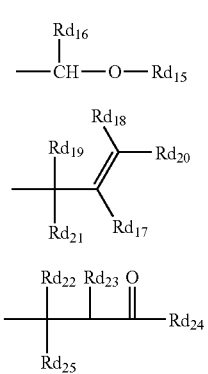

(DpIII)

(DpIV)

(DpV)

In formulae (DpI) to (DpV), $Rd_{11}$ represents a methyl group, an ethyl group, an n-propyl group, an isopropyl group, an n-butyl group, an isobutyl group or a sec-butyl group, and Zd represents atoms required for forming a diamantyl group together with the carbon atom.

$Rd_{12}$ to $Rd_{16}$ each represent a 1-4C linear or branched alkyl group or a cycloalkyl group independently, provided that at least one of $Rd_{12}$ to $Rd_{14}$, or either $Rd_{15}$ or $Rd_{16}$ represents a diamantyl group or a group having a diamantyl group (preferably a 1-5C alkyl group having a diamantyl group).

$Rd_{17}$ to $Rd_{21}$ each represent a 1-4C linear or branched alkyl group or a cycloalkyl group independently, provided that at least one of $Rd_{17}$ to $Rd_{21}$ represents a diamantyl group or a group having diamantyl group (preferably a 1-5C alkyl group having a diamantyl group) and either $Rd_{19}$ or $Rd_{21}$ represents a 1-4C linear or branched alkyl group or a cycloalkyl group.

$Rd_{22}$ to $Rd_{25}$ each represent a hydrogen atom, a 1-4C linear or branched alkyl group or a cycloalkyl group, provided that at least one of $Rd_{22}$ to $Rd_{25}$ represents a diamantyl group or a group having a diamantyl group (preferably a 1-5C alkyl group having a diamantyl group). In addition, $Rd_{23}$ and $Rd_{24}$ may combine with each other to form a ring.

The repeating units having acid-decomposable groups prepared by protecting hydrogen atoms of alkali-soluble groups with any of groups represented by formulae (DpI) to (DpV) are preferably repeating units represented by the following formula (DPA):

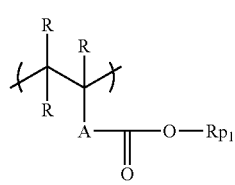

(DPA)

In formula (DPA), each R represents a hydrogen atom, a halogen atom, a 1-4C linear or branched alkyl group, a carboxyl group, an alkoxycarbonyl group or a hydroxymethyl group. The plural Rs may be the same or different.

A represents a divalent group selected from a single bond, an alkylene group, an ether group, a thioether group, a carbonyl group, an ester group, an amido group, a sulfonamido group, a urethane group, a urea group or combinations of two or more of the groups recited, preferably a single bond.

$Rp_1$ represents any of the groups represented by the foregoing formulae (DpI) to (DpV).

Suitable examples of repeating units (Aa-1) are illustrated below, but these examples should not be construed as limiting the scope of the invention.

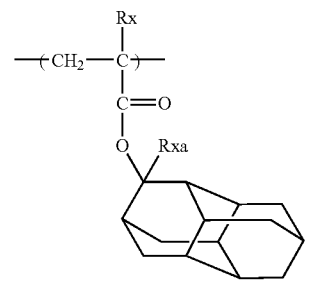

D1-1

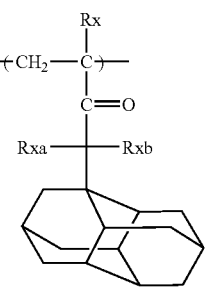

D1-2

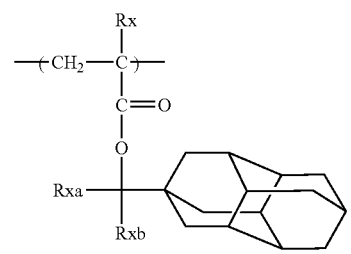

D1-3

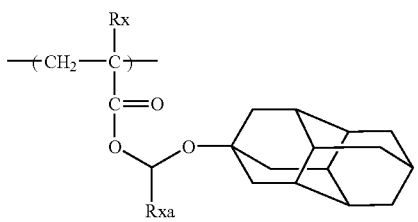

D1-4

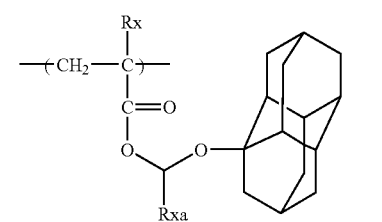

D1-5

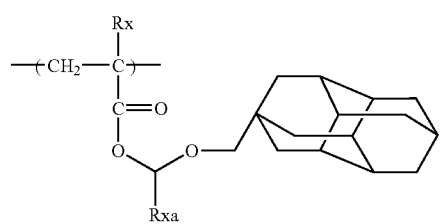

D1-6

-continued

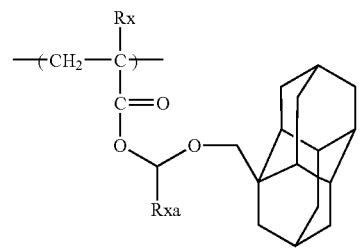
D1-7

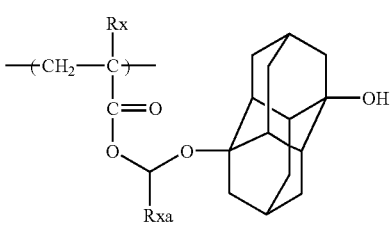
D1-8

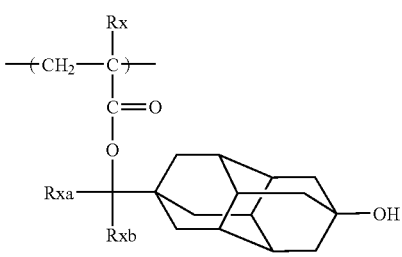
D1-9

Rx in each of the above examples represents H, CH$_3$, CF$_3$ or CH$_2$OH.

Rxa and Rxb each represent a 1-6C linear or branched alkyl group or a 3-6C cycloalkyl group independently, and the alkyl chain in the alkyl or cycloalkyl group may contain a hetero atom, such as an oxygen or sulfur atom.

(Aa-2): Repeating Units that Have Diamantane Structures and are Insensitive to the Action of Acid or Alkali The expression "insensitive to the action of acid or alkali" used in the invention means that the repeating units concerned have no reactivity or only slight reactivity to the action of acids or alkalis in generally used processes, and don't have any groups capable of contributing in a substantial sense to image formation by the action of acids or alkalis. In the case of a positive-working chemical amplification photosensitive composition, for example, an acid is generated in an exposure process by decomposition of an acid generator in exposed areas. In an after-heating process, the acid decomposes a resin having acid-decomposable groups to result in release of alkali-soluble groups, and thereby the exposed areas alone are rendered alkali-developable. Thus, the exposed areas are selectively developed in an alkaline development process, and thereby patterns are formed. The repeating units (Aa-2) have no reactivity or only slight reactivity to acids or alkalis in the exposure, after-heating and development processes, and they don't have any groups capable of substantially contributing a change in dissolution contrast.

The repeating units (Aa-2) are suitably represented by the following formula (DPB):

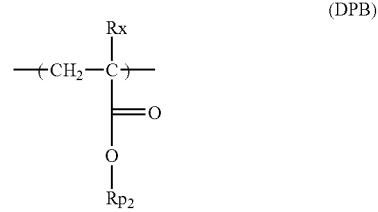
(DPB)

In formula (DPB), Rx represents H, CH$_3$, CF$_3$ or CH$_2$OH.

Rp$_2$ represents a diamantyl group or a group having a diamantyl group (preferably a 1-5C alkyl group having a diamantyl group), and what is more, it is a group incapable of leaving the oxygen group under the action of acid or alkali. Examples of a group incapable of leaving the oxygen atom under the action of acid or alkali include groups according to primary ester linkage and groups according to secondary ester linkage. Further, tertiary ester structures that the tertiary carbon atoms situated in 1-, 4-, 6- and 9-positions of diamantyl groups are each coupled to ester linkage as in D2-1, D2-2, and D2-5 to D2-14 illustrated below can also be given as suitable examples because they don't exhibit any acid-decomposable property and have no substantial contribution to image formation by the action of acid.

Suitable examples of repeating units (Aa-2) are illustrated below, but these examples should not be construed as limiting the scope of the invention.

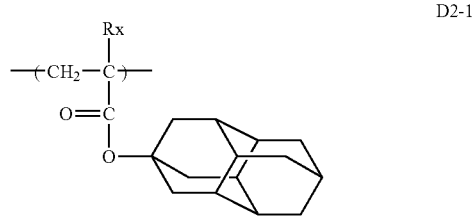
D2-1

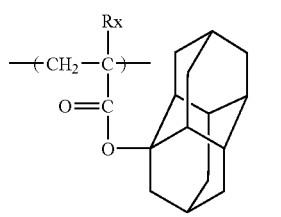
D2-2

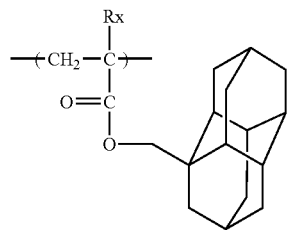
D2-3

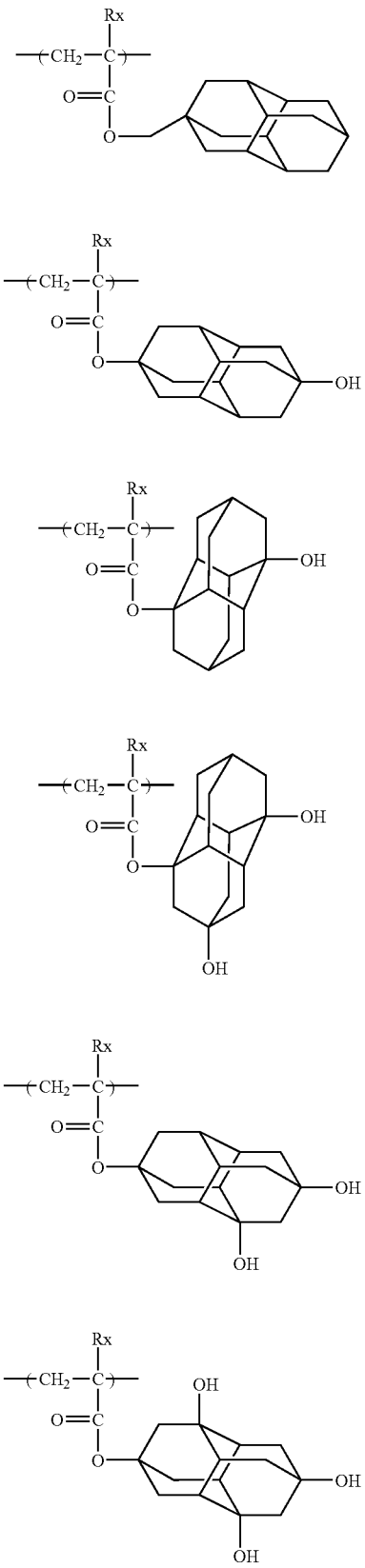
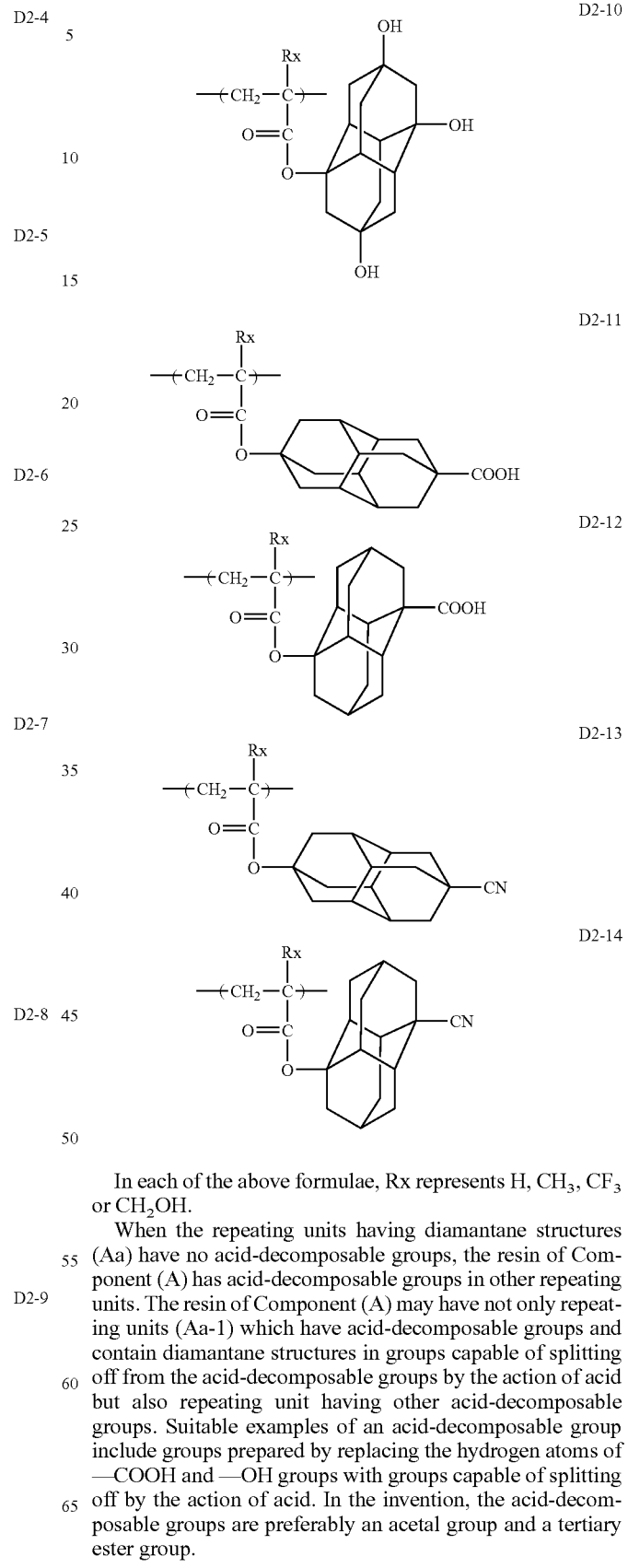

In each of the above formulae, Rx represents H, CH$_3$, CF$_3$ or CH$_2$OH.

When the repeating units having diamantane structures (Aa) have no acid-decomposable groups, the resin of Component (A) has acid-decomposable groups in other repeating units. The resin of Component (A) may have not only repeating units (Aa-1) which have acid-decomposable groups and contain diamantane structures in groups capable of splitting off from the acid-decomposable groups by the action of acid but also repeating unit having other acid-decomposable groups. Suitable examples of an acid-decomposable group include groups prepared by replacing the hydrogen atoms of —COOH and —OH groups with groups capable of splitting off by the action of acid. In the invention, the acid-decomposable groups are preferably an acetal group and a tertiary ester group.

The mother resin to which acid-decomposable groups are attached as side chains is an alkali-soluble resin having —OH or —COOH groups as side chains. Examples of an alkali-soluble resin include those described below.

The speed of dissolution of such an alkali-soluble resin in alkali is preferably 170 A/sec or above, particularly preferably 330 A/sec or above, as measured with 0.261N tetramethylammonium hydroxide (TMAH) at 23° C. (wherein A stands for angstrom).

Examples of an alkali-soluble resin preferred especially in that respect include alkali-soluble resins having hydroxystyrene structural units, such as homo- and co-polymers of o-, m- and p-hydroxystyrene, hydrogenated poly(hydroxystyrene), halogen- or alkyl-substituted poly(hydroxystyrene)s, partially O-alkylated or O-acylated poly(hydroxystyrene)s, styrene-hydroxystyrene copolymer, α-methylstyrene-hydroxystyrene copolymer and hydrogenated novolak resin; and alkali-soluble resins having carboxyl-containing repeating units, such as (meth)acrylic acid and norbornenecarboxylic acid.

The resin of Component (A) can be synthesized by allowing an alkali-soluble resin to react with a precursor of acid-decomposable groups or copolymerizing an acid-decomposable group-attached monomer capable of forming an alkali-soluble resin and various other monomers as disclosed in European Patent No. 254853, JP-A-2-25850, JP-A-3-223860 and JP-A-4-251259.

The repeating units having other acid-decomposable groups preferably include at least one kind selected from repeating units having alkali-soluble groups protected by open-chain tertiary alkyl groups, such as t-butyl and t-pentyl groups, or groups having partial structures including alicyclic hydrocarbons represented by the following formulae (pI) to (pV):

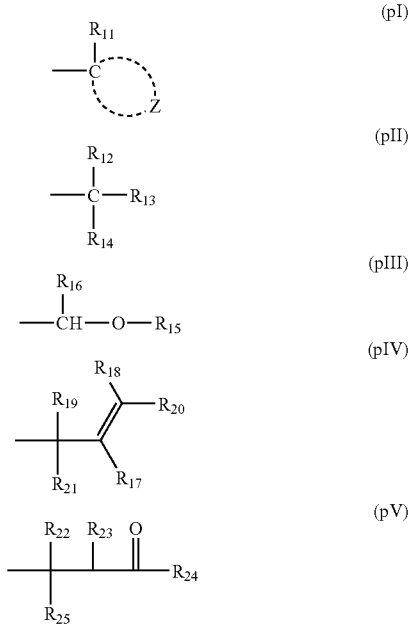

In formulae (pI) to (pV), $R_{11}$ represents a methyl group, an ethyl group, an n-propyl group, an isopropyl group, an n-butyl group, an isobutyl group or a sec-butyl group. Z represents atoms required for forming a cycloalkyl group.

$R_{12}$ to $R_{16}$ each represent a 1-4C linear or branched alkyl group or a cycloalkyl group independently, provided that at least one of $R_{12}$ to $R_{14}$, or either $R_{15}$ or $R_{16}$ is a cycloalkyl group.

$R_{17}$ to $R_{21}$ each represent a hydrogen atom, a 1-4C linear or branched alkyl group or a cycloalkyl group independently, provided that at least one of $R_{17}$ to $R_{21}$, represents a cycloalkyl group. In addition, either $R_{19}$ or $R_{21}$ represents a 1-4C linear or branched alkyl group or a cycloalkyl group.

$R_{22}$ to $R_{25}$ each represent a hydrogen atom, a 1-4C linear or branched alkyl group or a cycloalkyl group independently, provided that at least one of $R_{22}$ to $R_{25}$ represents a cycloalkyl group. In addition, either $R_{23}$ or $R_{24}$ may combine with each other to form a ring.

In formulae (pI) to (pV), the alkyl group represented by $R_{12}$ to $R_{25}$ each is a 1-4C linear or branched alkyl group, with examples including a methyl group, an ethyl group and a propyl group.

The cycloalkyl group represented by $R_{12}$ to $R_{25}$ each or the cycloalkyl group formed by Z and the carbon atom may be monocyclic or polycyclic. Examples of such cycloalkyl groups include groups having monocyclic, bicyclic, trocyclic and tetracyclic structures each having at least 5 carbon atoms. The number of carbon atoms contained in such groups each is preferably from 6 to 30, particularly preferably from 7 to 25. These cycloalkyl groups may have substituents.

Suitable examples of these cycloalkyl groups include an adamantyl group, a noradamantyl group, a decaline residue, a tricyclodecanyl group, a tetracyclododecanyl group, a norbornyl group, a norbornyl group, a cedrol group, acyclopentyl group, a cyclohexyl group, a cyclopentyl group, a cyclooctyl group, a cyclodecanyl group and a cyclododecanyl group. Of these groups, an adamantyl group, a norbornyl group, a cyclohexyl group, a cyclopentyl group, a tetracyclododecanyl group and a tricyclodecanyl group are preferred over the others.

Examples of substituents those alkyl and cycloalkyl groups may further have include an alkyl group (preferably having 1-4 carbon atoms), a halogen atom, a hydroxyl group, an alkoxy group (preferably having 1-4 carbon atoms), a carboxyl group and an alkoxycarbonyl group (preferably having 2-6 carbon atoms). Examples of substituents the alkyl group, the alkoxy group and the alkoxycarbonyl group may further have include a hydroxyl group, a halogen atom and an alkoxy group.

In the resins according to the invention, the structures illustrated by formulae (pI) to (pV) are used for protection of alkali-soluble groups. Examples of such a protected alkali-soluble group include structures formed by substituting hydrogen atoms of carboxylic acid group, sulfonic acid group, phenol group and thiol group with any of structures represented by formulae (pI) to (pV), preferably structures formed by substituting hydrogen atoms of carboxylic acid group and sulfonic acid group with any of structures represented by formulae (pI) to (pV).

The repeating units having alkali-soluble groups protected with any of structures represented by formulae (pI) to (pV) are preferably repeating units represented by the following formula (pA):

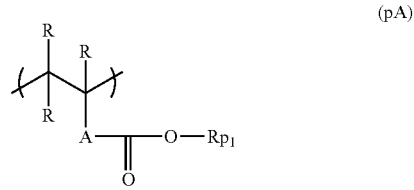

Herein, each R represents a hydrogen atom, a halogen atom, or a 1-4C linear or branched alkyl group. The plural Rs may be the same or different.

A represents one group or a combination of at least two groups selected from a single bond, an alkylene group, an ether group, a thioether group, a carbonyl group, an ester group, an amido group, a sulfonamido group, a urethane group or a urea group, preferably a single bond.

$Rp_1$ represents any of the foregoing formulae (pI) to (pV).

The repeating units represented by formula (pA) are preferably repeating units derived from 2-alkyl-2-adamantyl (meth)acrylate, 2-(1-adamantyl)-2-propyl(meth)acrylate, 1-alkyl-1-cyclopentyl(meth)acrylate or 1-alkyl-1-cyclohexyl (meth)acrylate.

Examples of repeating units represented by formula (pA) are illustrated below. (In the following formulae, each Rx is H, $CH_3$, $CF_3$ or $CH_2OH$, and each Rxa and each Rxb are independently 1-4C alkyl groups)

1
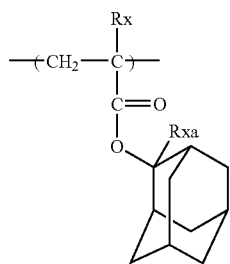

2
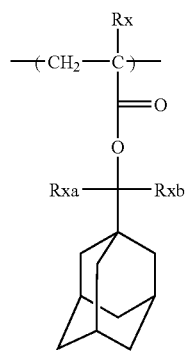

3
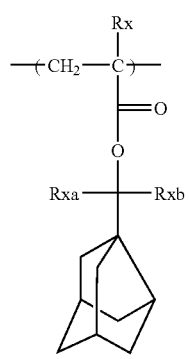

-continued

4
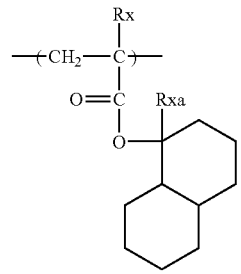

5
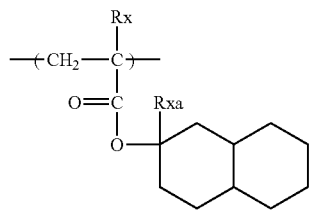

6
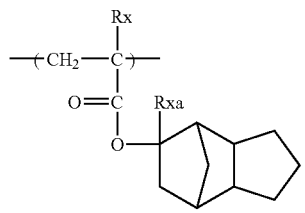

7
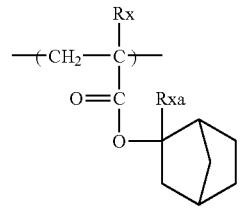

8
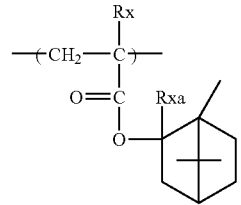

9
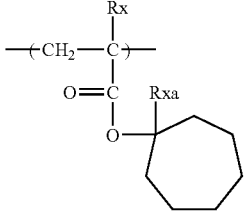

-continued

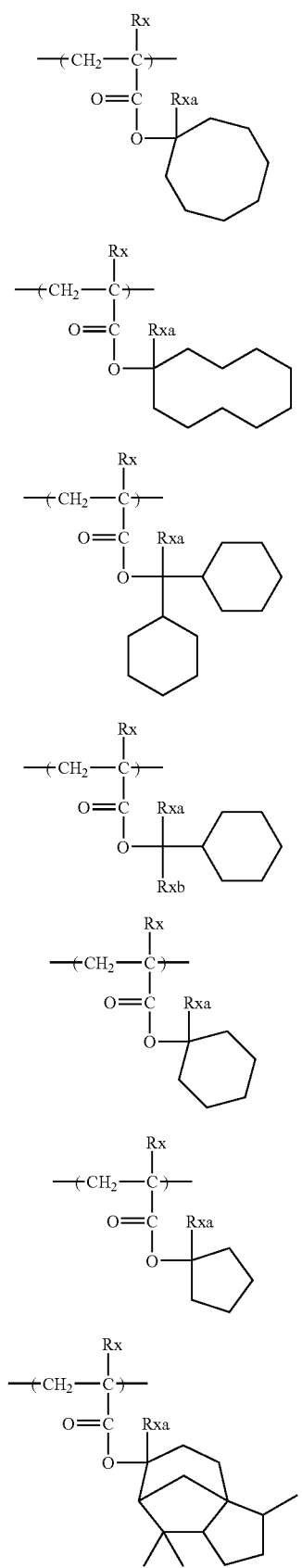

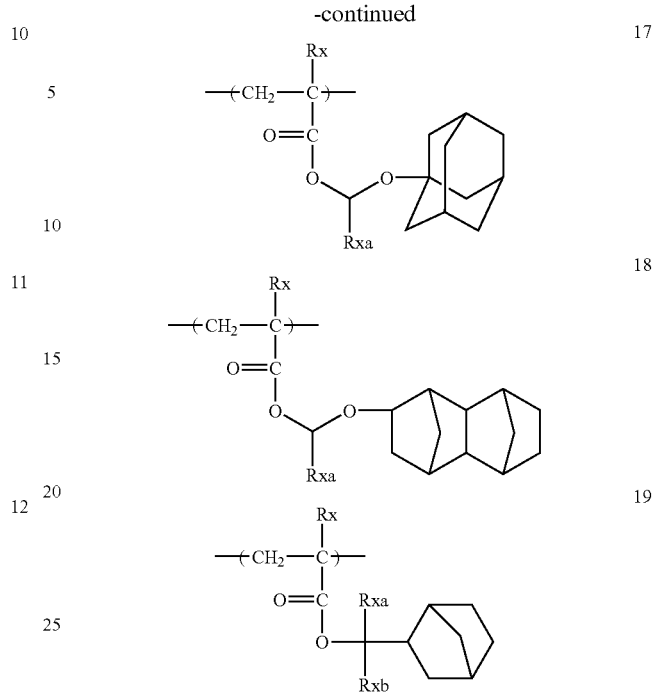

The resin of Component (A) may further have acid-indecomposable repeating units.

Examples of the acid-indecomposable repeating units include acid-indecomposable repeating units having lactone groups as illustrated hereinafter and acid-indecomposable repeating units having alicyclic hydrocarbon structures substituted with polar groups as illustrated hereinafter. The term "acid-indecomposable" as used herein means that the repeating units concerned have no reactivity or only slightly reactivity to the action of acids in generally used processes, and don't have any groups capable of substantially contributing to image formation by the action of acids.

The repeating units that the resin of Component (A) may further contain are preferably repeating units having lactone groups. The lactone groups may be any groups as far as they have lactone structures, but they are preferably groups containing 5- to 7-membered cyclic lactone structures, far preferably groups containing fused-ring structures formed by fusing 5- to 7-membered cyclic lactone structures and other ring structures into bicyclo- or spiro-structures. The repeating units that the resin of Component (A) may further contain are far preferably repeating units containing groups having lactone structures represented by any of the following formulae (LC1-1) to (LC1-16). In addition, the groups having lactone structures may be bonded directly to a principal chain. However, it is preferable that these lactone groups are attached to the polymer's principal chain via acid-indecomposable linkages. In other words, the repeating units having lactone groups are preferably acid-indecomposable repeating units. The acid-indecomposable linkages are preferably primary ester linkages or secondary ester linkages. The primary or secondary ester linkages exhibit no reactivity or only slight reactivity when the present positive-working photosensitive composition undergoes the action of acids in commonly used processes.

Of the following lactone structures, (LC1-1), (LC1-4), (LC1-5), (LC1-6), (LC1-13) and (LC1-14) are preferred over the others. By using specified lactone structures, line edge roughness and development defectiveness can be improved.
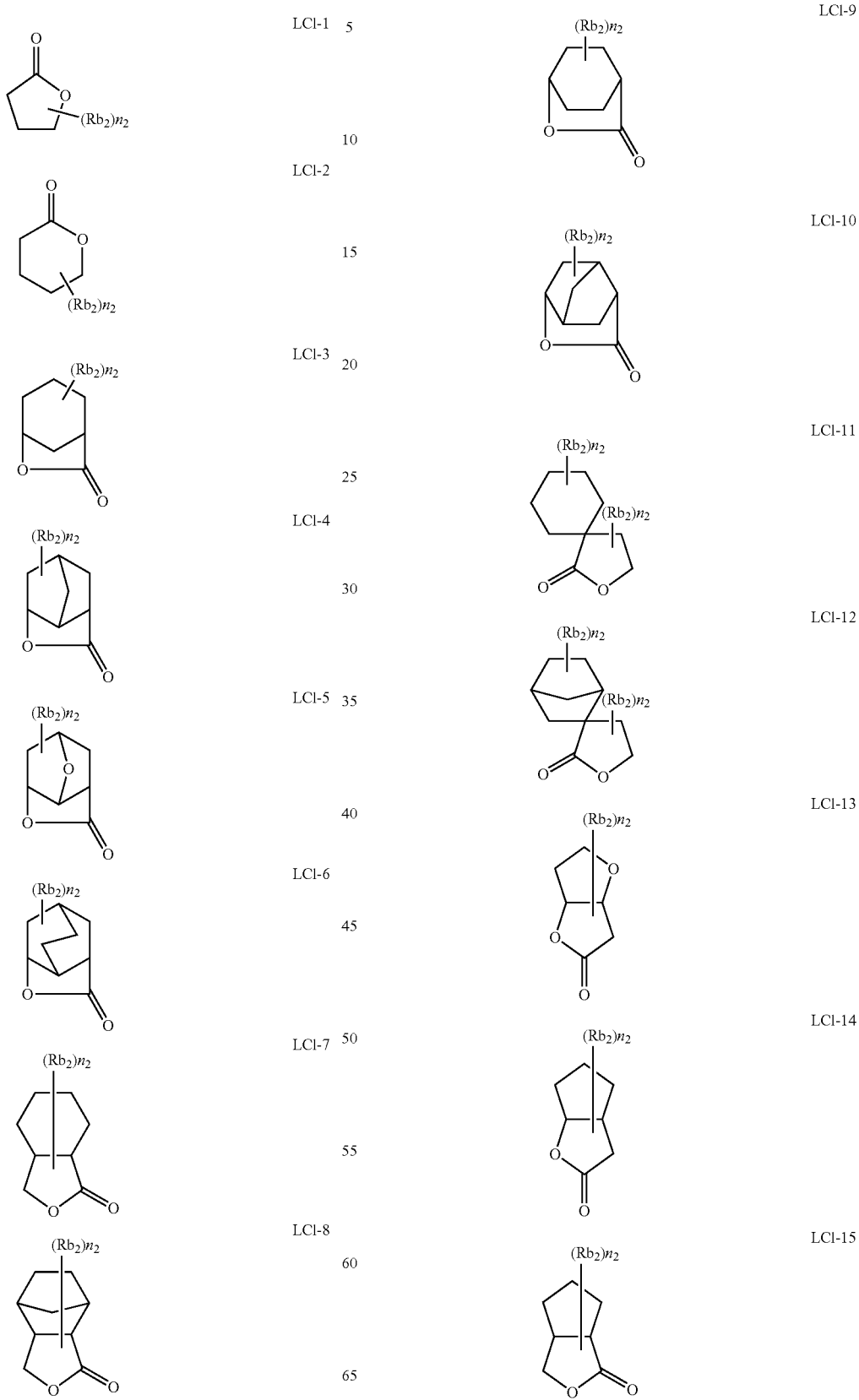

19

-continued

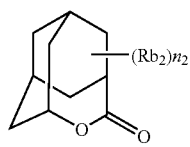

LC1-16

Each lactone structure part may have or needn't have a substituent (Rb$_2$). Suitable examples of a substituent (Rb$_2$) include a 1-8C alkyl group, a 4-7C cycloalkyl group, an 1-8C alkoxy group, a 1-8C alkoxycarbonyl group, a carboxyl group, a halogen atom, a hydroxyl group, a cyano group and an acid-decomposable group. n$_2$ represents an integer of 0 to 4. When n$_2$ is 2 or above, Rb$_2$s may be the same or different, and they may combine with each other to form a ring.

Examples of repeating units having lactone structures represented by any of formulae (LC1-1) to (LC1-16) include repeating units represented by the following formula (AI):

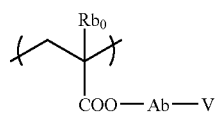

(AI)

In formula (AI), Rb$_0$ represents a hydrogen atom, a halogen atom or a 1-4C alkyl group.

A suitable substituent that the alkyl group as Rb$_0$ may have is a hydroxyl group or a halogen atom.

The halogen atom as Rb$_0$ may be a fluorine atom, a chlorine atom, a bromine atom or an iodine atom.

Rb$_0$ is preferably a hydrogen atom or a methyl group.

Ab represents an alkylene group, a divalent linkage group having a monocyclic or polycyclic hydrocarbon structure, or a divalent group selected from a single bond, an ether group, an ester group, a carbonyl group or combinations of two or more of these divalent groups. Among them, a single bond and a linkage group represented by —Ab$_1$-CO$_2$— are preferred. Herein, Ab$_1$ represents a linear or branched alkylene group or a monocyclo- or polycycloalkylene group, preferably a methylene group, an ethylene group, a cyclohexylene group, an adamantylene group or a norbornylene group.

V represents a group derived from any of formulae (LC1-1) to (LC1-16).

As to the repeating unit having a lactone structure, optical isomers are generally present. Any of isomers may be used, and only one kind of isomer may be used or a mixture of plural kinds of isomers may be used. When one kind of isomer is mainly used, the optical purity (ee) is preferably 90 or above, far preferably 95 or above.

Examples of repeating units containing groups having lactone structures are illustrated below, but these examples should not be construed as limiting the scope of the invention.

20

(In the following formulae, each Rx is H, CH$_3$, CH$_2$OH or CF$_3$)

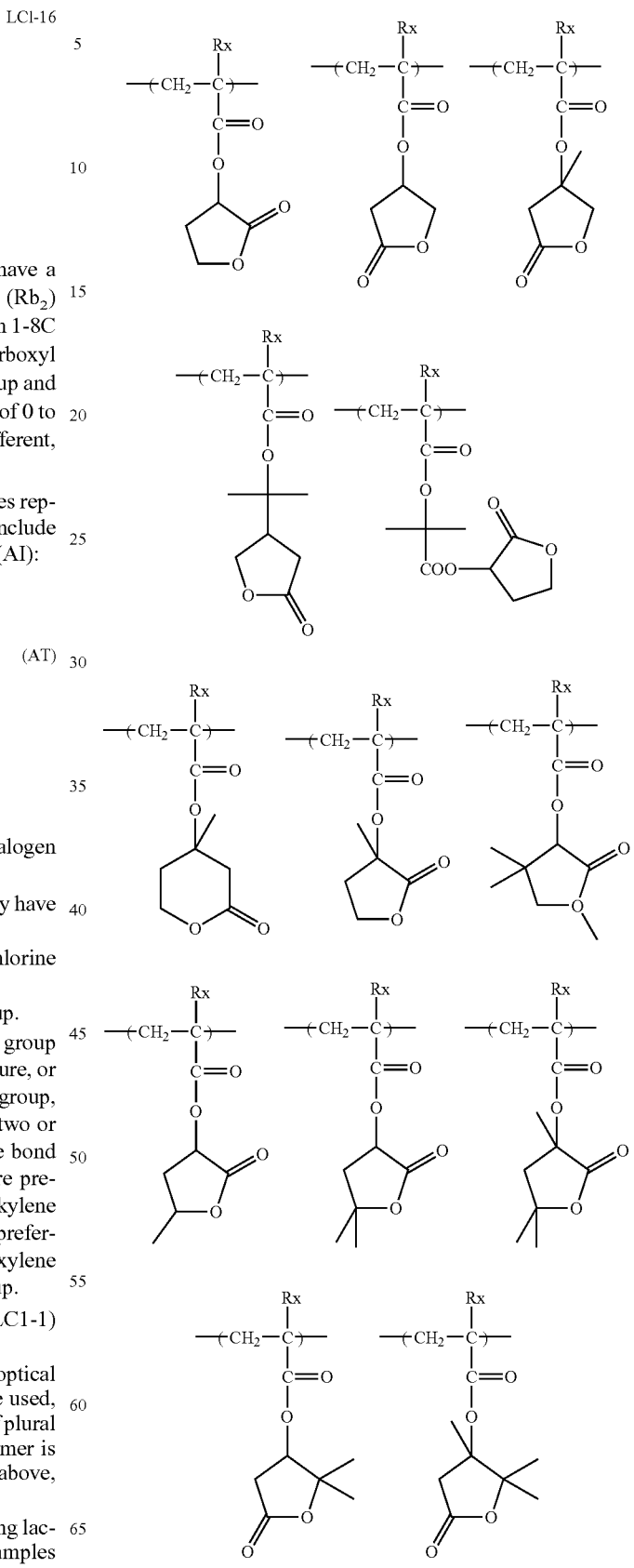

(In the following formulae, each Rx is H, CH₃, CH₂OH or CF₃)
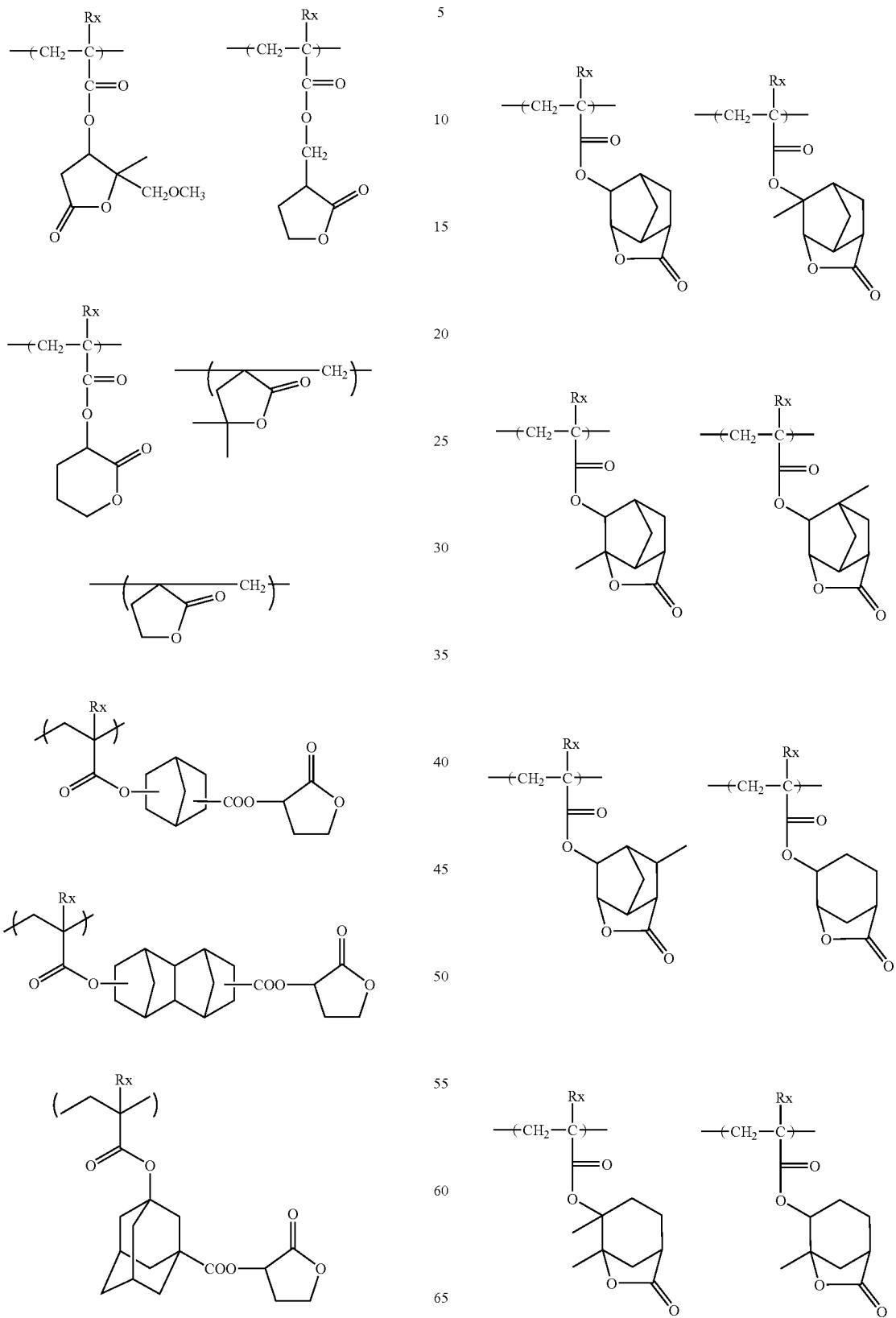

-continued
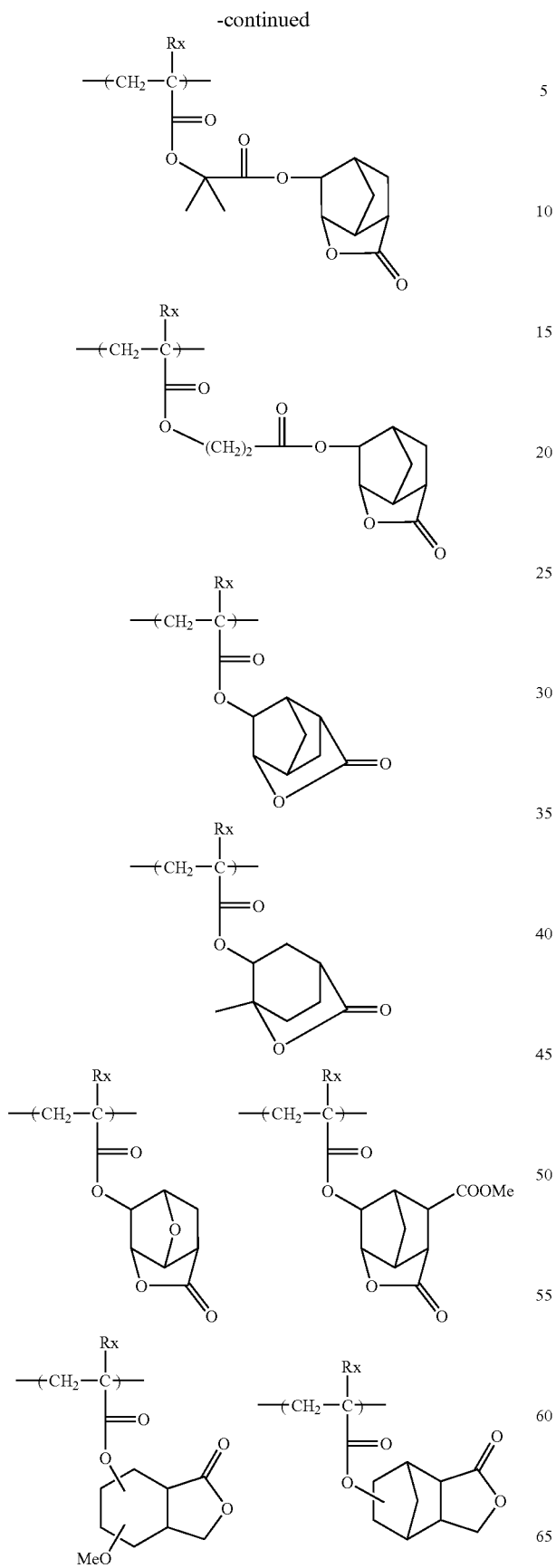
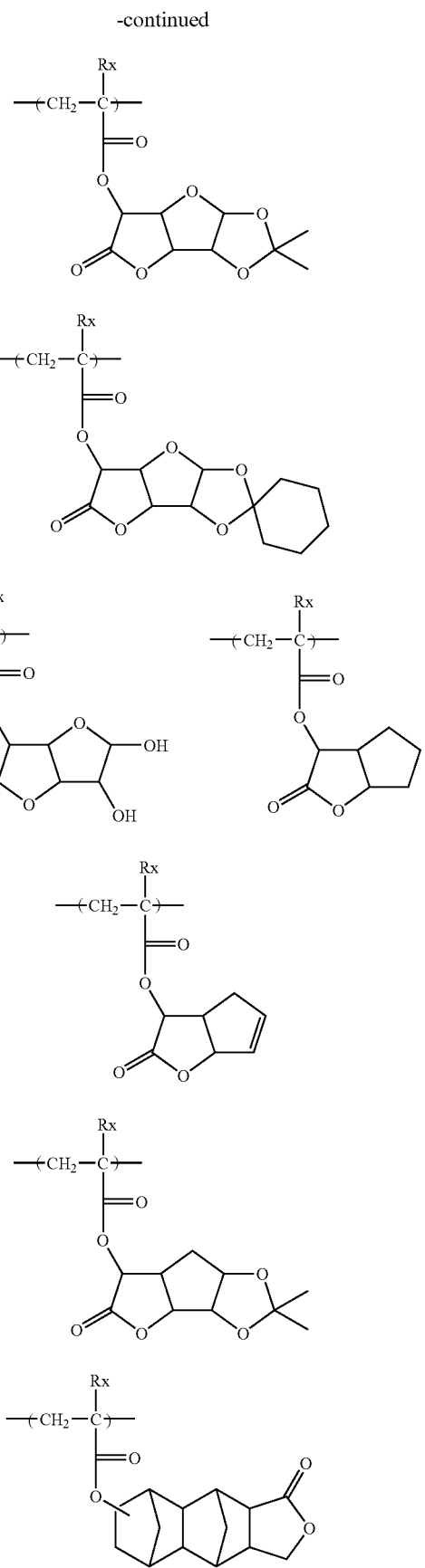

(In the following formulae, each Rx is H, CH₃, CH₂OH or CF₃)

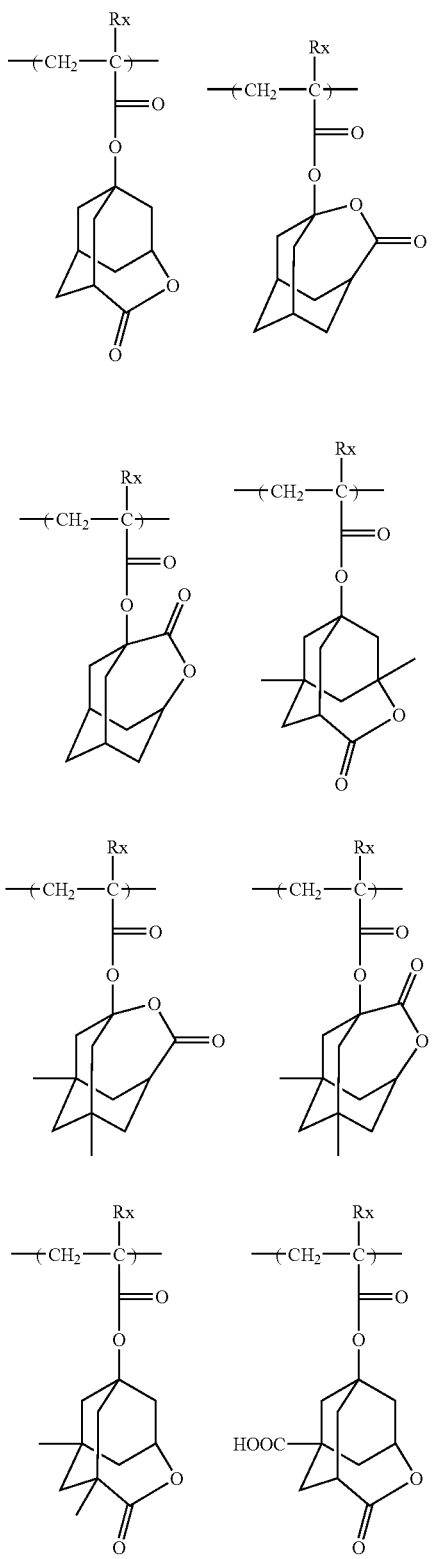

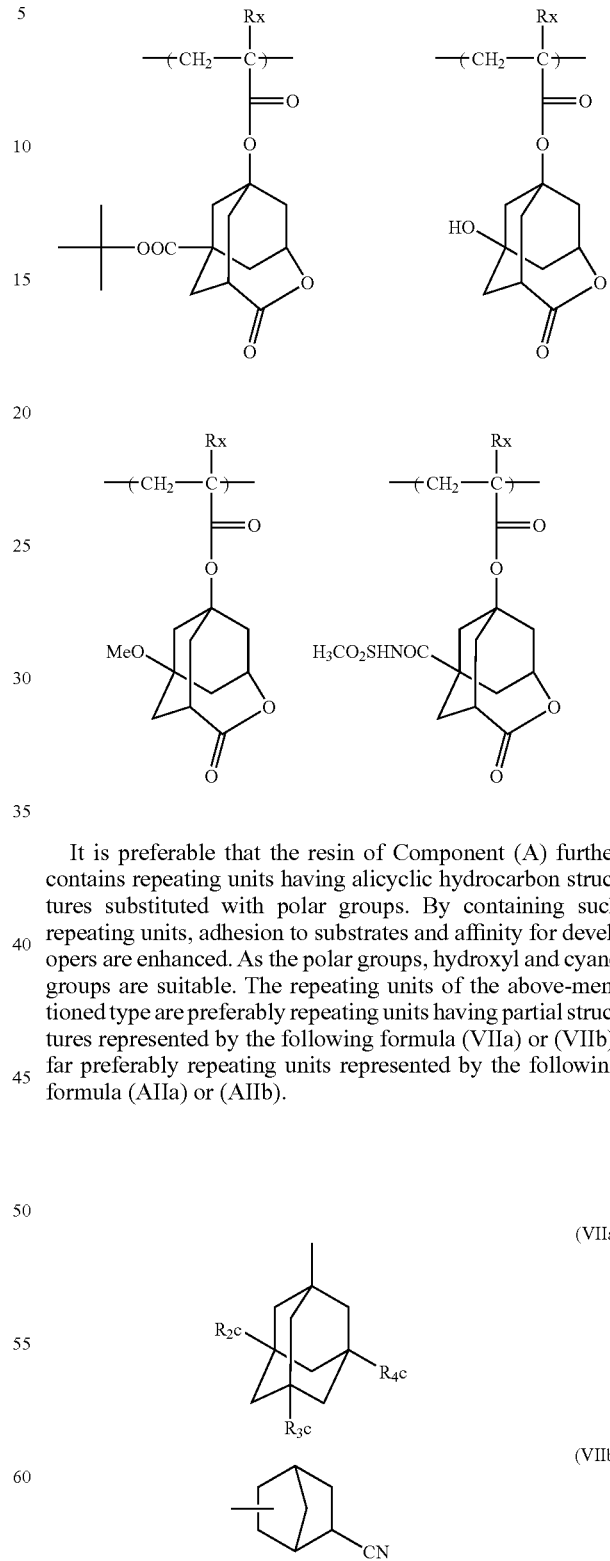

It is preferable that the resin of Component (A) further contains repeating units having alicyclic hydrocarbon structures substituted with polar groups. By containing such repeating units, adhesion to substrates and affinity for developers are enhanced. As the polar groups, hydroxyl and cyano groups are suitable. The repeating units of the above-mentioned type are preferably repeating units having partial structures represented by the following formula (VIIa) or (VIIb), far preferably repeating units represented by the following formula (AIIa) or (AIIb).

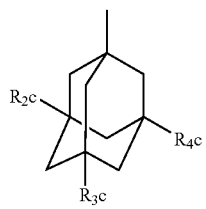

(VIIa)

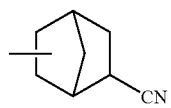

(VIIb)

In formula (VIIa), $R_{2c}$ to $R_{4c}$ each represent a hydrogen atom, a hydroxyl group or a cyano group independently, provided that at least one of $R_{2c}$ to $R_{4c}$ is a hydroxyl group or a cyano group. It is preferable that at least one or two of $R_{2c}$ to $R_{4c}$ are hydroxyl groups and the remainder is a hydrogen atom, and it is preferable by far that two of $R_{2c}$ to $R_{4c}$ are hydroxyl groups and the remainder is a hydrogen atom.

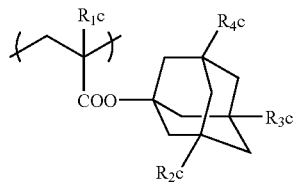

(AIIa)

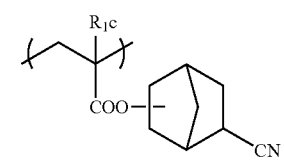

(AIIb)

In the above formulae (AIIa) and (AIIb), $R_{1c}$ represents a hydrogen atom, a methyl group, a trifluoromethyl group or a hydroxymethyl group.

Examples of repeating units having structures represented by formula (VIIa) or (VIIb) are illustrated below, but these examples should not be construed as limiting the scope of the invention.

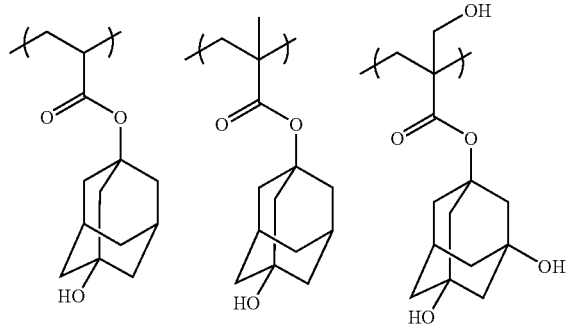

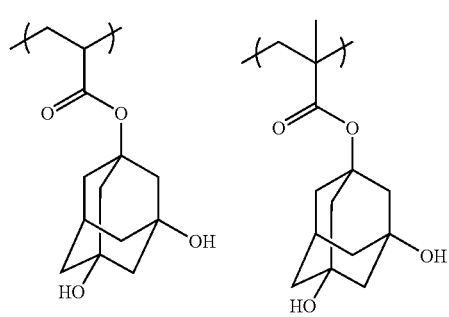

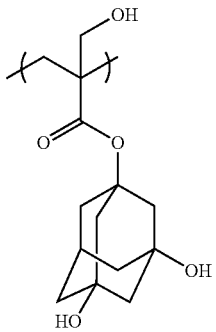

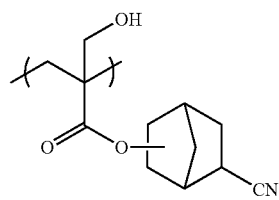

It is preferable that the resin of Component (A) further contains repeating units represented by the following formula (VIII).

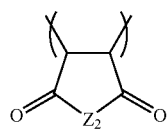

(VIII)

In the above formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl groups as $R_{41}$ and $R_{42}$ may be substituted with halogen atoms (preferably fluorine atoms).

Examples of repeating units represented by formula (VIII) are illustrated below, but these examples should not be construed as limiting the scope of the invention.

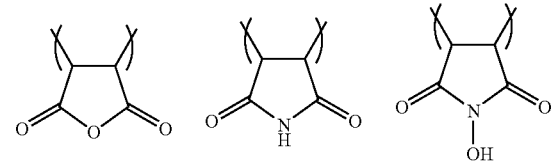

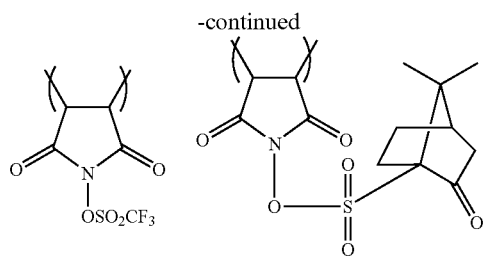
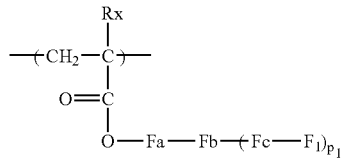

It is also preferable that the resin of Component (A) further contains repeating units having alkali-soluble groups, preferably repeating units having carboxyl groups. By having such repeating units, resolution in contact hole use can be enhanced. Suitable examples of repeating units having carboxyl groups include repeating units having carboxyl groups in a state that the groups are bonded directly to the principal chain of resin, such as those derived from acrylic acid or methacrylic acid, repeating units having carboxyl groups in a state that the groups are bonded to the principal chain of resin via linkage groups, and units introduced in polymer chain ends by using a polymerization initiator or chain transfer agent containing an alkali-soluble group at the time of polymerization. The linkage group usable therein may have a monocyclic or polycyclic hydrocarbon structure. Of these repeating units, those derived from acylic acid and methacrylic acid are preferred over the others.

The resin of Component (A) may further contain repeating units each having one to three groups represented by the following formula (F1). By containing such repeating units, line-edge roughness performance can be enhanced.

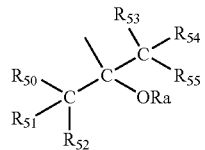

In formula (F1), $R_{50}$ to $R_{55}$ each represent a hydrogen atom, a fluorine atom or an alkyl group independently, provided that at least one of $R_{50}$ to $R_{55}$ is a fluorine atom or an alkyl group in which at least one hydrogen is replaced with a fluorine atom.

Ra represents a hydrogen atom or an organic group (preferably an acid-decomposable protective group, an alkyl group, a cycloalkyl group, an acyl group or an alkoxycarbonyl group).

Suitable examples of an alkyl group represented by $R_{50}$ to $R_{55}$ each include 1-3 alkyl groups which may be substituted with a halogen atom, such as a fluorine atom, or a cyano group, specifically a methyl group and a trifluoromethyl group.

In the group of formula (F1), it is preferable that $R_{50}$ to $R_{55}$ are all fluorine atoms.

As the organic group represented by Ra, an acid-decomposable protective group, or an alkyl, cycloalkyl, acyl, alkylcarbonyl, alkoxycarbonyl, alkoxycarbonylmethyl, alkoxymethyl or 1-alkoxyethyl group which may have a substituent is suitable.

The repeating units having groups of formula (F1) are preferably repeating units represented by the following formula (F2).

In formula (F2), Rx represents a hydrogen atom, a halogen atom or a 1-4C alkyl group. Suitable examples of a substituent the alkyl group as Rx may have include a hydroxyl group and halogen atoms.

Fa represents a single bond, or a linear or branched alkylene group (preferably a single bond).

Fb represents a monocyclic or polycyclic hydrocarbon group.

Fc represents a single bond, or a linear or branched alkylene group (preferably a single bond or a methylene group).

$F_1$ represents a group represented by formula (F1)

$p_1$ represents 1, 2 or 3

The cyclic hydrocarbon group as Fb is preferably a cyclopentylene group, a cyclohexylene group or a norbornylene group.

Examples of repeating units having structures of formula (F1) are illustrated below.

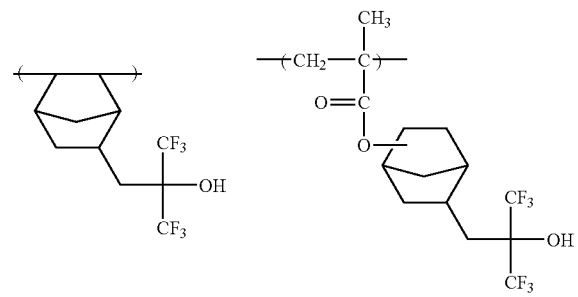
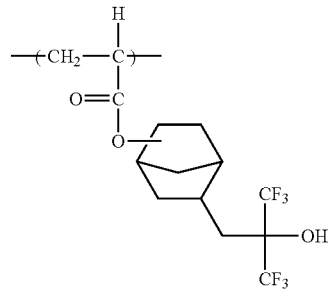

The resin of Component (A) may further contain repeating units having alicyclic hydrocarbon structures and exhibiting no acid decomposability. By containing such repeating units, elution of low-molecular components from a photosensitive film into an immersion fluid at the time of immersion exposure can be reduced. Examples of such repeating units include those derived from 1-adamantyl(meth)acrylate, tricyclodecanyl (meth)acrylate and cyclohexyl(meth)acrylate.

In addition to the repeating structural units mentioned above, the resin of Component (A) can further contain a wide variety of repeating structural units for the purposes of adjusting dry etching resistance, standard developer suitability, adhesion to substrates, resist profile and other characteristics generally required for resist, such as resolution, heat resistance and sensitivity.

Examples of such repeating structural units include repeating structural units corresponding to the following monomers, but these examples should not be construed as limiting the scope of the invention.

By containing such repeating units, it becomes possible to make fine adjustments to characteristics required for the resin of Component (A), especially to:
(1) solubility in coating solvents,
(2) film formability (glass transition temperature),
(3) alkali developability,
(4) thinning of film (hydrophilic-hydrophobic balance, alkali-soluble group selection),
(5) adhesion of unexposed areas to a substrate, and
(6) dry etching resistance.

Examples of monomers suitable for the foregoing purposes include compounds, which each has one addition-polymerizable unsaturated bond, selected from acrylic acid esters, methacrylic acid esters, acrylamides, methacrylamides, allyl compounds, vinyl ethers, or vinyl esters.

Any other monomers may be copolymerized so long as they are addition-polymerizable unsaturated compounds capable of forming copolymers together with monomers corresponding to the various repeating structural units mentioned above.

The molar content of each repeating structural unit in the resin of Component (A) can be properly chosen for making adjustments to dry etching resistance, standard developer suitability, adhesion to substrates, resist profile, and characteristics generally required for resist, such as resolution, heat resistance and sensitivity.

A preferred state of the resin of Component (A) is in that all the repeating units include (meth)acrylate repeating units. More specifically, all the repeating units in the resin may be methacrylate repeating units or acrylate repeating units, or the repeating units in the resin may be made up of methacrylate repeating units and acrylate repeating units. When the resin contains both acrylate and methacrylate repeating units, the repeating units having polar functional groups are preferably acrylate repeating units.

The content of acid-decomposable-group-containing repeating units in the resin of Component (A) is preferably from 10 to 60 mol %, far preferably from 20 to 50 mol %, further preferably from 25 to 40 mol %, of the total repeating structural units.

The content of repeating unit (Aa-1) in the resin of Component (A) is preferably from 20 to 50 mol % of the total repeating units.

The content of repeating unit (Aa-2) in the resin of Component (A) is preferably from 5 to 30 mol % of the total repeating units.

When the present positive-working photosensitive composition is designed for ArF exposure, it is preferable that the resin of Component (A) has no aromatic groups from the viewpoint of ensuring transparency to ArF light.

It is preferable by far that the resin of Component (A) is a terpolymer made up of 20 to 50 mol % of repeating units (Aa-1), which have acid-decomposable groups and containing diamantane structures in groups capable of splitting off from the acid-decomposable groups by the action of acid, or repeating units having other acid-decomposable groups, 20 to 50 mol % of repeating units having lactone structures and 5 to 30 mol % of repeating units having diamantane structures substituted with polar functional groups or repeating units having other alicyclic hydrocarbon structures substituted with polar groups, or a quaterpolymer having 0 to 20 mol % of other repeating units in addition to the repeating units mentioned above.

It is also preferable by far that the resin of Component (A) is a terpolymer made up of 5 to 30 mol % of repeating units (Aa-2), which have diamantane structures and substantially insensitive to the action of acid and alkali, 20 to 50 mmol % of acid-decomposable repeating units having diamantane structures and 20 to 50 mol % of acid-indecomposable repeating units having lactone groups, or a quaterpolymer having 0 to 20 mol % of other repeating units in addition to the repeating units mentioned above. Examples of the acid-decomposable repeating units having adamantane structures include repeating units represented by formula (pA) wherein $Rp_1$ is a group having an adamantane structure. Examples of the acid-indecomposable repeating units having lactone groups include repeating units represented by formula (AI) which don't release the groups V under the action of acid.

Furthermore, it is preferable that the resin of Component (A) contains repeating units having adamantane structures. Examples of the repeating units having adamantane structures include repeating units represented by formula (pA) wherein $Rp_1$ has an adamantane structure and repeating units represented by formula (AIIa).

The resin of Component (A) can be synthesized according to general methods (e.g., radical polymerization). As general synthesis methods, there are known a batch polymerization method in which monomer species and an initiator are dissolved in a solvent and heated, and a drop polymerization method in which a solution containing monomer species and an initiator is added dropwise to a heated solvent over 1 to 10 hours, but it is preferable to use the drop polymerization method. As a way of adding monomers in the drop polymerization method, either a way of putting only a solvent in a reaction vessel and adding dropwise a monomer solution into the solvent or a way of putting in advance part of monomer species in a reaction vessel and adding dropwise the remainder of the monomer species may be adopted. The polymerization initiator may be dissolved in the same solution as monomers and added dropwise, or may be added dropwise as a solution separate from the monomer solution. When the polymerization initiator is added as a solution separate from the monomer solution, the dropping speed of the polymerization initiator solution may be the same or different from that of the monomer solution. Examples of a reaction solvent usable herein include ethers, such as tetrahydrofuran, 1,4-dioxane and diisopropyl ether; ketones, such as methyl ethyl ketone and methyl isobutyl ketone; ester solvents, such as ethyl acetate; amide solvents, such as dimethylformamide and dimethylacetamide; and solvents described later, in which the present positive-working photosensitive composition is dissolved, such as propylene glycol monomethyl ether acetate, propylene glycol monomethyl ether and cyclohexanone. It is preferable to perform polymerization by use of the same solvent as used in the present positive-working photosensitive composition. By doing so, development of particles during storage can be retarded.

The polymerization reaction is preferably carried out in an atmosphere of inert gas, such as nitrogen or argon. And the polymerization is initiated using a commercially available radical initiator (e.g., an azo-type initiator or peroxide) as polymerization initiator. As the radical initiator, an azo-type initiator is suitable, and an azo-type initiator having an ester group, a cyano group or a carboxyl group is preferable. Examples of such a preferable azo-type initiator include azobisisobutyronitrile, azobisdimethylvaleronitrile and dimethyl 2,2'-azobis(2-methylpropionate). Such an initiator may be added additionally in the course of polymerization, or may be added in several portions, if desired. After the conclusion of the reaction, the reaction solution is poured into a solvent, and the intended polymer is collected as a powder or a solid. The concentration of a reaction system is from 5 to 50 mass %, preferably from 10 to 30 mass %, and the reaction temperature is generally from 10°C. to 150° C., preferably from 30° C. to 120° C., far preferably from 60° C. to 100° C.

The weight-average molecular weight of the resin of Component (A) is generally from 3,000 to 30,000, preferably from 5,000 to 15,000, far preferably from 6,000 to 12,000, as measured by GPC and calculated in terms of polystyrene. By adjusting the molecular weight to a suitable range, exposure latitude, development defectiveness, scum development and line-edge roughness can be improved.

The weight-average molecular weight can be controlled by properly choosing the species of polymerization initiator, the amount of polymerization initiators used, the species of chain transfer agents, the polymerization temperature, the reaction solvent, the reaction solution concentration, and the polymerization method (e.g., drop polymerization or batch polymerization) at the time of the execution of polymerization reaction.

The dispersion degree (Mw/Mn) of the resin of Component (A) is generally from 1.1 to 3.0, preferably from 1.2 to 2.5, far preferably from 1.4 to 2.1. The narrower the molecular-weight distribution, the more excellent the resolution and the resist profile, and what's more, the smoother the resist pattern side and the more excellent the roughness characteristics.

As to the dispersion degree adjustment, it is also possible to prepare resins having their dispersion degrees in the range of 1.0 to 1.5 by use of a living radical polymerization method. Alternatively, resins having small dispersion degrees can be obtained by removing low-molecular components, or high-molecular components, or both from resins obtained by polymerization and relatively great in dispersion degree through the use of a re-precipitation method or a solvent cleaning method utilizing solubility differences of resins in solvents.

It is preferable for the resin of Component (A) to have a weigh-average molecular weight of 3,000 to 30,000 and a dispersion degree of 1.1 to 3.0.

The mixing proportion of the resin of Component (A) in the present positive-working photosensitive composition is preferably from 50 to 99.99 mass %, far preferably from 60 to 99.0 mass % of the total solids in the composition.

Additionally, one kind of resin may be used or a combination of two or more kinds of resins may be used as the resin of Component (A).

[2](A2): Resin Having No Groups Capable of Decomposing Under Action of Acid

The present positive-working photosensitive composition may contain a resin having no groups capable of decomposing under action of acid (also referred to as "resin of Component (A2)", hereinafter).

The expression "having no groups capable of decomposing under action of acid" used herein refers to not having groups capable of contributing to image formation by acid decomposition, and means that the groups the resin concerned has are groups exhibiting no or only slight decomposability under action of acids in generally used image forming processes. Examples of such a resin include resins having alkali-soluble groups and resins having groups capable of decomposing under action of alkali and increasing solubility in alkaline developers.

Resins suitable as the resin of Component (A2) are, e.g., resins having at least one kind of repeating units derived from (meth)acrylic acid compounds and/or alicyclic olefin compounds.

Examples of alkali-soluble groups preferred in the resin of Component (A2) include a carboxyl group, a phenolic hydroxyl group, an aliphatic hydroxyl group substituted with an electron-attracting group at the 1- or 2-position, an amino group substituted with an electron-attracting group (e.g., a sulfonamido group, a sulfonimido group, a bissulfonylimido group), and a methylene or methine group substituted with an electron-attracting group (e.g., a methylene or methine group substituted with at least two groups selected from ketone groups or ester groups).

Examples of groups that the resin of Component (A2) can have and decompose under action of alkali to increase solubility in alkaline developers include lactone groups and acid anhydride groups, preferably lactone groups.

The resin of Component (A2) may further have repeating units containing functional groups other than the above-recited ones. The repeating units containing other functional groups can be selected from repeating units having favorable functional groups in consideration of dry etching resistance, hydrophilic-hydrophoic balance and interaction capability.

Examples of repeating units containing other functional groups include repeating units containing polar functional groups, such as a hydroxyl group, a cyano group, a carbonyl group and an ester group, repeating units having monocyclic or polycyclic hydrocarbon structures, repeating units containing fluoroalkyl groups, and repeating units containing combinations of two or more kinds selected from the functional groups recited above.

The weight-average molecular weight of the resin of Component (A2) is preferably from 3,000 to 30,000, far preferably from 5,000 to 15,000, further preferably from 6,000 to 12,000, as measured by GPC and calculated in terms of polystyrene.

Suitable examples of the resin of Component (A2) are illustrated below, but these examples should not be construed as limiting the scope of the invention.

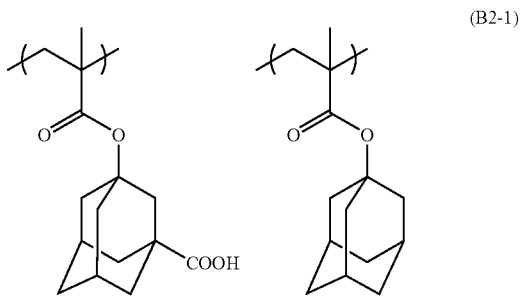

(B2-1)

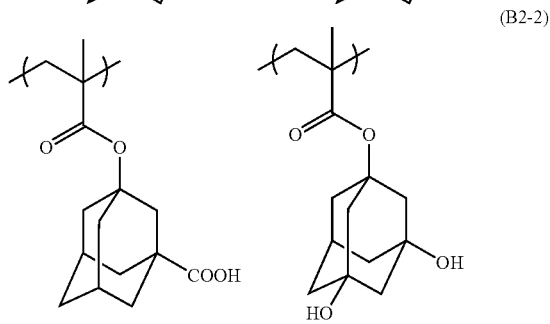

(B2-2)

(B2-3)
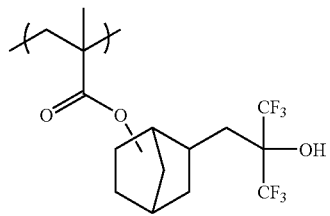

(B2-4)
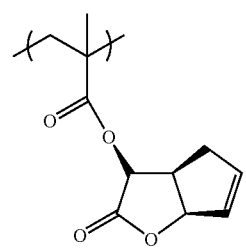

(B2-5)
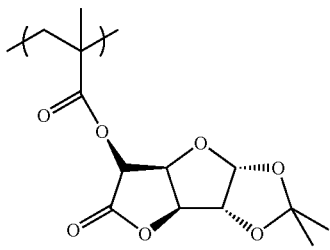

(B2-6)
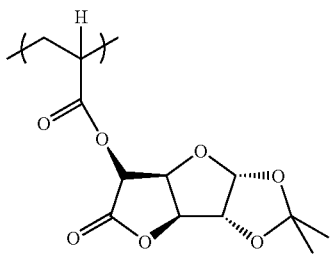

(B2-7)
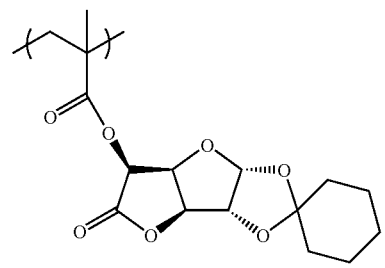

(B2-8)
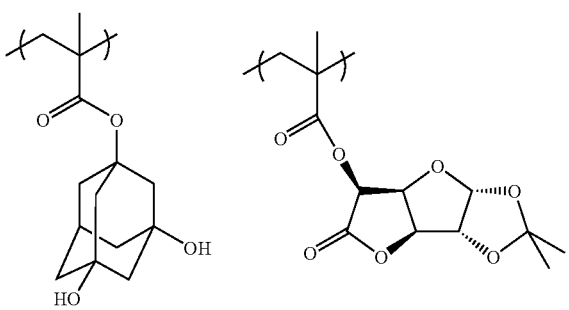

(B2-9)
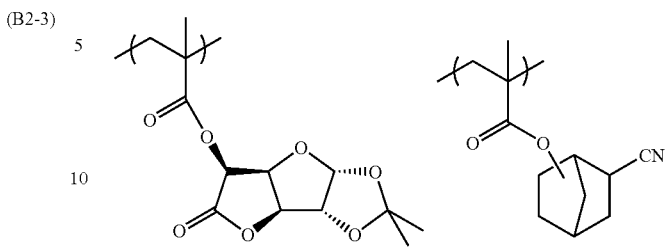

The resin of Component (A2) is added generally in an amount of 0 to 50 mass %, preferably in an amount of 0 to 30 mass %, far preferably in an amount of 0 to 20 mass %, based on the resin of Component (A).

[3] Compound Generating Organic Acid Represented by Formula (2) (3), (4) or (5) Upon Irradiation with Actinic Ray or Radiation (Photo-acid Generator)

The compound (B) contained in the present photosensitive composition, which generates a specific organic acid upon irradiation with an actinic ray or radiation, is illustrated below.

(B1): Compound Generating Sulfonic Acid Represented by Formula (2) Upon Irradiation with Actinic Ray or Radiation

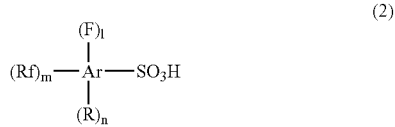

(2)

In formula (2), Rf represents an organic group having a fluorine atom, R represents a hydroxyl group or an organic group, Ar represents an aromatic group, l represents an integer of 1 to 6, m represents an integer of 0 to 4, and n represents an integer of 0 to 4, provided that m+n is an integer of 1 or above.

Examples of an organic group represented by R in formula (2) include an alkyl group, a cycloalkyl group, an alkoxy group, an aryloxy group, an aralkyloxy group, a cycloalkoxy group, an alkoxycarbonyl group, an aryloxycarbonyl group, an acyloxy group, an alkylthio group, an arylthio group, an acyl group, an acylamino group, an alkenyloxy group, an arylcarbonyloxy group, an alkylcarbonyloxy group, an alkylaminocarbonyl group, an alkylcarbonylamino group, an alkylsilyloxy group and a cyano group. Two or more of these organic groups may be coupled to each other via a single bond, an ether linkage, an ester linkage, an amide linkage, a sulfide linkage or a urea linkage. The number of carbon atoms contained in the organic group as R is preferably from 2 to 30, far preferably from 4 to 30, further preferably from 6 to 30, particularly preferably from 8 to 24.

The alkyl group included in organic groups that R can represent is preferably a 1-30C linear or branched alkyl group, with examples including a methyl group, an ethyl group, a propyl group, an isopropyl group, an n-butyl group, a sec-butyl group, a t-butyl group, a hexyl group, a heptyl group, an octyl group, a nonyl group, a decyl group, an undecyl group and a dodecyl group. These alkyl groups may have substituents. Suitable examples of such substituents include an alkoxy group, a cycloalkyl group, an acyl group, an acyloxy group, a chlorine atom, a bromine atom, an iodine atom, a hydroxyl group and a carboxyl group.

The cycloalkyl group included in organic groups that R can represent is preferably a 3-30C mono- or polycycloalkyl group, with examples including a cyclopropyl group, a cyclobutyl group, a cyclopentyl group, a cyclohexyl group, a norbornyl group and an adamantyl group. These cycloalkyl groups may have substituents. Suitable examples of such substituents include an alkyl group, an alkoxy group, an acyl group, an acyloxy group, a chlorine atom, a bromine atom, an iodine atom, a hydroxyl group and a carboxyl group.

The alkoxy group included in organic groups that R can represent is preferably a 1-30C linear or branched alkoxy group, with examples including a methoxy group, an ethoxy group, a propoxy group, an isopropoxy group, an n-butoxy group, an isobutoxy group, a sec-butoxy group, a t-butoxy group, a hexyloxy group, a heptyloxy group, an octyloxy group, a nonyloxy group, a decyloxy group, an undecyloxy group and a dodecyloxy group. These alkoxy groups may have substituents. Suitable examples of such substituents include an alkyl group, an aryl group, an acyl group, an acyloxy group, a chlorine atom, a bromine atom, an iodine atom, a cycloalkyl group, a cycloalkoxy group, a siloxane group, a hydroxyl group and a carboxyl group.

The aryloxy group included in organic groups that R can represent is preferably a 6-20C aryloxy group, such as a phenoxy group. Such an aryloxy group may have a substituent. Suitable examples of such a substituent include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The aralkyloxy group included in organic groups that R can represent is preferably a 6-20C aralkyloxy group, such as a benzyloxy group or a phenethyl group. Such an aralkyloxy group may have a substituent. Suitable examples of such a substituent include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The cycloalkoxy group included in organic groups that R can represent is preferably a 3-30C mono- or polycycloalkoxy group, with examples including a cyclopropoxy group, a cyclobutoxy group, a cyclopentyloxty group, a cyclohexyloxy group, a norbornyloxy group, a menthyloxy group and an adamantyloxy group. These cycloalkoxy groups may have substituents. Suitable examples of such substituents include an alkyl group, an alkoxy group, an acyl group, an acyloxy group, a chlorine atom, a bromine atom, an iodine atom, a hydroxyl group and a carboxyl group.

The alkoxycarbonyl group included in organic groups that R can represent is preferably a 1-30C alkoxycarbonyl group, with examples including a methoxycarbonyl group, an ethoxycarbonyl group, a butoxycarbonyl group, an octyloxycarbonyl group and a dodecyloxycarbonyl group. These alkoxycarbonyl groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The aryloxycarbonyl group included in organic groups that R can represent is preferably a 6-20C aryloxycarbonyl group, such as a phenoxycarbonyl group. Such an aryloxycarbonyl group may have a substituent. Suitable examples of such a substituent include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acyloxy group included in organic groups that R can represent is preferably a 1-30C acyloxy group, with examples including an acetoxy group, a methylbutynoyloxy group, a methyldecynoyloxy group, a propionyloxy group, a butyryloxy group, a valeryloxy group, a palmitoyloxy group and benzoyloxy group. These acyloxy groups may have substituents. Suitable examples of such substituents include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The alkylthio group included in organic groups that R can represent is preferably a 1-30C alkylthio group, with examples including a methylthio group, an ethylthio group, a propylthio group, an isopropylthio group, an n-butylthio group, a sec-butylthio group, a t-butylthio group, a hexylthio group, a heptylthio group, an octylthio group, a nonylthio group, a decylthio group, an undecylthio group and a dodecylthio group. These alkylthio groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The arylthio group included in organic groups that R can represent is preferably a 6-20C arylthio group, such as a phenylthio group. Such an arylthio group may have a substituent. Suitable examples of such a substituent include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acyl group included in organic groups that R can represent is preferably a 1-30C acyl group, with examples including an acetyl group, a propionyl group, a pivaloyl group, a butyryl group, a valeryl group, a palmitoyl group and a benzoyl group. These acyl groups may have substituents. Suitable examples of such substituents include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acylamino group included in organic groups that R can represent is preferably a 1-30C acylamino group, with examples including an acetylamino group, a propionylamino group, a pivaloylamino group, a butyrylamino group and a benzoyl group. These acylamino groups may have substituents. Suitable examples of such substituents include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The alkenyloxy group included in organic groups that R can represent is preferably a 1-30C alkenyloxy group, with examples including a vinyloxy group, a propenyloxy group and a butenyloxy group. These alkenyloxy groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The arylcarbonyloxy group included in organic groups that R can represent is preferably a 6-20C arylcarbonyloxy group, such as a phenylcarbonyloxy group. Such an arylcarbonyloxy group may have a substituent. Suitable examples of such a substituent include an alkyl group, a cycloalkyl group, an alkoxy group, an acyl group, a formyl group, a nitro group, an acylamino group, a sulfonylamino group, an alkoxycarbonyl group, a cyano group, a chlorine atom, a bromine atom, an iodine atom, a hydroxyl group and a carboxyl group.

The alkylcarbonyloxy group included in organic groups that R can represent is preferably a 1-30C alkylcarbonyloxy group, with examples including a methylcarbonyloxy group, an ethylcarbonyloxy group, a propylcarbonyloxy group and a butylcarbonyloxy group. These alkylcarbonyloxy groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The alkylaminocarbonyl group included in organic groups that R can represent is preferably a 1-30C alkylaminocarbonyl group, with examples including a methylaminocarbonyl group, an ethylaminocarbonyl group, a propylaminocarbonyl group and a butylaminocarbonyl group. These alkylaminocarbonyl groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The alkylcarbonylamino group included in organic groups that R can represent is preferably a 1-30C alkylcarbonylamino group, with examples including a methylcarbonylamino group, an ethylcarbonylamino group, a propylcarbonylamino group and a butylcarbonylamino group. These alkylcarbonylamino groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The alkylsilyloxy group included in organic groups that R can represent is preferably a 1-30C alkylsilyloxy group, such as a trimethylsilyloxy group or t-butyldimethylsilyloxy group. These alkylsilyloxy groups may have substituents. Suitable examples of such substituents include an alkoxy group, an acyl group, an acyloxy group, a cycloalkyl group, a chlorine atom, a bromine atom, an iodine atom, a hydroxyl group and a carboxyl group.

The alkyl or cycloalkyl group contained in each of those alkyl, cycloalkyl, alkoxy, aralkyloxy, cycloalkoxy, alkoxycarobnyl, acyloxy, alkylthio, acyl and acylamino groups may have one or more of a linkage group, such as an oxygen atom, a sulfur atom or an ester linkage, in the alkyl or cycloalkyl chain.

R is preferably an alkyl group, a cycloalkyl group, an alkoxy group, an aralkyloxy group, a cycloalkoxy group, an alkylthio group or an arylthio group. R is far preferably an alkoxy group, an aralkyloxy group, a cycloalkoxy group, an alkylthio group or an arylthio group, particularly preferably an alkylthio group or an arylthio group. Additionally, by choosing an alkylthio or arylthio group as R, not only excellent PEB temperature dependence and profile but also high sensitivity can be imparted to the photosensitive composition.

When n is an integer of 2 or above, plural Rs may be the same or different.

Examples of an organic group having a fluorine atom, which is represented by Rf, include groups formed by substituting fluorine atoms for part or all of hydrogen atoms of the organic groups recited above as R. When m is an integer of 2 or above, plural Rfs may be the same or different.

The sum of the number of carbon atoms in Rf and the number of carbon atoms in R is preferably from 4 to 34, far preferably from 6 to 30, further preferably from 8 to 24. By adjusting the number of total carbon atoms in Rf and R, the diffusibility of the acid can be controlled, and resolution can be enhanced.

The aromatic group represented by Ar is preferably an aromatic group containing 6 to 20 carbon atoms, such as a phenyl group or a naphthyl group. Such an aromatic group may further have a substituent. Examples of a substituent that the aromatic group may further have include a nitro group, a sulfonylamino group, a chlorine atom, a bromine atom, an iodine atom and a carboxyl group.

m is preferably from 0 to 3, far preferably from 0 to 2, further preferably 0 or 1.

n is preferably from 0 to 3, far preferably from 0 to 2, further preferably 0 or 1.

l is preferably from 2 to 5, far preferably 3 or 4, further preferably 4.

m+n is preferably from 1 to 3, far preferably 1 or 2, further preferably 1.

The sulfonic acids represented by formula (2) and salts thereof are novel compounds.

Examples of salts of the sulfonic acids include metal sulfonates and onium sulfonates.

Examples of metals in the metal sulfonates include $Na^+$, $Li^+$, $K^+$, $Cs^+$, $Ca^{2+}$ and $Ba^{2+}$.

An example of onium cations in the onium sulfonates is an ammonium cation.

The sulfonic acids represented by formula (2) are preferably represented by the following formula (Ia), far preferably represented by the following formula (Ib), further preferably represented by the following formula (Ic). Herein, R, Rf, l, m and n have the same meanings as R, Rf, l, m and n in formula (2), respectively.

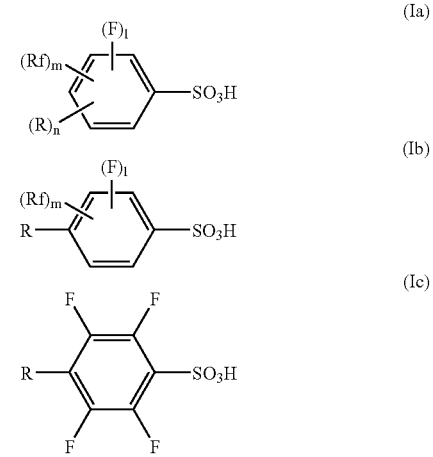

Suitable examples of the sulfonic acids represented by formula (2) are illustrated below, but these examples should not be construed as limiting the scope of the invention.

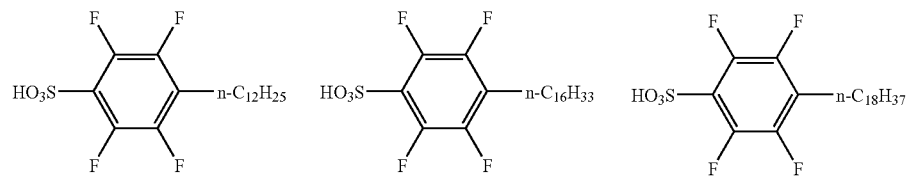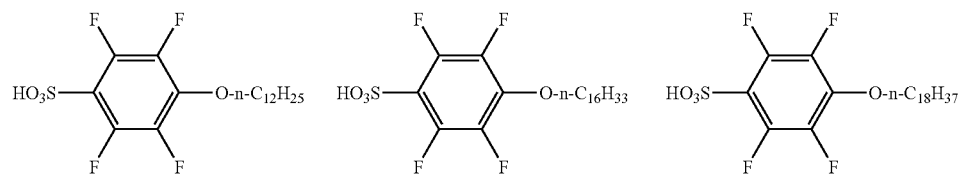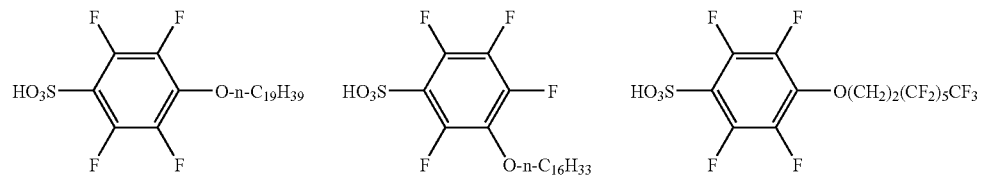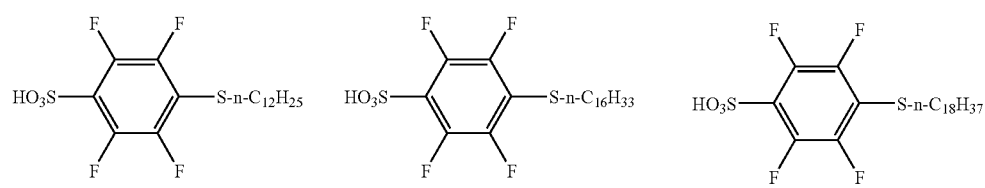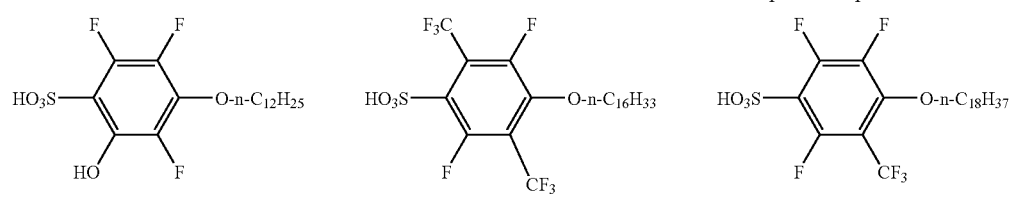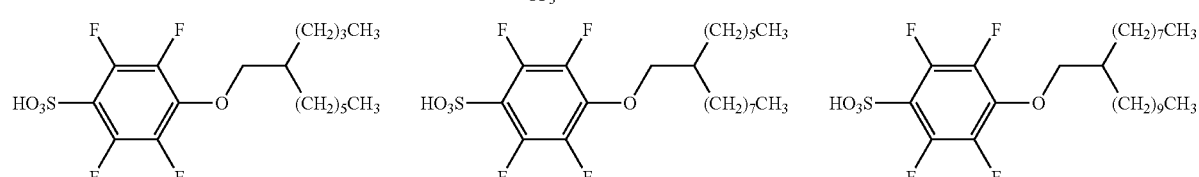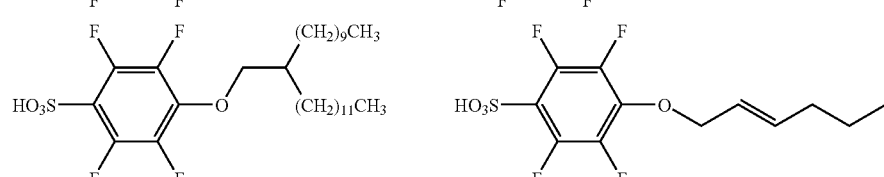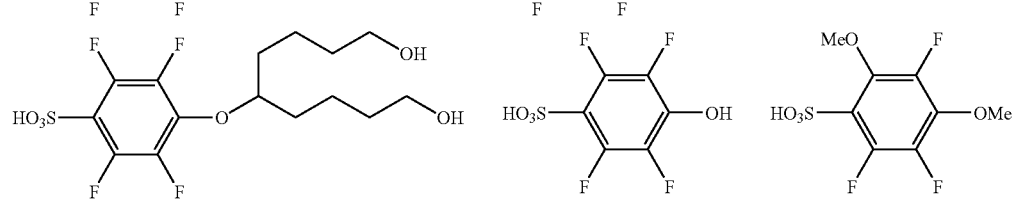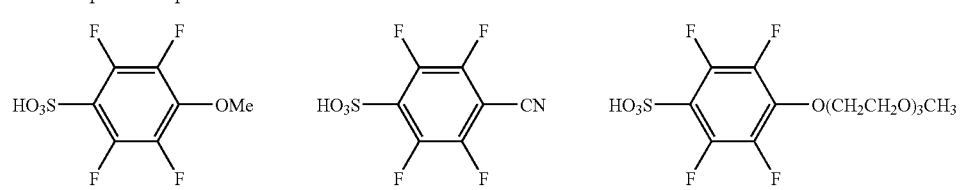

-continued
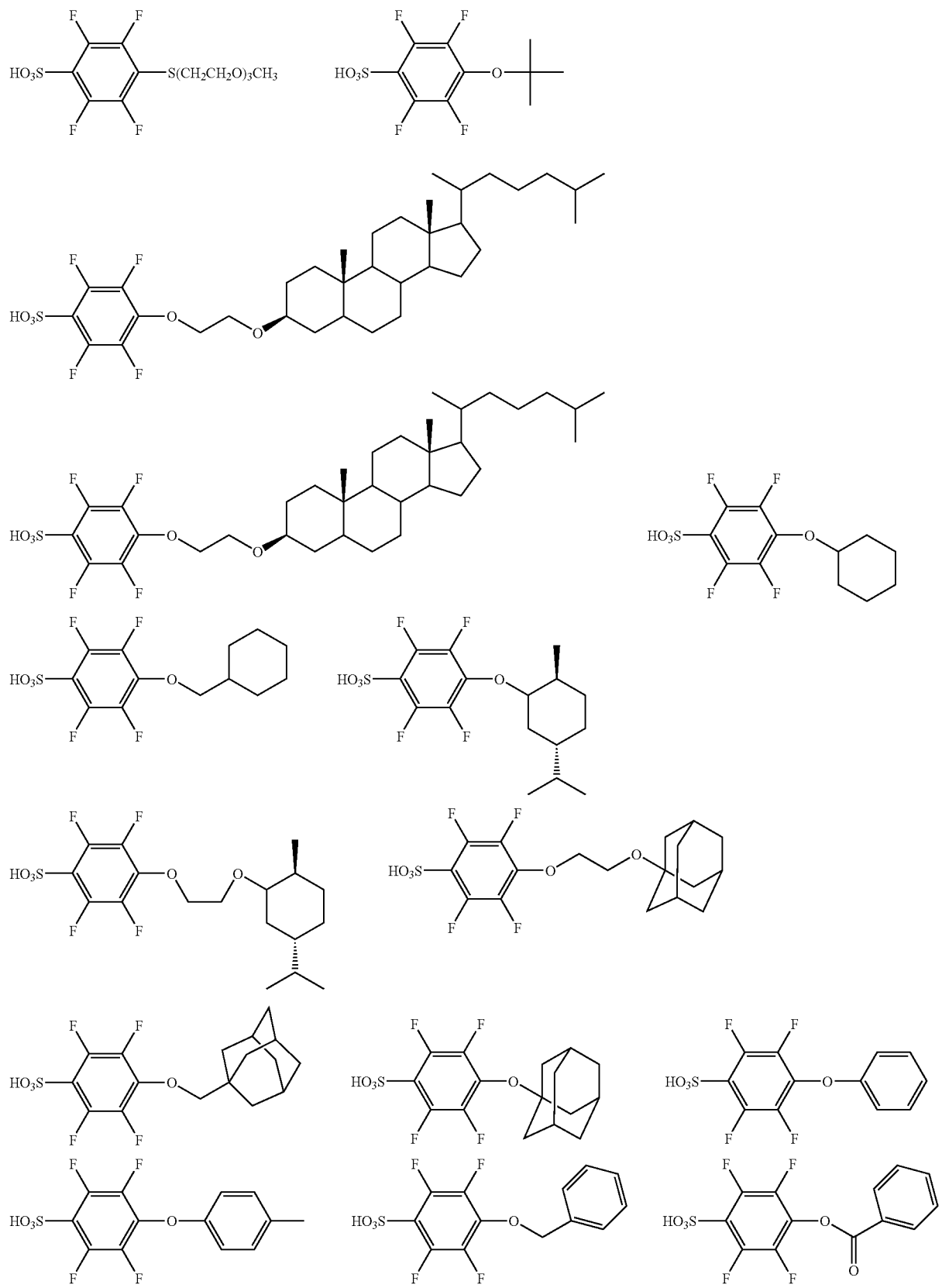

-continued
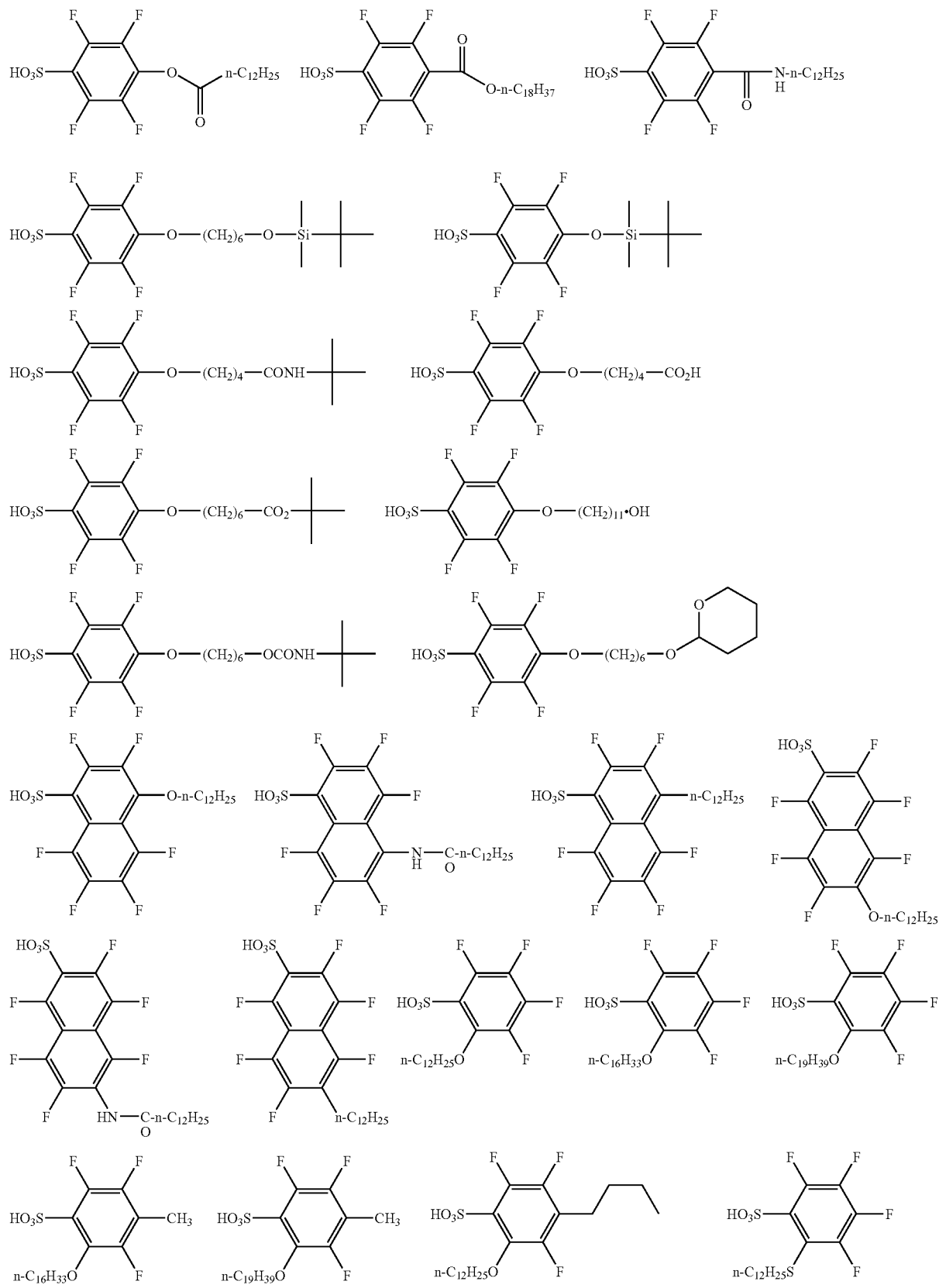

-continued
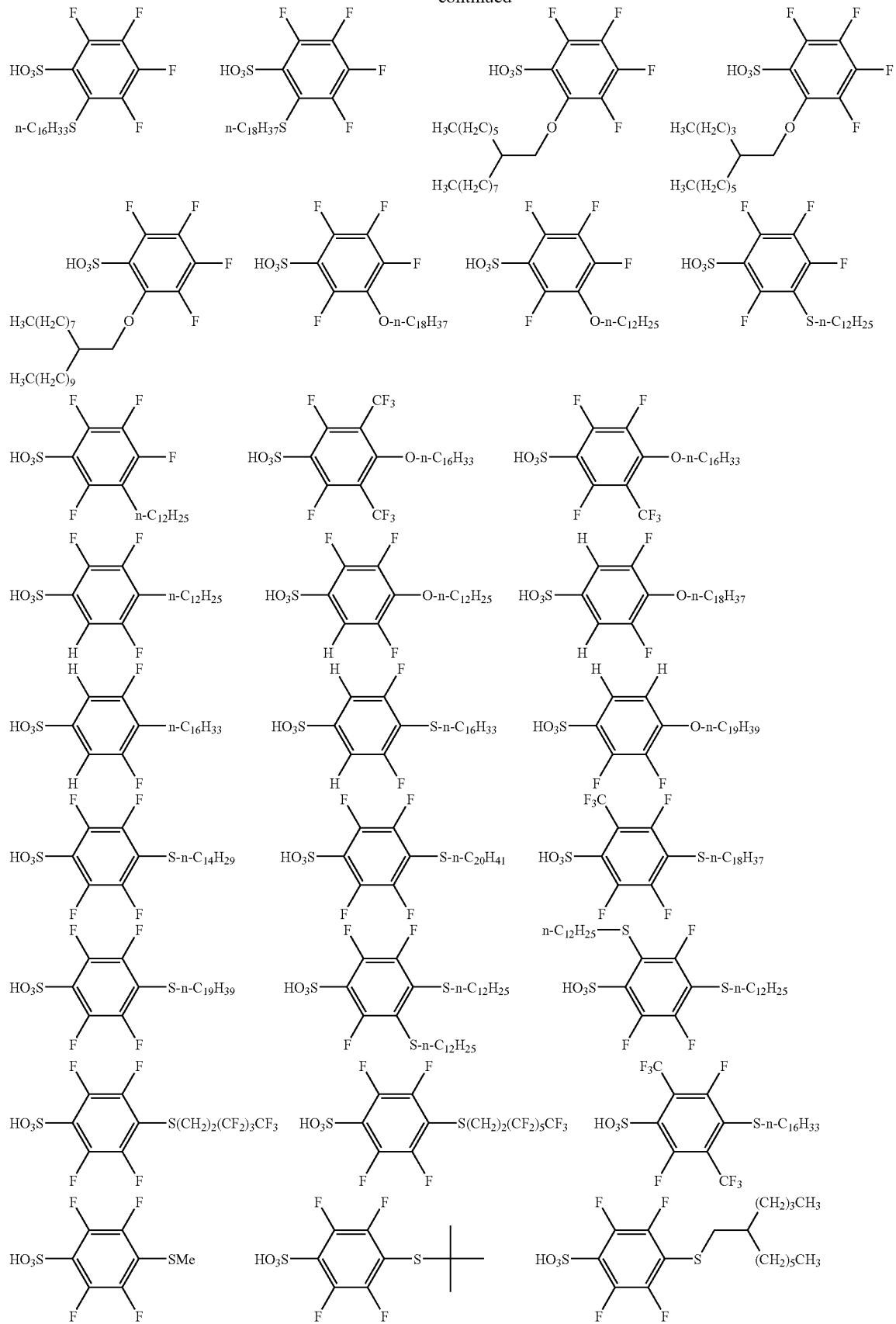

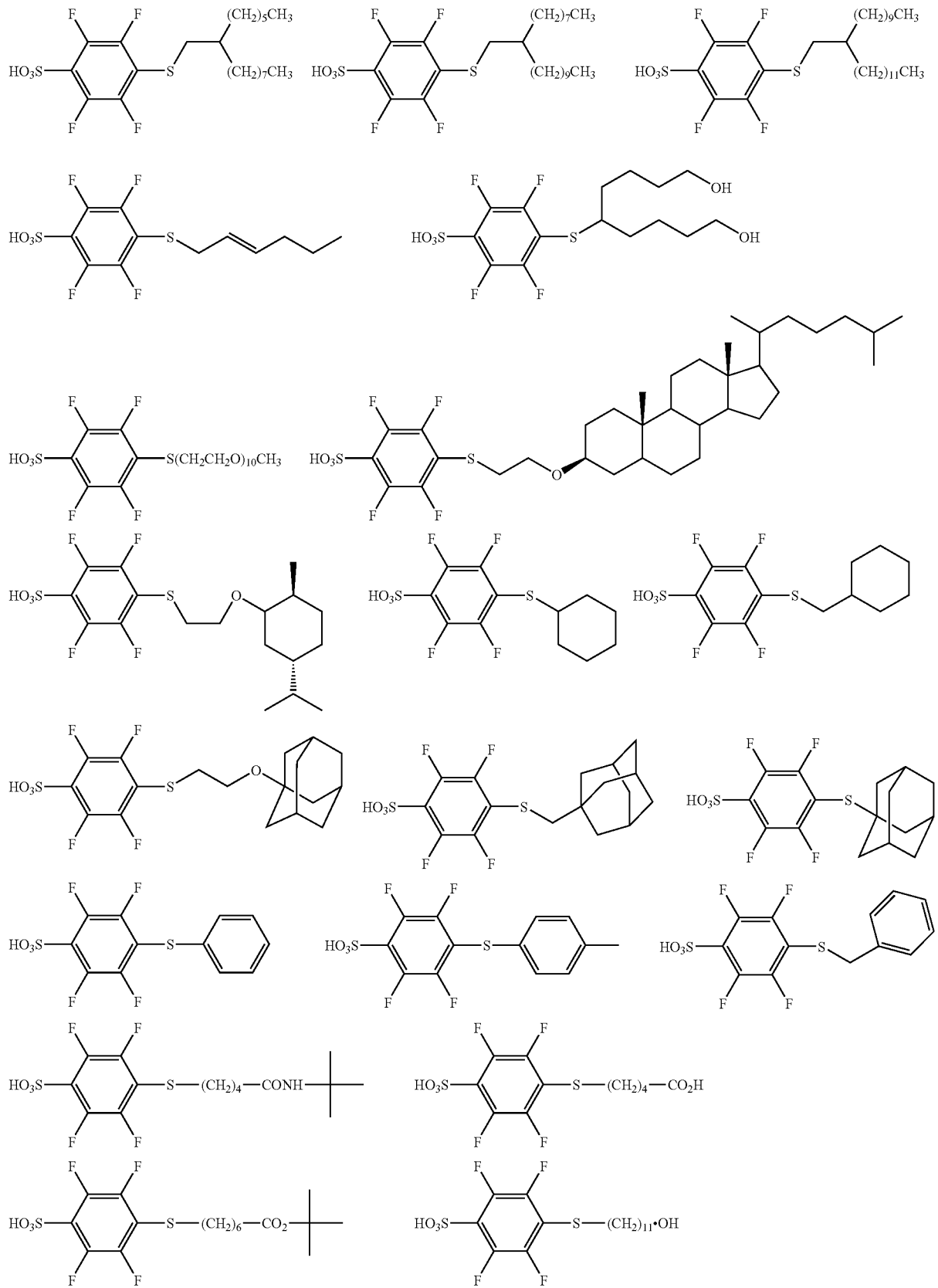

-continued

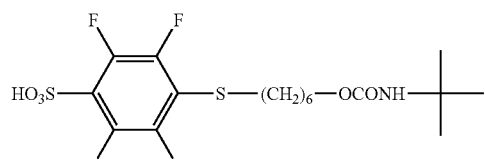
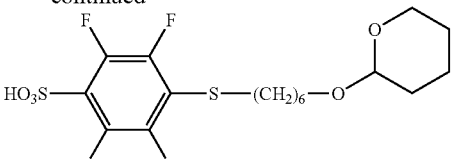

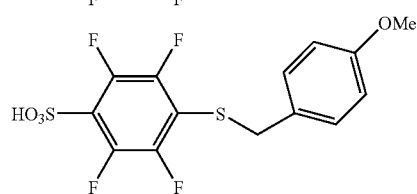

Compounds capable of generating the sulfonic acids represented by formula (2) upon irradiation with an actinic ray or radiation are preferably sulfonium salt compounds of the sulfonic acids represented by formula (2), iodonium salt compounds of the sulfonic acids represented by formula (2), or ester compounds of the sulfonic acids represented by formula (2), far preferably compounds represented by any of the following formulae (A1) to (A5).

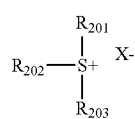 (A1)

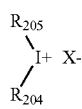 (A2)

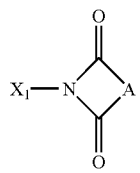 (A3)

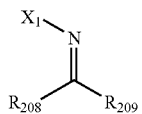 (A4)

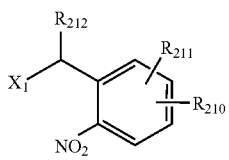 (A5)

In the above formula (A1), $R_{201}$, $R_{202}$ and $R_{203}$ each represent an organic group independently. $X^-$ represents a sulfonic acid anion formed by removing a hydrogen atom from —$SO_3H$ of the sulfonic acid of formula (2). The number of carbon atoms in the organic group represented by $R_{201}$, $R_{202}$ and $R_{203}$ each is generally from 1 to 30, preferably from 1 to 20.

Any two of $R_{201}$, $R_{202}$ and $R_{203}$ may combine with each other to form a ring structure, and the ring formed may contain an oxygen atom, a sulfur atom, an ester linkage, an amide linkage or a carbonyl group.

Examples of a group formed by combining any two of $R_{201}$, $R_{202}$ and $R_{203}$ include alkylene groups (such as a butylene group and a pentylene group).

Examples of an organic group represented by $R_{201}$, $R_{202}$ and $R_{203}$ each include the groups corresponding to those in Compounds (A1a), (A1 b) and (A1 c) described below.

Additionally, the sulfonium salt compound of formula (A1) may be a compound containing two or more of structures represented by formula (A1). For instance, the sulfonium salt compound of formula (A1) may be a compound having a structure formed by combining at least one of $R_{201}$, $R_{202}$ and $R_{203}$ in one compound represented by formula (A1) with at least one of $R_{201}$, $R_{202}$ and $R_{203}$ in another compound represented by formula (A1).

Examples of a compound more suitable as the component (A1) include the following compounds (A1a), (A1b) and (A1c).

The compound (A1a) is an arylsulfonium compound represented by the foregoing formula (A1) in which at least one of $R_{201}$ to $R_{203}$ is an aryl group, namely a compound having an arylsulfonium as its cation.

In the arylsulfonium compound, all of $R_{201}$ to $R_{203}$ may be aryl groups, or one or two of $R_{201}$ to $R_{203}$ may be aryl groups and the remainder may be an alkyl group or a cycloalkyl group.

Examples of such an arylsulfonium compound include a triarylsulfonium compound, a diarylalkylsulfonium compound and an aryldialkylsulfonium compound.

The aryl group in the arylsulfonium compound is preferably a phenyl group or a naphthyl group, far preferably a phenyl group. When the arylsulfonium compound has two or more aryl groups, the two or more aryl groups may be the same or different.

Suitable examples of an alkyl group that the arylsulfonium compound has as required include 1-15C linear or branched alkyl groups, such as a methyl group, an ethyl group, a propyl group, an n-butyl group, a sec-butyl group and a t-butyl group. And suitable examples of a cycloalkyl group include 3-15C cycloalkyl groups, such as a cyclopropyl group, a cyclobutyl group and a cyclohexyl group.

The aryl group, the alkyl group or the cycloalkyl group represented by any of $R_{201}$ to $R_{203}$ may have as a substituent an alkyl group (containing, e.g., 1 to 15 carbon atoms), an aryl group (containing, e.g., 6 to 14 carbon atoms), an alkoxy group (containing, e.g., 1 to 15 carbon atoms), a halogen atom, a hydroxyl group or a phenylthio group. Suitable examples of such substituents include 1-12C linear or branched alkyl groups, 3-12C cycloalkyl groups and 1-12C linear, branched or cyclic alkoxy groups. Of these substituents, 1-4C alkyl groups and 1-4C alkoxy groups are preferred over the others. One of $R_{201}$ to $R_{203}$ may have such a substituent, or all of $R_{201}$ to $R_{203}$ may have such substituents. When $R_{201}$ to $R_{203}$ are aryl groups, it is preferable that each substituent is situated in the p-position of each aryl group.

Next, the compound (A1b) is described below.

The compound (A1b) is a compound represented by the formula (A1) wherein $R_{201}$ to $R_{203}$ each independently represent an organic group having no aromatic ring. The term "aromatic ring" as used herein is intended to also include aromatic rings containing hetero atoms.

The number of carbon atoms in an organic group having no aromatic ring, which is represented by each of $R_{201}$ to $R_{203}$, is generally from 1 to 30, preferably from 1 to 20.

Each of $R_{201}$ to $R_{202}$ is preferably an alkyl group, a cycloalkyl group, a linear, branched or cyclic oxoalkyl group which may have a double bond in the alkyl chain, an alkoxycarbonylmethyl group, an allyl group or a vinyl group, far preferably a linear, branched or cyclic 2-oxoalkyl group, particularly preferably a linear or branched 2-oxoalkyl group.

The alkyl group as each of $R_{201}$ to $R_{203}$ may be either linear or branched, and suitable examples thereof include 1-20C linear and branched alkyl groups (such as a methyl group, an ethyl group, a propyl group, a butyl group and a pentyl group).

The cycloalkyl group as each of $R_{201}$ to $R_{203}$ is preferably a cycloalkyl group containing 3 to 10 carbon atoms, with examples including a cyclopentyl group, a cyclohexyl group and a norbornyl group.

The 2-oxoalkyl group as each of $R_{201}$ to $R_{203}$ may be any of linear, branched and cyclic ones, and suitable examples thereof include groups which are the same alkyl groups as recited above except that they have >C=O at their respective 2-positions.

The alkyl moiety in the alkoxycarbonylmethyl group as each of $R_{201}$ to $R_{203}$ is preferably a 1-5C alkyl group (such as a methyl, ethyl, propyl, butyl or pentyl group).

Each of groups represented by $R_{201}$ to $R_{203}$ may further be substituted with a halogen atom, an alkoxy group (containing, e.g., 1 to 5 carbon atoms), a hydroxyl group, a cyano group or a nitro group.

Any two of $R_{201}$ to $R_{203}$ may combine with each other to form a ring structure, and may contain an oxygen atom, a sulfur atom, an ester linkage, an amide linkage or a carbonyl group in the ring formed. Examples of a group formed by combining any two of $R_{201}$ to $R_{203}$ include alkylene groups (such as a butylene group and a pentylene group).

The compound (A1c) is a compound represented by the following formula (A1c), namely a compound having an arylacylsulfonium salt structure.

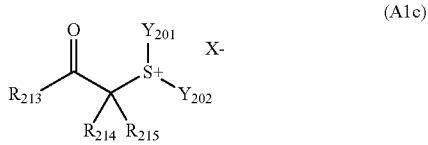

(A1c)

In formula (A1c), $R_{213}$ represents an aryl group which may have a substituent, preferably a phenyl group or a naphthyl group.

Suitable examples of a substituent which may be present on $R_{213}$ include an alkyl group, a cycloalkyl group, an alkoxy group, an acyl group, a nitro group, a hydroxyl group, an alkoxycarbonyl group and a carboxyl group.

$R_{214}$ and $R_{215}$ each represent a hydrogen atom, an alkyl group or a cycloalkyl group.

$Y_{201}$ and $Y_{202}$ each independently represent an alkyl group (including substituted alkyl groups, notably a 2-oxoalkyl group, an alkoxycarbonylalkyl group and a carboxyalkyl group), a cycloalkyl group, an aryl group or a vinyl group.

$R_{213}$ and $R_{214}$, $R_{214}$ and $R_{215}$, or $Y_{201}$ and $Y_{202}$ may combine with each other to form a ring structure in which an oxygen atom, a sulfur atom, an ester linkage or an amide linkage may be contained.

The alkyl group as $Y_{201}$ and $Y_{202}$ each is preferably a 1-20C linear or branched alkyl group.

The cycloalkyl group as $R_{214}$, $R_{215}$, $Y_{201}$ and $Y_{202}$ each is preferably a 3-20C cycloalkyl group.

The 2-oxoalkyl group can include groups which are the same alkyl groups as $Y_{201}$ and $Y_{202}$ may represent, except that they have >C=O at their respective 2-positions.

The alkoxycarbonyl moiety in the alkoxycarbonylalkyl group is preferably a 2-20C alkoxycarbonyl group.

The group formed by combining $Y_{201}$ and $Y_{202}$ can include a butylene group and a pentylene group.

Each of $Y_{201}$ and $Y_{202}$ is preferably an alkyl group containing 4 or more carbon atoms, far preferably an alkyl group containing 4 to 16 carbon atoms, further preferably an alkyl group containing 4 to 12 carbon atoms.

In addition, it is preferable that at least either $R_{214}$ or $R_{215}$ is an alkyl group, and it is far preferable that both $R_{214}$ and $R_{215}$ are alkyl groups.

In formula (A2), $X^-$ represents a sulfonic acid anion formed by removing a hydrogen atom from —$SO_3H$ of the sulfonic acid of formula (2).

$R_{204}$ and $R_{205}$ each represent an aryl group, an alkyl group or a cycloalkyl group independently.

The aryl group as $R_{204}$ and $R_{205}$ each is preferably a phenyl group or a naphthyl group, far preferably a phenyl group.

The alkyl group as $R_{204}$ and $R_{205}$ each may be either linear or branched, and suitable examples thereof include 1-10C linear and branched alkyl groups (such as a methyl group, an ethyl group, a propyl group, a butyl group and a pentyl group).

The cycloalkyl group as $R_{204}$ and $R_{205}$ each preferably includes 3-10C cycloalkyl groups, such as a cyclopentyl group, a cyclohexyl group and a norbornyl group.

Each of the groups represented by $R_{204}$ and $R_{205}$ may have as a substituent an alkyl group (containing, e.g., 1 to 15 carbon atoms), an aryl group (containing, e.g., 6 to 15 carbon atoms), an alkoxy group (containing, e.g., 1 to 15 carbon atoms), a halogen atom, a hydroxyl group or a phenylthio group.

In formulae (A3) to (A5), $X_1$ represents a univalent group formed by removing a hydrogen atom from —$SO_3H$ of the sulfonic acid of formula (2).

In formula (A3), A represents an alkyl group, an alkenyl group and an arylene group, all of which preferably contain 1 to 6 carbon atoms.

In formula (A4), $R_{208}$ represents an alkyl group, a cycloalkyl group or an aryl group.

$R_{209}$ represents an alkyl group (notably an oxoalkyl group as a substituted alkyl group), a cycloalkyl group, a cyano group or an alkoxycarbonyl group, preferably a halogen-substituted alkyl group or a cyano group.

The alkyl and cycloalkyl groups that each of $R_{208}$ and $R_{209}$ may represent are the same alkyl and cycloalkyl groups as each of $R_{204}$ and $R_{205}$ may represent.

The aryl group that $R_{208}$ may represent is the same aryl group as $R_{204}$ and $R_{205}$ each may represent.

The alkoxycarbonyl group that $R_{209}$ may represent preferably contains 2 to 11 carbon atoms, and suitable examples thereof include a methoxycarbonyl group, an ethoxycarbonyl group, a propoxycarbonyl group and a butoxycarbonyl group.

In formula (A5), $R_{210}$ and $R_{211}$ each represent a hydrogen atom, an alkyl group, a cycloalkyl group, a cyano group, a nitro group or an alkoxycarbonyl group, preferably a halogen-substituted alkyl group, a nitro group or a cyano group.

$R_{212}$ represents a hydrogen atom, an alkyl group, a cycloalkyl group, a cyano group or an alkoxycarbonyl group.

The alkyl and cycloalkyl groups that each of $R_{210}$ to $R_{212}$ may represent are the same alkyl and cycloalkyl groups as each of $R_{204}$ and $R_{205}$ may represent.

The alkoxycarbonyl group that $R_{212}$ may represent is the same alkoxycarbonyl group as $R_{209}$ may represent.

Of the compounds represented by formulae (A1) to (A5), the compounds represented by formula (A1) are preferred and the compounds represented by formulae (A1a) to (A1c) are far preferred.

Examples of a compound capable of generating a sulfonic acid represented by formula (2) upon irradiation with an actinic ray or radiation are illustrated below, but these examples should not be construed as limiting the scope of the invention.

(A-1)

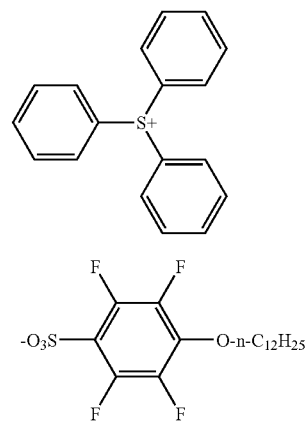

(A-2)

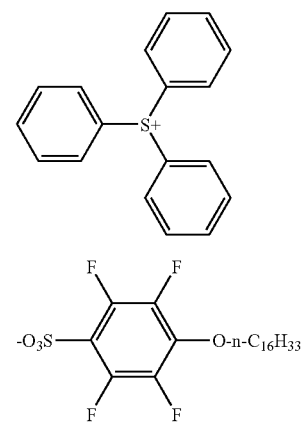

(A-3)

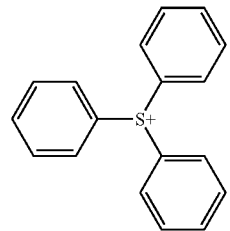

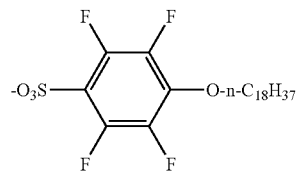

(A-4)

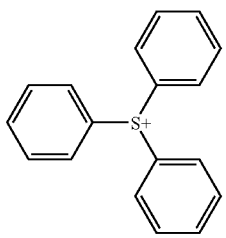  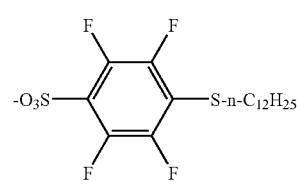

(A-5)

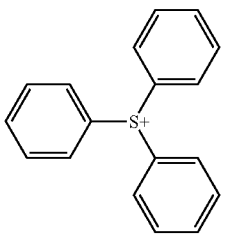  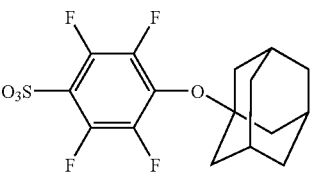

(A-6)

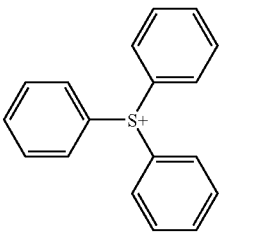

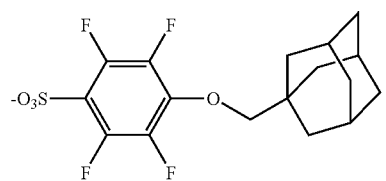

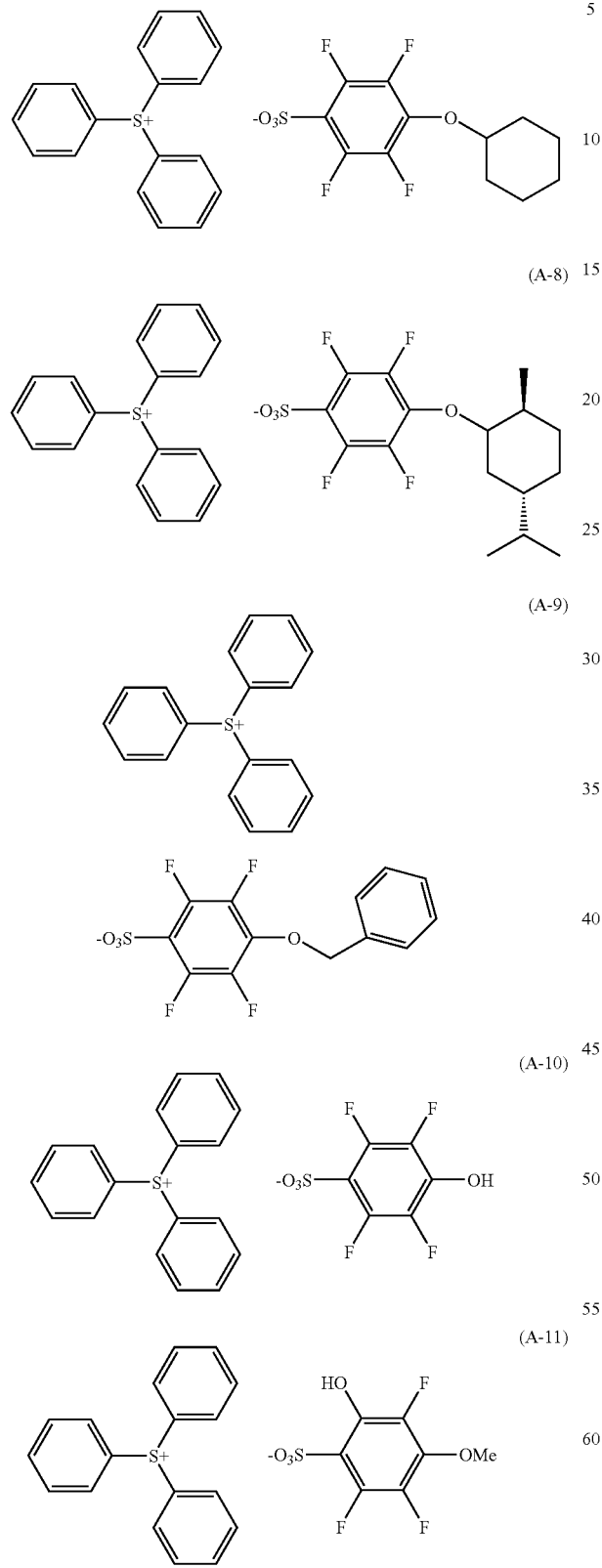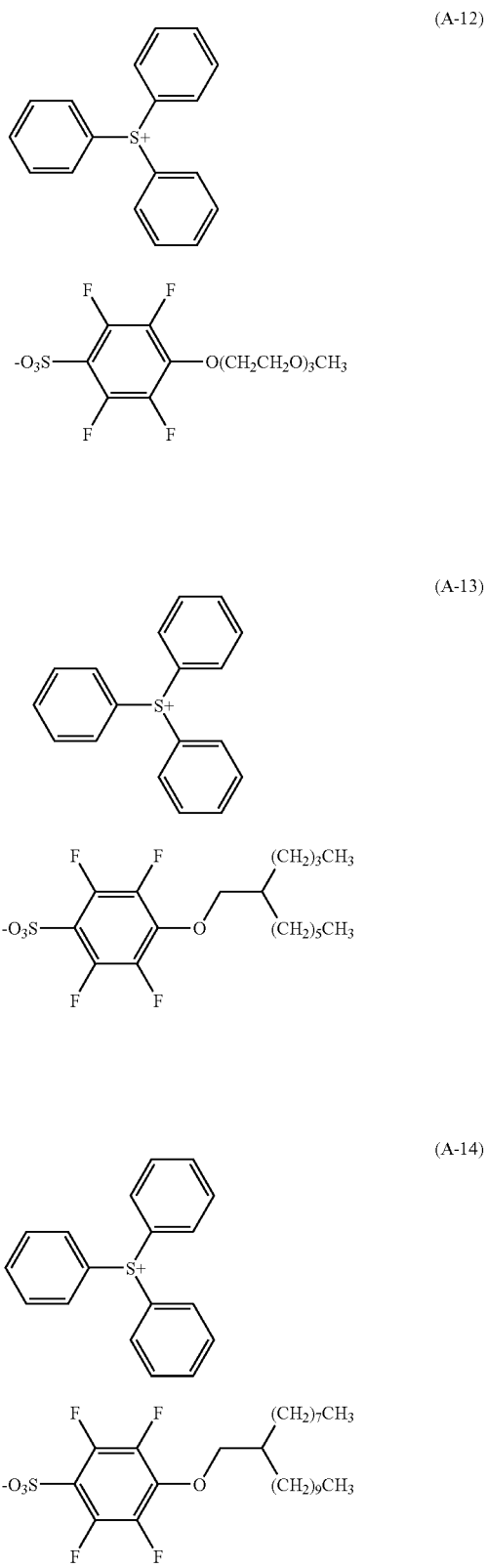

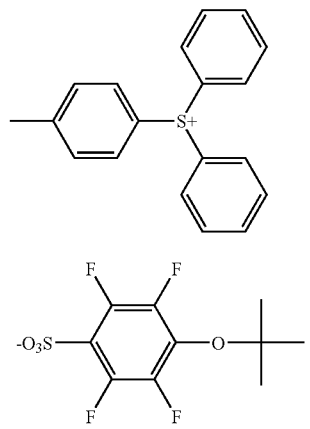
(A-15)
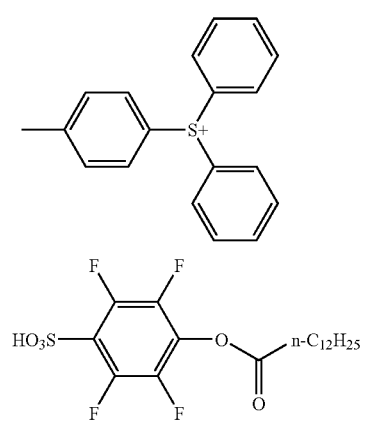
(A-16)
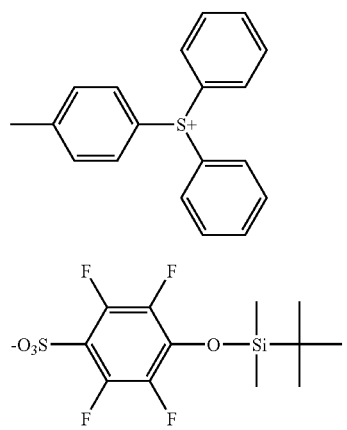
(A-17)
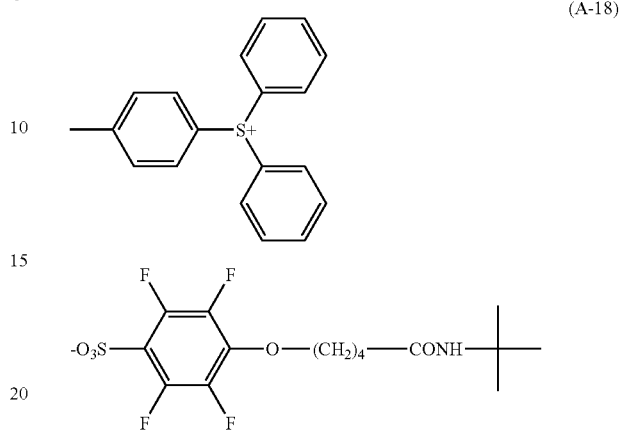
(A-18)
(A-19)
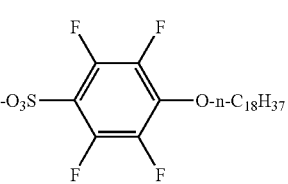
(A-20)

-continued
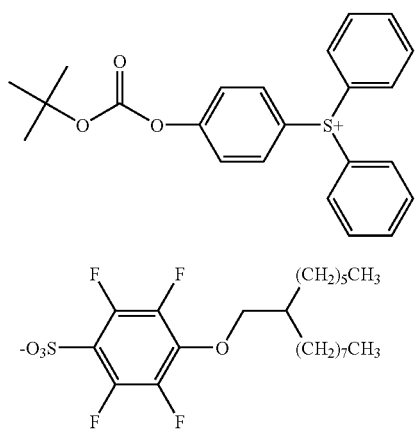
(A-21)
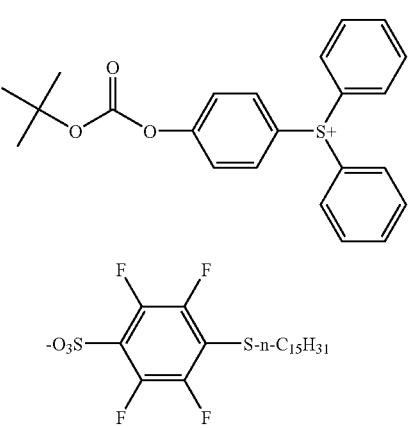
(A-22)
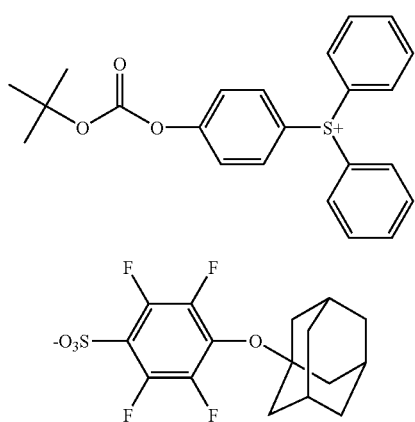
(A-23)
-continued
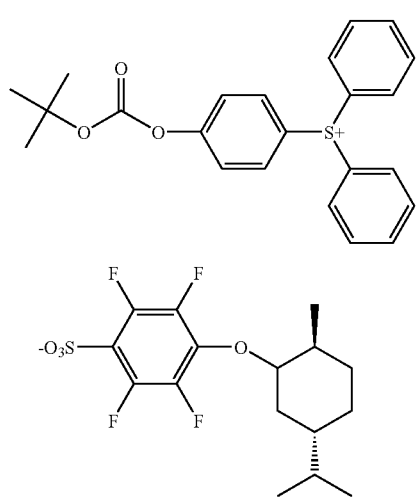
(A-24)
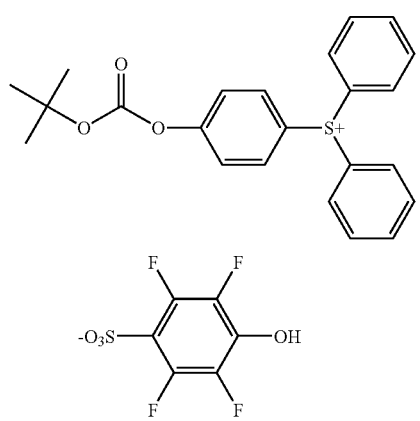
(A-25)
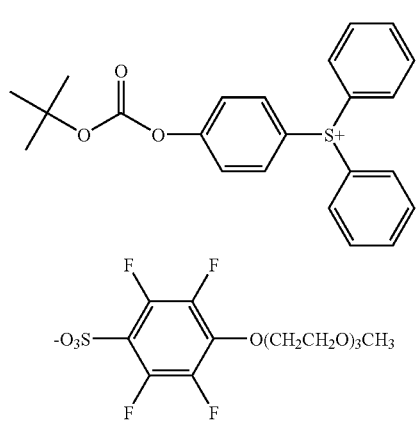
(A-26)

-continued
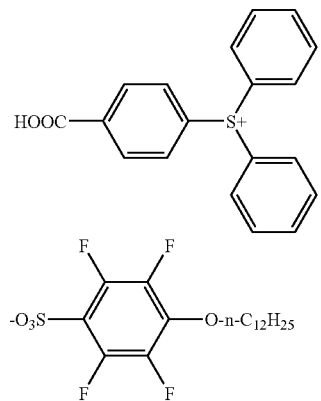
(A-27)
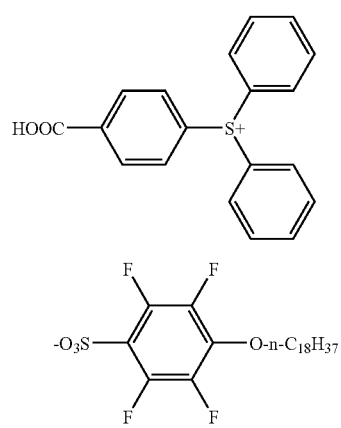
(A-28)
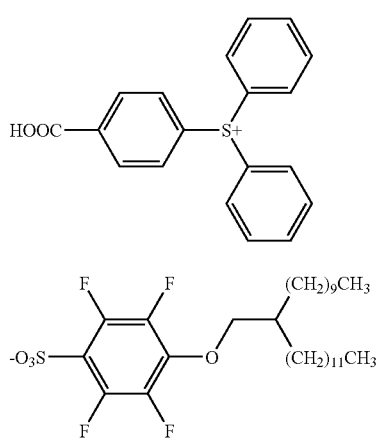
(A-29)
-continued
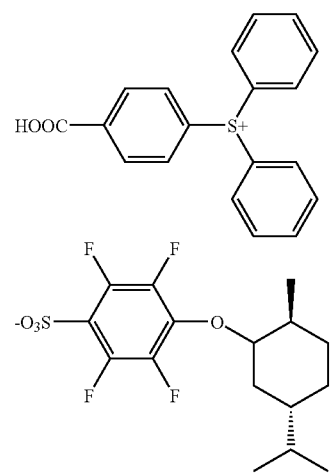
(A-30)
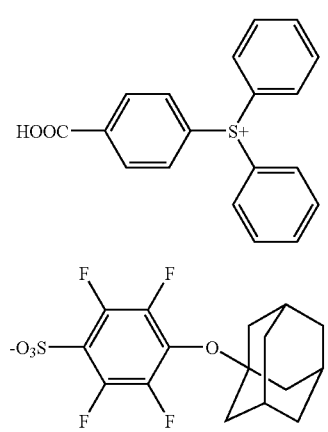
(A-31)
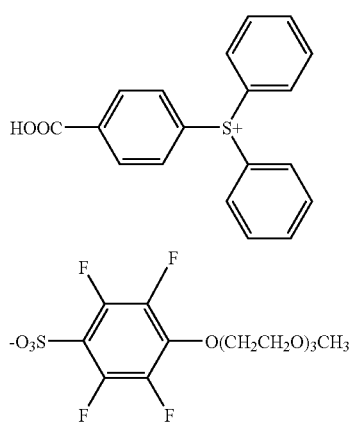
(A-32)

-continued

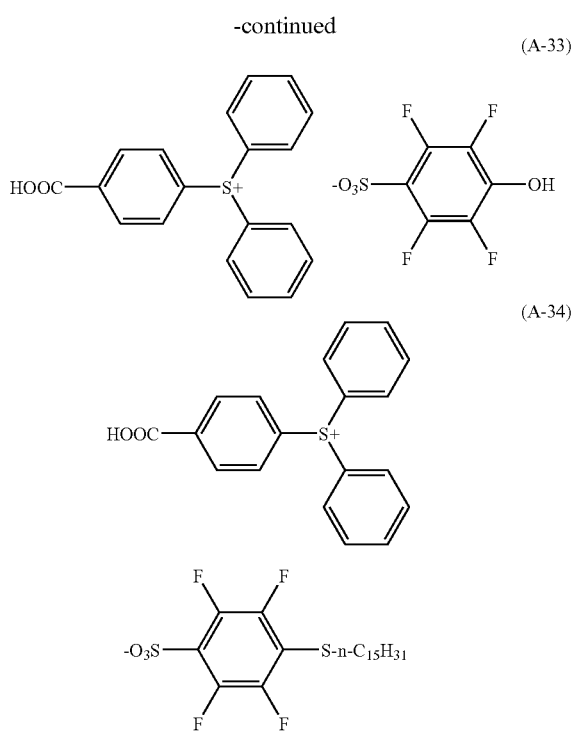

The compounds capable of generating sulfonic acids represented by formula (2) upon irradiation with actinic rays or radiation can be synthesized, e.g., as follows: Derivatives of the sulfonic acid of formula (2) are synthesized first, and then the derivatives are allowed to react with onium halide to undergo salt interchange, or react with a compound containing a hydroxyl group to undergo esterification. The derivatives of the sulfonic acid of formula (2) can be synthesized according to the methods described, e.g., in *J. Chem. Soc.*, Perkin Trans. 1, (2000), pp. 4265-4278.

(B2): Compound Capable of Generating Sulfonic Acid Represented by Formula (3) or (3') Upon Irradiation with Actinic Ray or Radiation

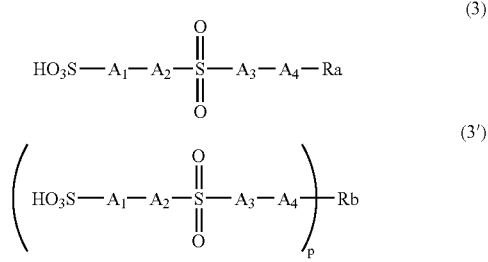

In formula (3) or (3'), $A_1$ represents a divalent linkage group, $A_2$ and $A_3$ each represent a single bond, an oxygen atom or —N(Rx)— independently, Rx represents a hydrogen atom, an aryl group, an alkyl group or a cycloalkyl group, $A_4$ represents a single bond or —C(=O)—, Ra represents a hydrogen atom or an organic group, p represents 2 or 3, and Rb represents a p-valent linkage group. When $A_3$ is —N(Rx)—, Ra and Rx, or Rb and Rx may combine with each other to form a ring.

The divalent linkage group as $A_1$ is preferably an organic group containing 1 to 20 carbon atoms, far preferably an alkylene group (containing preferably 1 to 10 carbon atoms, far preferably 2 to 6 carbon atoms, further preferably 3 to 4 carbon atoms). In such an alkylene chain, a linkage group such as an oxygen atom, a sulfur atom, —C(=O)— group or an ester linkage may be contained.

The divalent linkage group as $A_1$ is further preferably an alkylene group substituted with at least one fluorine atom, particularly preferably an alkylene group formed by substituting fluorine atoms for 30 to 100% by number of hydrogen atoms. When $A_1$ is an alkylene group substituted with at least one fluorine atom, it is preferable that the carbon atom bound to the —SO$_3$H group has the fluorine atom. Further, the alkylene group is preferably a perfluoroalkylene group, particularly preferably a perfluoroethylene group, a perfluoropropylene group or a perfluorobutylene group.

The aryl group as Rx may have a substituent, and it is preferably a 6-14C aryl group, such as a phenyl group or a naphthyl group.

The alkyl group as Rx may have a substituent, and it is preferably a 1-20C linear or branched alkyl group which may contain an oxygen atom, a sulfur atom or a nitrogen atom in the alkyl chain. Examples of such an alkyl group include linear alkyl groups, such as a methyl group, an ethyl group, an n-propyl group, an n-butyl group, an n-pentyl group, an n-hexyl group, an n-octyl group, an n-dodecyl group, an n-tetradecyl group or an n-octadecyl group; and branched alkyl groups, such as an isopropyl group, an isobutyl group, a t-butyl group, a neopentyl group and a 2-ethylhexyl group.

Additionally, a linear or branched alkyl group having a cycloalkyl substituent (such as an adamantylmethyl group, an adamantylmethyl group, a cyclohexylethyl group or a camphor residue) in particular is suitable as the alkyl group having a substituent.

The cycloalkyl group as Rx may have a substituent, and it is preferably a 3-20C cycloalkyl group which may contain an oxygen atom in the ring. Examples of such a group include a cyclopropyl group, a cyclopentyl group, a cyclohexyl group, a norbornyl group and an adamantyl group.

Ra represents a hydrogen atom or a univalent organic group.

The univalent organic group as Ra is preferably a 1-20C organic group, such as a 1-20C alkyl, cycloalkyl, aryl, aralkyl or alkenyl group.

The alkyl, cycloalkyl or aryl group as Ra includes the same groups as those recited above as Rx.

The aralkyl group as Ra is preferably a 7-20C aralkyl group, such as a benzyl group, a phenethyl group, a naphthylmethyl group or a naphthylethyl group.

The alkenyl group as Ra is a group having a double bond at an arbitrary position of each of the alkyl groups recited above as Rx.

The p-valent linkage group as Rb preferably contains 1 to 20 carbon atoms. When p is 2 in formula (3'), the divalent linkage group as Rb includes an alkylene group (preferably containing 1 to 20 carbon atoms), an arylene group (preferably containing 6 to 10 carbon atoms), an aralkylene group (preferably containing 7 to 13 carbon atoms) and an alkenylene group (preferably containing 2 to 12 carbon atoms). These groups may have substituents.

The trivalent linkage group as Rb in the case of p=3 is a trivalent group formed by removing an arbitrary hydrogen atom from each of the divalent groups recited above.

Examples of a substituent that each of the groups recited above may have include a halogen atom, a hydroxyl group, a nitro group, a cyano group, a carboxyl group, a carbonyl group, a cycloalkyl group (preferably containing 3 to 20 carbon atoms), an aryl group (preferably containing 6 to 14 carbon atoms), an alkoxy group (preferably containing 1 to 20 carbon atoms), an acyl group (preferably containing 2 to 20 carbon atoms), an acyloxy group (preferably containing 2 to 20 carbon atoms), an alkoxycarbonyl group (preferably containing 2 to 20 carbon atoms) and an aminoacyl group (preferably containing 2 to 20 carbon atoms). Besides these substituents, it is also preferable in the cases of aryl and cycloalkyl groups that the ring structure has an alkyl group (preferably containing 1 to 15 carbon atoms) as a substituent. In the case of the aminoacyl group, it is also preferable that one or two alkyl groups (preferably containing 1 to 20 carbon atoms) are further attached as substituents.

The sulfonic acids of formulae (3) and (3') are preferably sulfonic acids represented by the following formulae (IA) to (IC) and the following formulae (I'A) to (I'C), respectively.

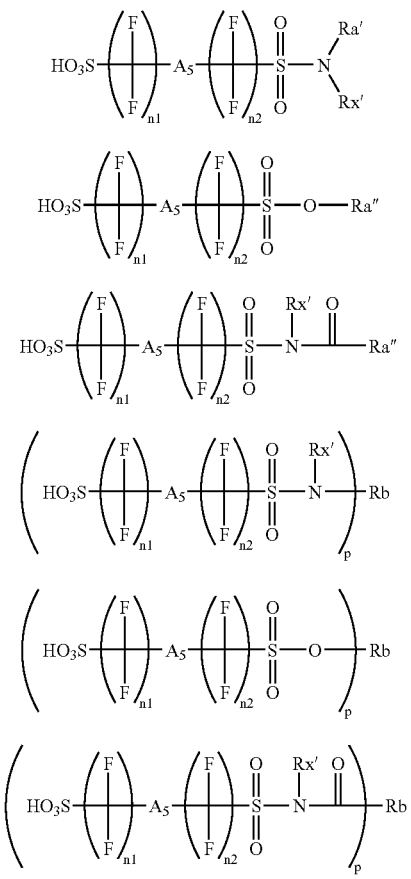

In formulae (IA) to (IC) and formulae (I'A) to (I'C), Ra' has the same meaning as Ra in formula (3).

Rb and p have the same meanings as Rb and p in formula (3').

Ra" represents an alkyl group, an aryl group, an aralkyl group or an alkenyl group.

Rx' has the same meaning as Rx in formulae (3) and (3').

n1 represents an integer of 1 to 10.

n2 represents an integer of 0 to 10.

$A_5$ represents an alkylene group or an arylene group.

The alkylene group as $A_5$ is preferably an alkylene or cycloalkylene group having no fluorine substituent.

In formula (IA), it is preferable that Ra' and Rx' combine with each other to form a ring. By forming a ring structure, the compound's stability is improved, and the composition using such a compound can obtain an improvement in storage stability. The ring formed preferably contains 4 to 20 carbon atoms, and it may be either monocyclic or polycyclic, and therein an oxygen atom, a sulfur atom or a nitrogen atom may be contained.

Examples of a monocyclic structure include nitrogen-containing 4-, 5-, 6-, 7- and 8-membered heterocyclic rings. Examples of a polycyclic structure include structures formed by combining two monocyclic structures and those formed by combining three or more monocyclic structures. These rings each may contain an oxygen atom or a sulfur atom. The monocyclic and polycyclic structures may have substituents, and suitable examples of such substituents include a halogen atom, a hydroxyl group, a cyano group, a carboxyl group, a carbonyl group, a cycloalkyl group (preferably containing 3 to 10 carbon atoms), an aryl group (preferably containing 6 to 14 carbon atoms), an alkoxy group (preferably containing 1 to 10 carbon atoms), an acyl group (preferably containing 2 to 15 carbon atoms), an acyloxy group (preferably containing 2 to 15 carbon atoms), an alkoxycarbonyl group (preferably containing 2 to 15 carbon atoms) and an aminoacyl group (preferably containing 2 to 20 carbon atoms). Besides these substituents, it is also preferable in the cases of aryl and cycloalkyl groups that the ring structure has an alkyl group (preferably containing 1 to 15 carbon atoms) as a substituent. In the case of the aminoacyl group, it is also preferable that one or two alkyl groups (preferably containing 1 to 20 carbon atoms) are further attached as substituents.

Examples of the alkyl, aryl, aralkyl and alkenyl groups that Ra" may represent include the same groups as recited above with respect to examples of the alkyl, aryl, aralkyl and alkenyl groups as Ra may represent.

n1+n2 is preferably from 2 to 8, far preferably from 2 to 6.

Examples of sulfonic acids represented by formulae (3) and (3') are illustrated below, but these examples should not be construed as limiting the scope of the invention.

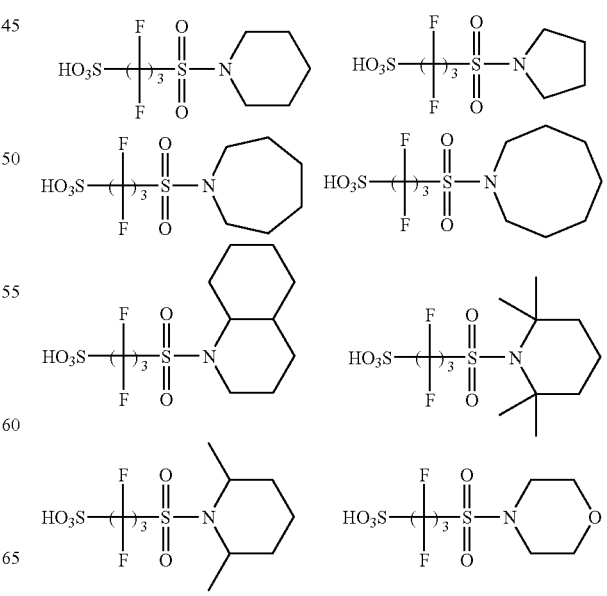

-continued
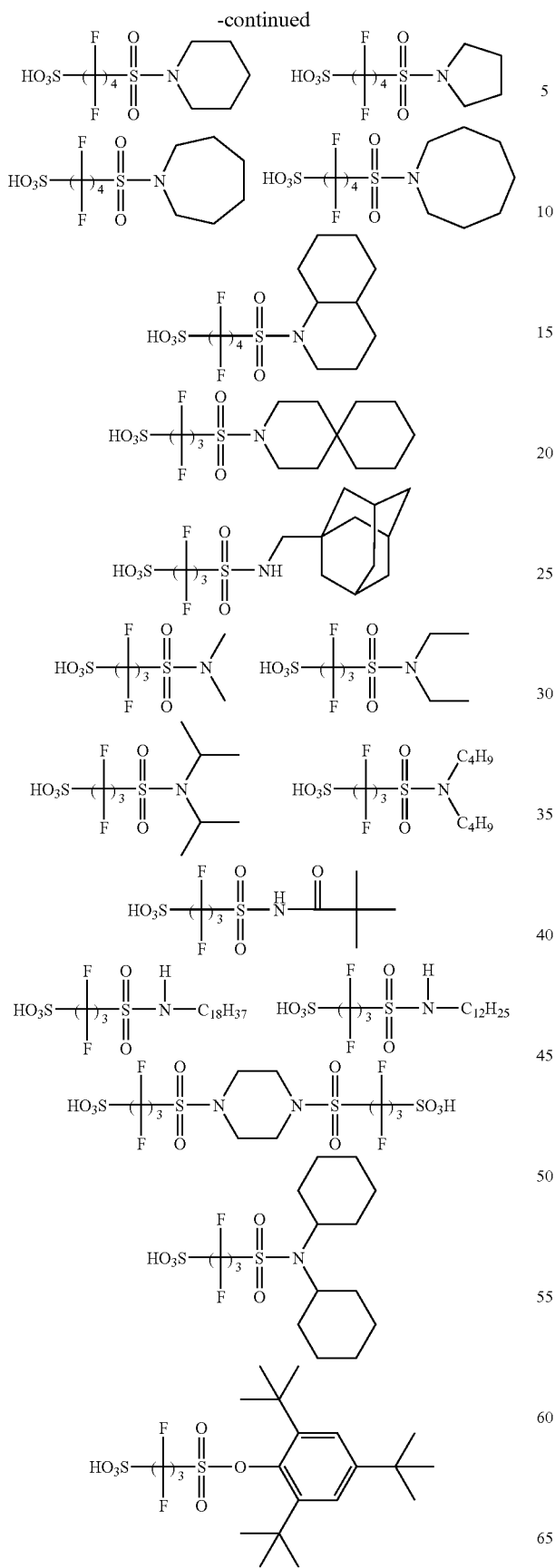
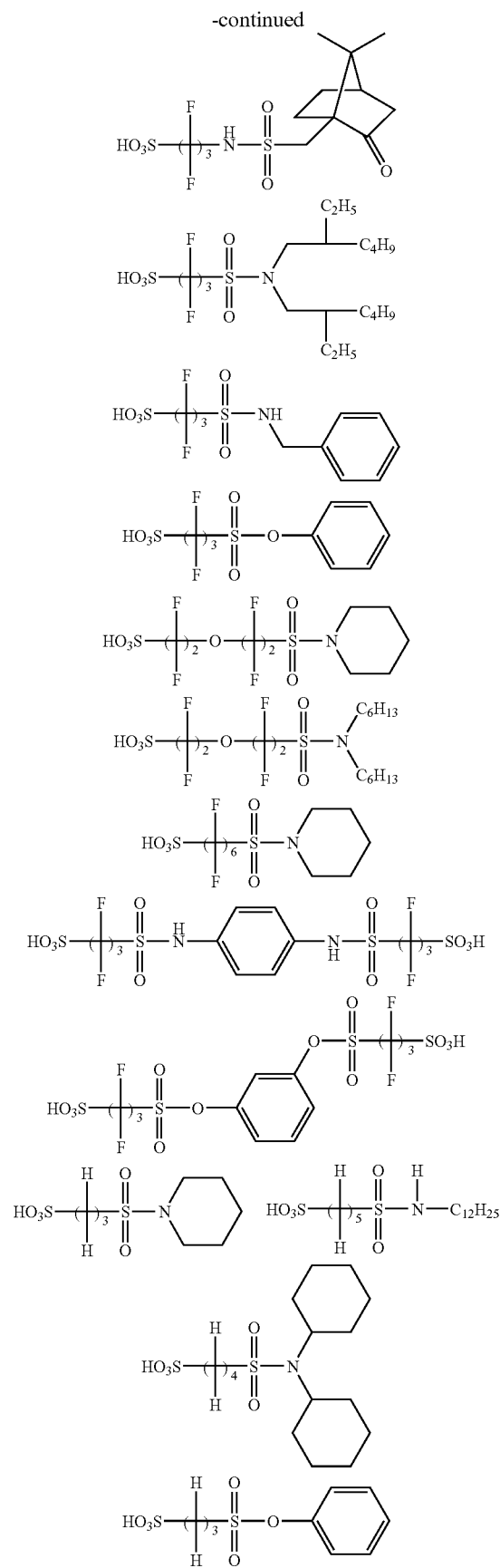

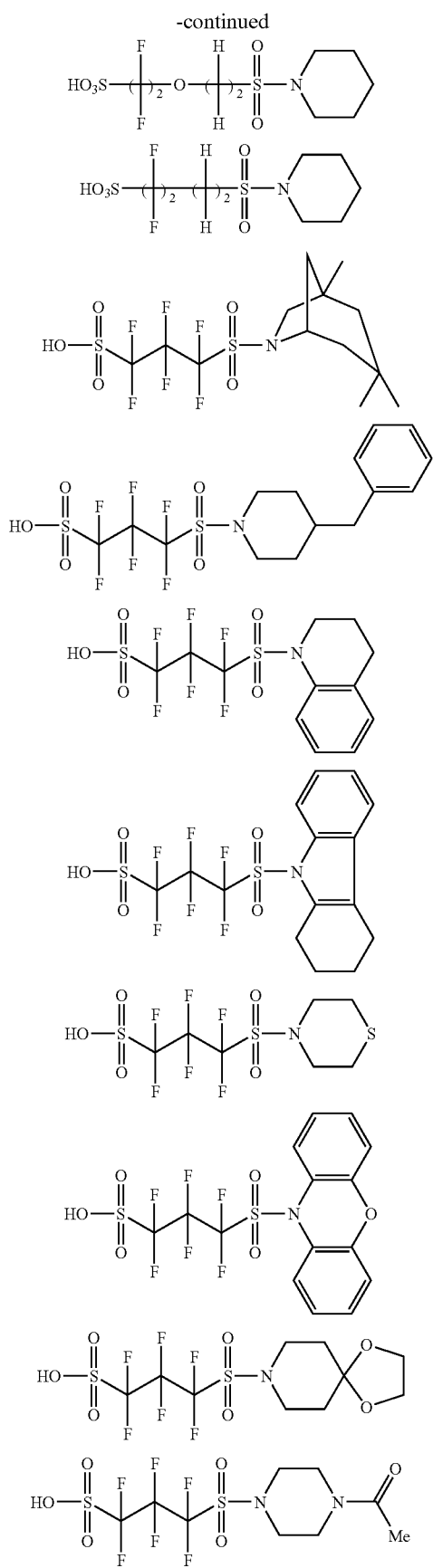
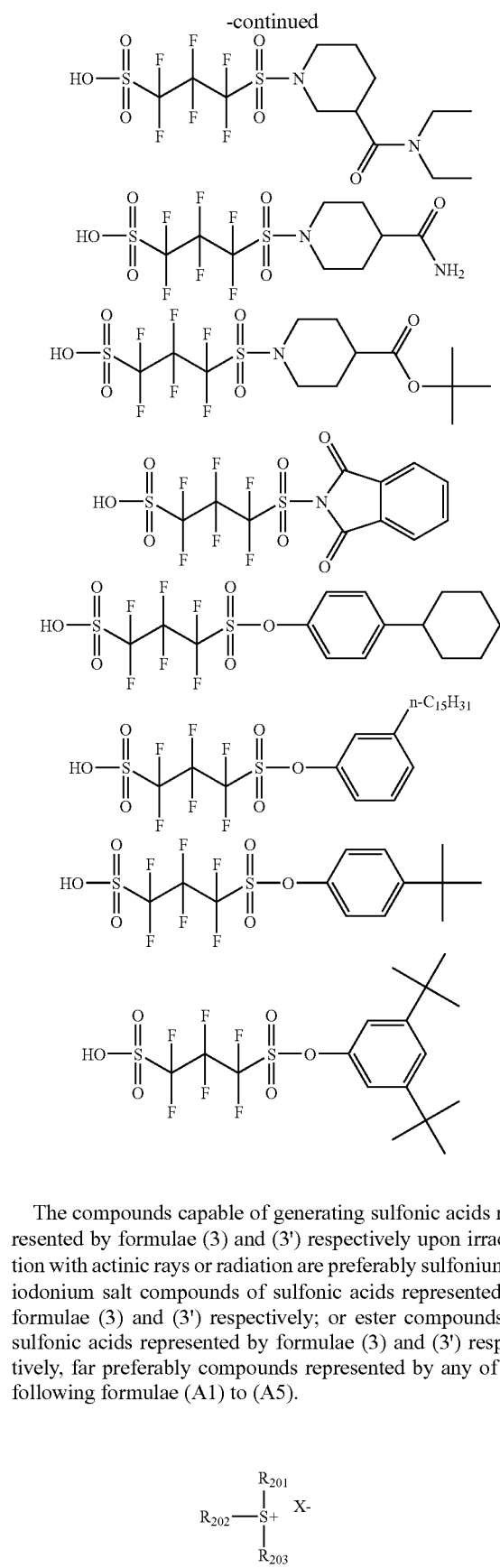

The compounds capable of generating sulfonic acids represented by formulae (3) and (3') respectively upon irradiation with actinic rays or radiation are preferably sulfonium or iodonium salt compounds of sulfonic acids represented by formulae (3) and (3') respectively; or ester compounds of sulfonic acids represented by formulae (3) and (3') respectively, far preferably compounds represented by any of the following formulae (A1) to (A5).

$$\begin{array}{c} R_{201} \\ | \\ R_{202}-S+ \quad X- \\ | \\ R_{203} \end{array} \quad (A1)$$

-continued

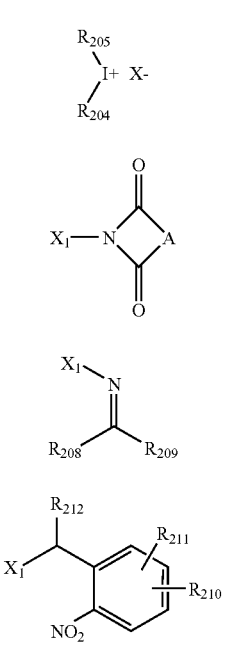

In formulae (A1) and (A2) each, X⁻ represents a sulfonic acid anion formed by removing a hydrogen atom from —SO₃H of the sulfonic acid of formula (3) or (3').

In formulae (A3) to (A5), X₁ represents a univalent group formed by removing a hydrogen atom from —SO₃H of the sulfonic acid of formula (3) or (3').

The other groups are the same as those in the formulae (A1) to (A5) representing the compounds capable of generating sulfonic acids represented by formula (2) upon irradiation with actinic rays or radiation.

Of the compounds represented by formulae (A1) to (A5), the compounds represented by formula (A1) are preferred, and the compounds represented by formulae (A1a) to (A1c) are far preferred.

Suitable examples of compounds capable of generating acids represented by formula (3) and (3'), respectively, upon irradiation with actinic rays or radiation are illustrated below, but these examples should not be construed as limiting the scope of the invention.

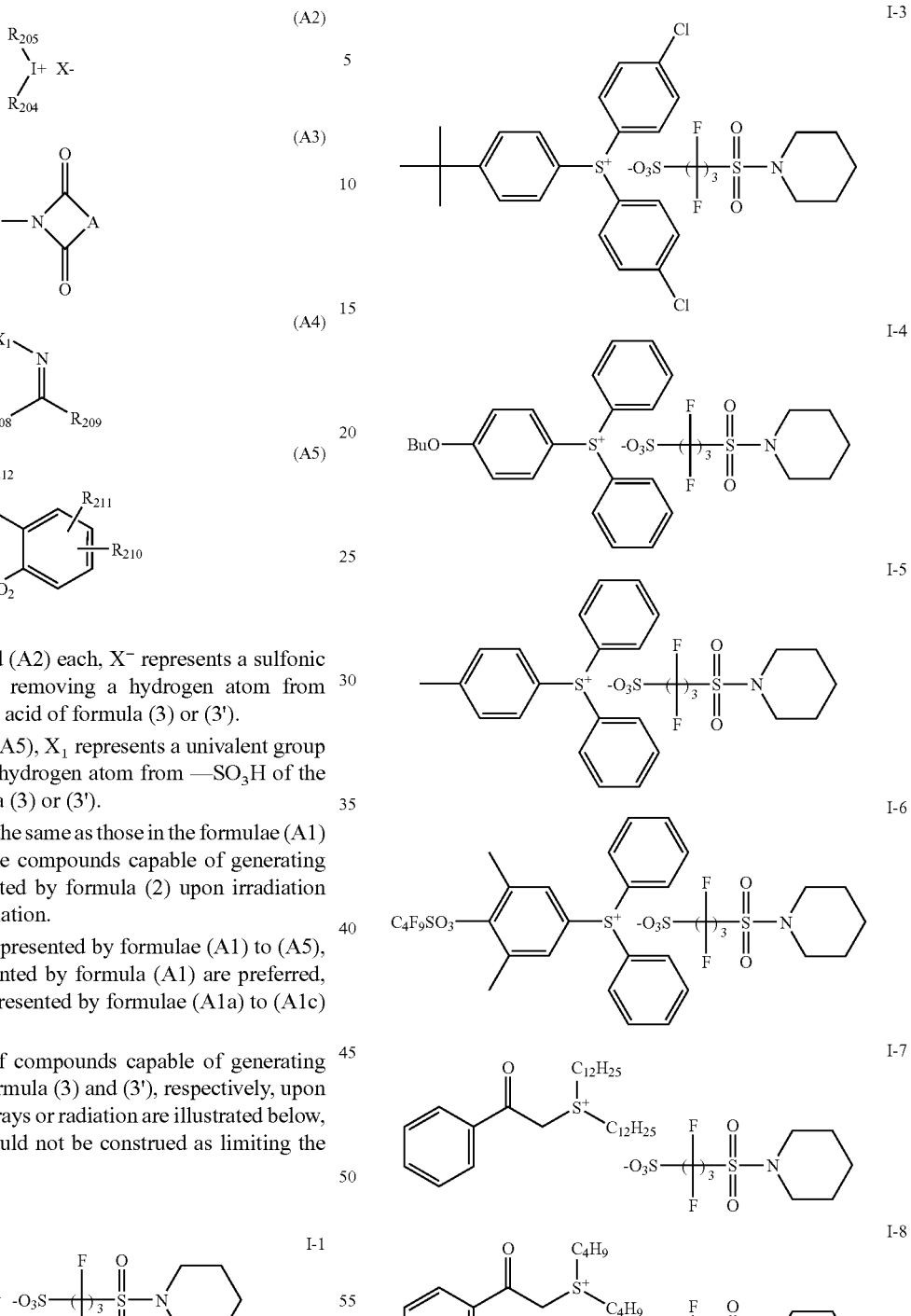

-continued
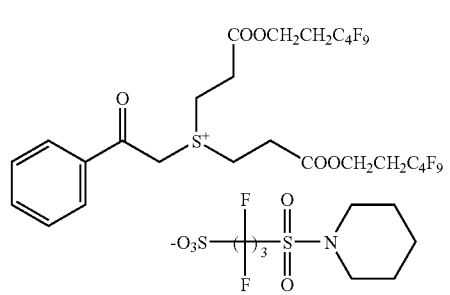
I-10
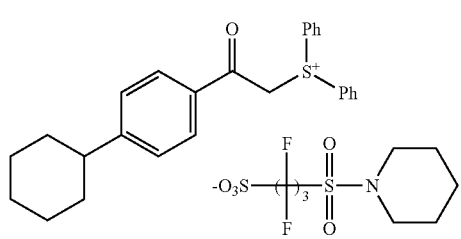
I-11
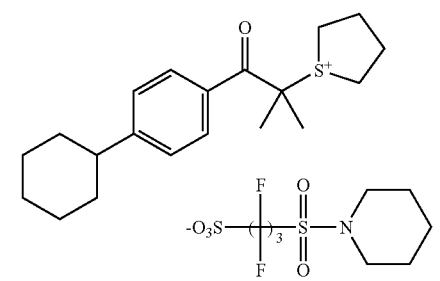
I-12
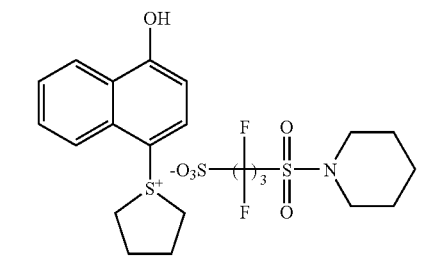
I-13
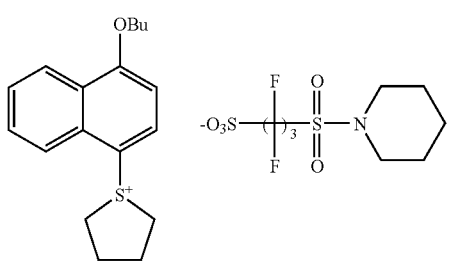
I-14
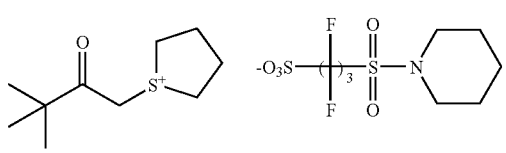
I-15
-continued
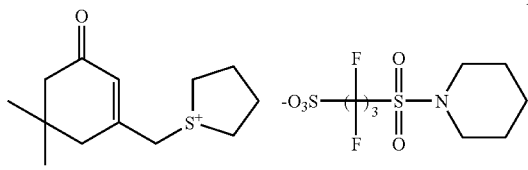
I-16
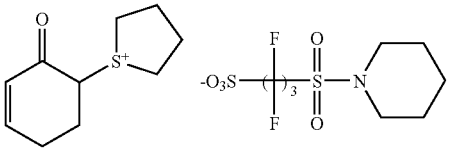
I-17
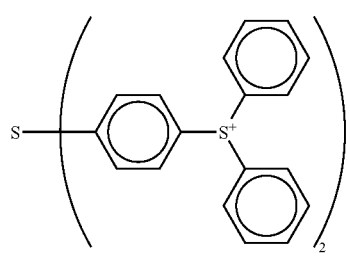
I-18
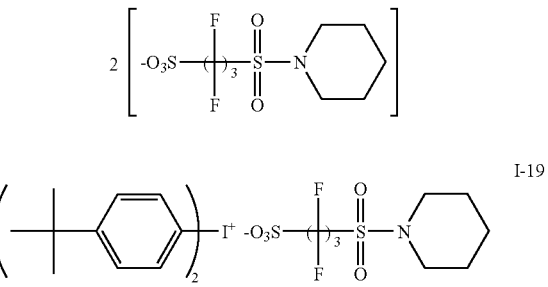
I-19
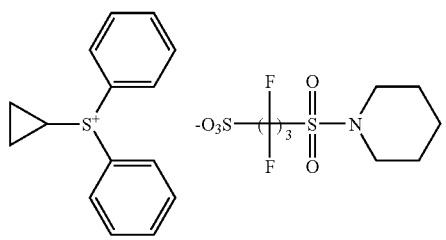
I-20
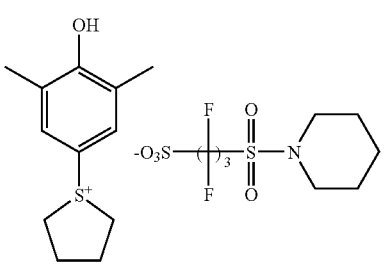
I-21

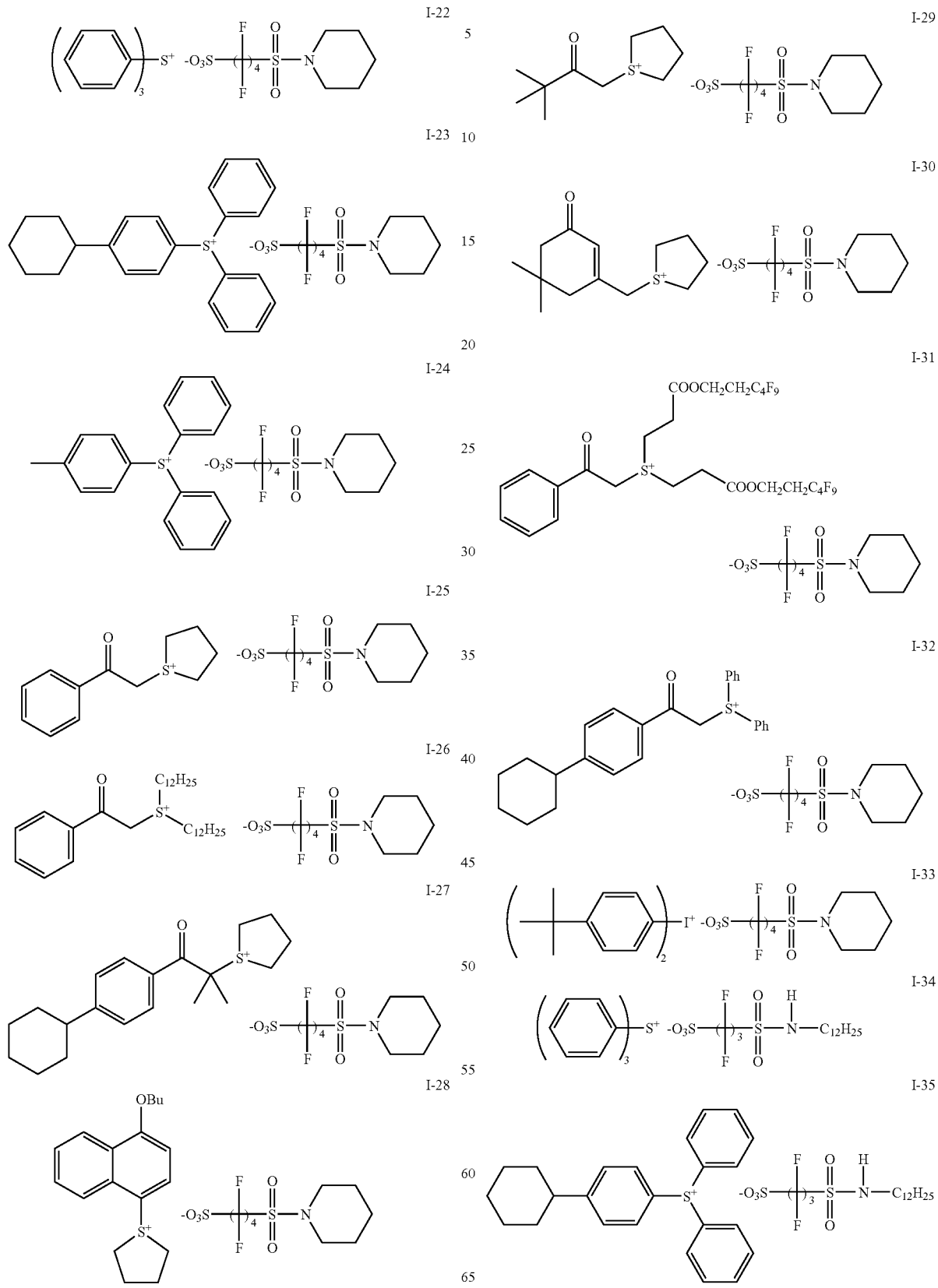

-continued

-continued

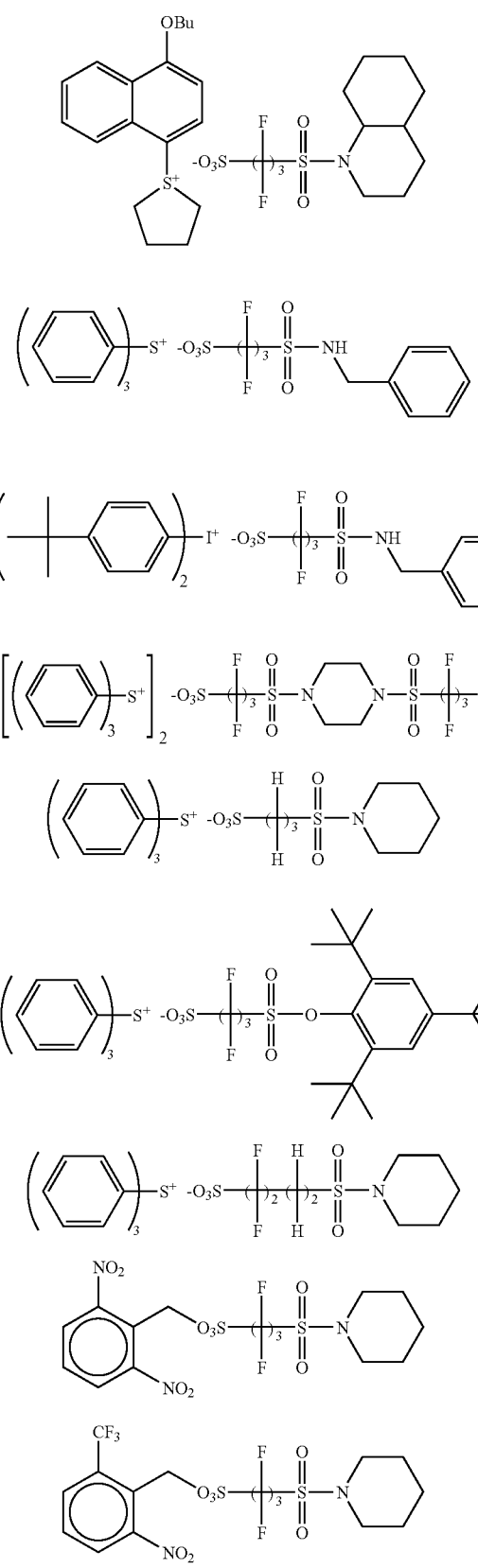

I-80
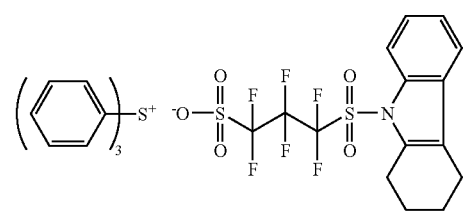

I-81
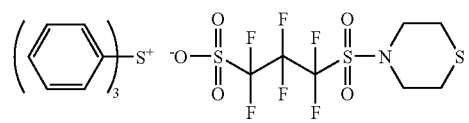

I-82
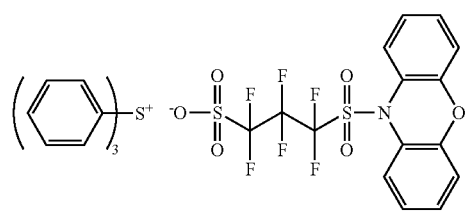

I-83
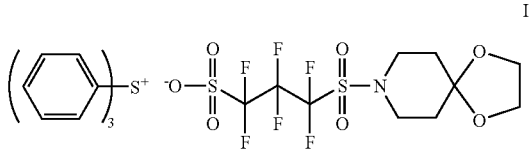

I-84
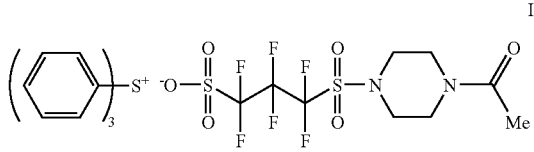

I-85
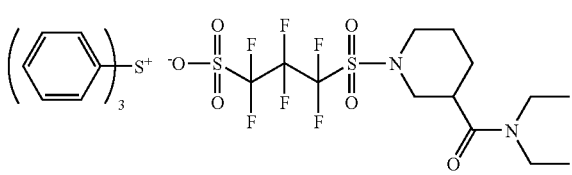

I-86
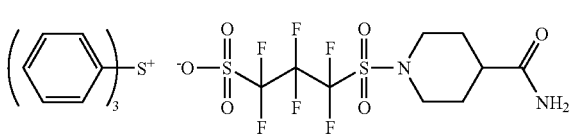

I-87
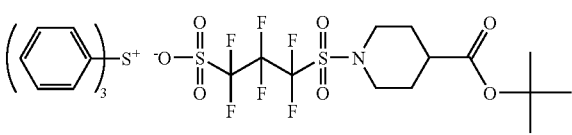

I-88
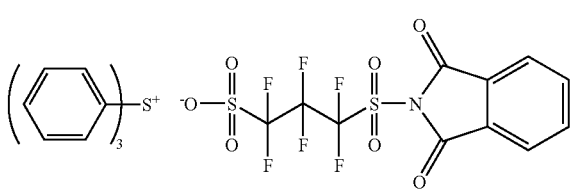

I-89
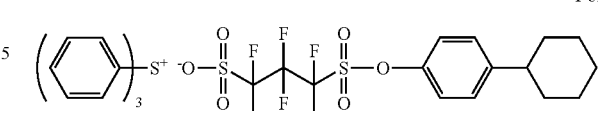

I-90
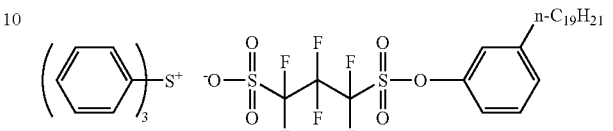

I-91
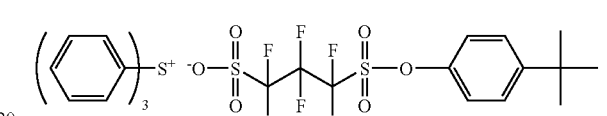

I-92
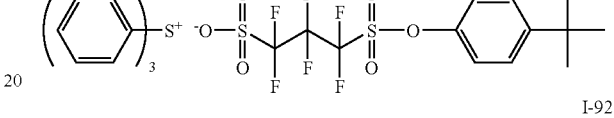

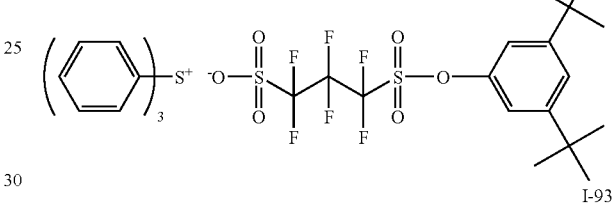

I-93
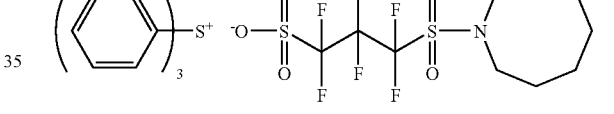

The sulfonic acids represented by formula (3) and (3') or salts thereof (e.g., onium salts, metal salts) can be synthesized using general sulfonic acid esterification or sulfonamidation reaction. For instance, such sulfonic acids can be obtained by using a method of selectively allowing one sulfonyl halide moiety of a bissulfonyl halide compound to react with an amine, alcohol or amide compound, thereby forming a sulfonamide linkage, a sulfonate linkage or a sulfonimide linkage, and then hydrolyzing the other sulfonyl halide moiety, or a method of allowing a cyclic sulfonic anhydride to undergo ring-opening reaction with an amine, alcohol or amide compound.

The salts of the sulfonic acid of formula (3) or (3') are metal or onium sulfonates. The metals in the metal sulfonates include $Na^+$, $Li^+$ and $K^+$. The onium cations in the onium sulfonates include an ammonium cation, a sulfonium cation, an iodonium cation, a phosphonium cation and a diazonium cation. The sulfonic acid of formula (3) or (3') or the salts thereof can be used for the synthesis of compounds capable of generating the sulfonic acids of formula (3) and (3') upon irradiation with actinic rays or radiation.

Compounds capable of generating the sulfonic acids of formula (3) and (3') upon irradiation with actinic rays or radiation can be synthesized using a method of subjecting the sulfonic acids of formula (3) and (3') to salt interchange with photoactivatable onium salts, such as sulfonium salts or iodonium salts, or a method of forming esters from the sulfonic acids of formula (3) and (3') and nitrobenzyl alcohol, N-hydroxylimide or oxime compounds.

(B3): Compound Capable of Generating Anion Represented by Formula (4) or (5) Upon Irradiation with Actinic Ray or Radiation

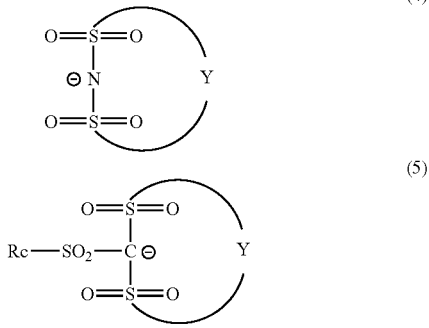

In formulae (4) and (5), Y is an alkylene group substituted with at least one fluorine atom, preferably a 2-4C alkylene group substituted with at least one fluorine atom. Herein, the alkylene chain may contain an oxygen atom. Y is far preferably a 2-4C perfluoroalkylene group, particularly preferably a tetrafluoroethylene group, a hexafluoropropylene group or a octafluorobutylene group.

Rc in formula (5) represents an alkyl group or a cycloalkyl group. Additionally, the alkylene chain in the alkyl or cycloalkyl group may contain an oxygen atom.

The alkyl group as Rc is preferably a fluoroalkyl group, far preferably a 1-4C perfluoroalkyl group, such as trifluoromethyl group, a pentafluoroethyl group, a heptafluoropropyl group, a nonafluorobutyl group or a perfluoroethoxyethyl group.

The cycloalkyl group as Rc is preferably a cycloalkyl group (preferably containing 3 to 6 carbon atoms, such as a cyclopentyl group or a cyclohexyl group) substituted with a fluorine atom.

The compounds capable of generating the sulfonic acid of formula (4) or (5) upon irradiation with actinic rays or radiation are preferably compounds represented by the following formula (I-a) or (I-b), far preferably compounds represented by formula (I-a).

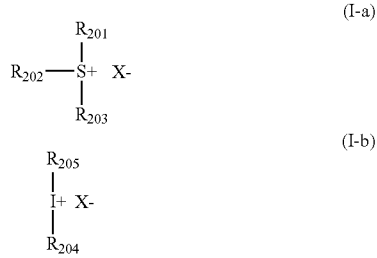

In formulae (I-a) and (I-b), X⁻ represents an anion represented by formula (4) or (5).

In formula (I-a), $R_{201}$, $R_{202}$ and $R_{203}$ each represent an organic group independently.

The number of carbon atoms in the organic group as $R_{201}$, $R_{202}$ and $R_{203}$ each is generally from 1 to 30, preferably from 1 to 20.

Further, any two of $R_{201}$ to $R_{203}$ may combine with each other to form a ring, and in the ring may be contained an oxygen atom, a sulfur atom, an ester linkage, an amide linkage or a carbonyl group.

Examples of a group formed by combining any two of $R_{201}$ to $R_{203}$ include alkylene groups (e.g., a butylene group, a pentylene group).

Examples of organic groups as $R_{201}$, $R_{202}$ and $R_{203}$ include the corresponding groups in compounds (I-a1), (I-a2) and (I-a3) illustrated hereinafter.

Additionally, the compound of formula (I-a) may be a compound containing two or more of structures represented by formula (I-a). For instance, the compound of formula (I-a) may be a compound having a structure formed by combining at least one of $R_{201}$, $R_{202}$ and $R_{203}$ in one compound represented by formula (I-a) with at least one of $R_{201}$, $R_{202}$ and $R_{203}$ in another compound represented by formula (I-a).

Examples of a compound more suitable as the component (I-a) include compounds (I-a1), (I-a2) and (I-a3) illustrated below.

The compound (I-a1) is an arylsulfonium compound represented by the foregoing formula (I-a) in which at least one of $R_{201}$ to $R_{203}$ is an aryl group, namely a compound having an arylsulfonium as its cation.

In the arylsulfonium compound, all of $R_{201}$ to $R_{203}$ may be aryl groups, or one or two of $R_{201}$ to $R_{203}$ may be aryl groups and the remainder may be an alkyl group.

Examples of such an arylsulfonium compound include a triarylsulfonium compound, a diarylalkylsulfonium compound and an aryldialkylsulfonium compound.

The aryl group in the arylsulfonium compound is preferably a phenyl group or a naphthyl group, far preferably a phenyl group. When the arylsulfonium compound has two or more aryl groups, the two or more aryl groups may be the same or different.

Alkyl groups or cycloalkyl groups present in the diarylalkylsulfonium compound and the aryldialkylsulfonium compound are preferably 1-15 linear or branched alkyl groups or 3-15C cycloalkyl groups, respectively, with examples including a methyl group, an ethyl group, a propyl group, an n-butyl group, a sec-butyl group, a t-butyl group, a cyclopropyl group, a cyclobutyl group and a cyclohexyl group. In point of storage stability, it is preferable that two alkyl groups in the aryldialkylsulfonium compound combine with each other to form a ring.

The aryl group, the alkyl group or the cycloalkyl group represented by any of $R_{201}$ to $R_{203}$ may have as a substituent an alkyl group (containing, e.g., 1 to 15 carbon atoms), a cycloalkyl group (containing, e.g., 3 to 15 carbon atoms), an aryl group (containing, e.g., 6 to 14 carbon atoms), an alkoxy group (containing, e.g., 1 to 15 carbon atoms), a carboxyl group, a halogen atom, a hydroxyl group or a phenylthio group. Suitable examples of such substituents include 1-12C linear or branched alkyl groups, 3-15C cycloalkyl groups and 1-12C linear, branched or cyclic alkoxy groups. Of these substituents, 1-4C alkyl groups and 1-4C alkoxy groups are preferred over the others. Any one of $R_{201}$ to $R_{203}$ may have such a substituent, or all of $R_{201}$ to $R_{203}$ may have such substituents. When $R_{201}$ to $R_{203}$ are aryl groups, it is preferable that each substituent is situated in the p-position of each aryl group.

As to the compound (I-a1), triphenylsulfonium salts corresponding to cases where all of $R_{201}$ to $R_{203}$ are phenyl groups are preferred, and triphenylsulfonium salts corresponding to cases where at least one of phenyl groups of $R_{201}$ to $R_{203}$ is substituted with at least either an alkyl or cycloalkyl group are far preferred. The alkyl or cycloalkyl group as the substituent of the phenyl group is a 1-12C linear or branched alkyl group or a 3-12C cycloalkyl group, respectively, and they are preferably a 1-6C linear or branched alkyl group or a 3-6C cycloalkyl group, respectively. By having such substituents, development of particles at the time of solution storage can be reduced. Examples of alkyl and cycloalkyl groups as substituents of the phenyl groups include a methyl group, an ethyl group, a propyl group, a butyl group, a t-butyl group, a hexyl group and a cyclohexyl group. Of these groups, a methyl group, a t-butyl group and a cyclohexyl group are preferred over the others.

Next, the compound (I-a2) is described.

The compound (I-a2) is a compound represented by formula (I-a) wherein $R_{201}$ to $R_{203}$ each independently represent an organic group having no aromatic ring. The term "aromatic ring" as used herein is intended to also include aromatic rings containing hetero atoms.

The number of carbon atoms in an organic group having no aromatic ring, which is represented by $R_{201}$ to $R_{203}$ each, is generally from 1 to 30, preferably from 1 to 20.

Suitable examples of an organic group that $R_{201}$ to $R_{203}$ each represent independently include an alkyl group (including substituted alkyl groups, notably a linear, branched or cyclic oxoalkyl group which may contain a double bond in the chain, and an alkoxycarbonyl methyl group), a cycloalkyl group, an allyl group and a vinyl group, preferably a linear, branched or cyclic 2-oxoalkyl group, a linear, branched or cyclic $\alpha,\beta$-unsaturated 2-oxoalkyl group and a linear, branched or cyclic 2,3-unsaturated 4-oxoalkyl group, particularly preferably a linear or branched 2-oxoalkyl group.

The alkyl group as each of $R_{201}$ to $R_{203}$ may be linear or branched, and it is preferably a 1-20C linear or branched alkyl group (e.g., a methyl group, an ethyl group, a propyl group, a butyl group, a pentyl group).

The cycloalkyl group as each of $R_{201}$ to $R_{203}$ is preferably a 3-10C cycloalkyl group, such as a cyclopentyl group, a cyclohexyl group or a norbornyl group.

The oxoalkyl group as each of $R_{201}$ to $R_{203}$ may be linear, branched or cyclic, and it is preferably a group having >C=O at the 2- or 4-position of the alkyl or cycloalkyl group as recited above. Further, the oxoalkyl group may have a double bond in the alkyl chain, and it is preferable that this double bond and the carbonyl group are conjugated to form an $\alpha,\beta$-unsaturated ketone structure.

The alkyl moiety in the alkoxycarbonylmethyl group as each of $R_{201}$ to $R_{203}$ is preferably a 1-5C alkyl group (such as a methyl, ethyl, propyl, butyl or pentyl group).

Each of $R_{201}$ to $R_{203}$ may further be substituted with a halogen atom, an alkoxy group (containing, e.g., 1 to 5 carbon atoms), a hydroxyl group, a cyano group or a nitro group.

Any two of $R_{201}$ to $R_{203}$ may combine with each other to form a ring structure, and in the ring structure formed may be contained an oxygen atom, a sulfur atom, an ester linkage, an amide linkage or a carbonyl group. Examples of a group formed by combining any two of $R_{201}$ to $R_{203}$ include alkylene groups (such as a butylene group and a pentylene group).

The compound (I-a3) is a compound represented by the following formula (I-a3), namely a compound having an arylacylsulfonium salt structure.

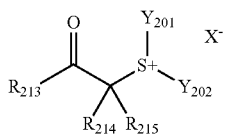

(I-a3)

In formula (I-a3), $R_{213}$ represents an aryl group, preferably a phenyl group or a naphthyl group, far preferably a phenyl group.

Suitable examples of a substituent on $R_{213}$ include an alkyl group (preferably containing 1 to 15 carbon atoms), a cycloalkyl group (preferably containing 3 to 15 carbon atoms), an alkoxy group (preferably containing 1 to 12 carbon atoms), an acyl group (preferably containing 2 to 13 carbon atoms), a nitro group, a hydroxyl group, an alkoxycarbonyl group (preferably containing 2 to 13 carbon atoms) and a carboxyl group.

$R_{214}$ and $R_{215}$ each represent a hydrogen atom, an alkyl group or a cycloalkyl group.

$Y_{201}$ and $Y_{202}$ each independently represent an alkyl group (including substituted group), a cycloalkyl group, an aryl group or a vinyl group. alkyl groups, notably a 2-oxoalkyl group, an alkoxycarbonylalkyl group and a carboxyalkyl $R_{213}$ and $R_{214}$, $R_{214}$ and $R_{215}$, or $Y_{201}$ and $Y_{202}$ may combine with each other to form a ring structure in which an oxygen atom, a sulfur atom, an ester linkage or an amide linkage may be contained.

The alkyl group as $Y_{201}$ and $Y_{202}$ each is preferably a 1-20C linear or branched alkyl group, and the cycloalkyl group is preferably a 3-20C cycloalkyl group.

The 2-oxoalkyl group can include groups which are the same alkyl groups as $Y_{201}$, and $Y_{202}$ may represent, except that they have >C=O at their respective 2-positions.

The alkoxycarbonyl moiety in the alkoxycarbonylalkyl group is preferably a 2-20C alkoxycarbonyl group, which may be substituted with a fluorine atom, an alkoxy group or a hydroxyl group.

The carboxyalkyl group includes groups formed by substituting carboxyl groups for hydrogen atoms of the alkyl groups as recited above.

The aryl group is preferably a phenyl group or a naphthyl group, far preferably a phenyl group.

The group formed by combining $Y_{201}$ and $Y_{202}$ can include a butylene group and a pentylene group.

Each of $Y_{201}$ and $Y_{202}$ is preferably an alkyl group containing 4 or more carbon atoms, far preferably an alkyl group containing 4 to 16 carbon atoms, further preferably an alkyl group containing 4 to 12 carbon atoms.

In addition, it is preferable that at least either $R_{214}$ or $R_{215}$ is an alkyl group, and it is far preferable that both $R_{214}$ and $R_{215}$ are alkyl groups. By designing at least either $R_{214}$ or $R_{215}$ as an alkyl group, the photodecomposability is enhanced, and the sensitivity is increased.

In formula (I-b), $R_{204}$ and $R_{205}$ each represents an aryl group, an alkyl group or a cycloalkyl group independently.

The aryl group as $R_{204}$ and $R_{205}$ each is preferably a phenyl group or a naphthyl group, far preferably a phenyl group.

The alkyl group as $R_{204}$ and $R_{205}$ each may be either linear or branched, and it is preferably a 1-10C linear or branched alkyl group (such as a methyl, ethyl, propyl, butyl or pentyl group).

The cycloalkyl group as $R_{204}$ and $R_{205}$ each may be a 3-10C cycloalkyl group (such as a cyclopentyl, cyclohexyl or norbornyl group).

Examples of a substituent that $R_{204}$ and $R_{205}$ each may have include an alkyl group (containing, e.g., 1 to 15 carbon atoms), an aryl group (containing, e.g., 6 to 15 carbon atoms), an alkoxy group (containing, e.g., 1 to 15 carbon atoms), a halogen atom, a hydroxyl group and a phenylthio group.

Examples of a compound capable of generating the acid of formula (4) or (5) are illustrated below, but these examples should not be construed as limiting the scope of the invention.

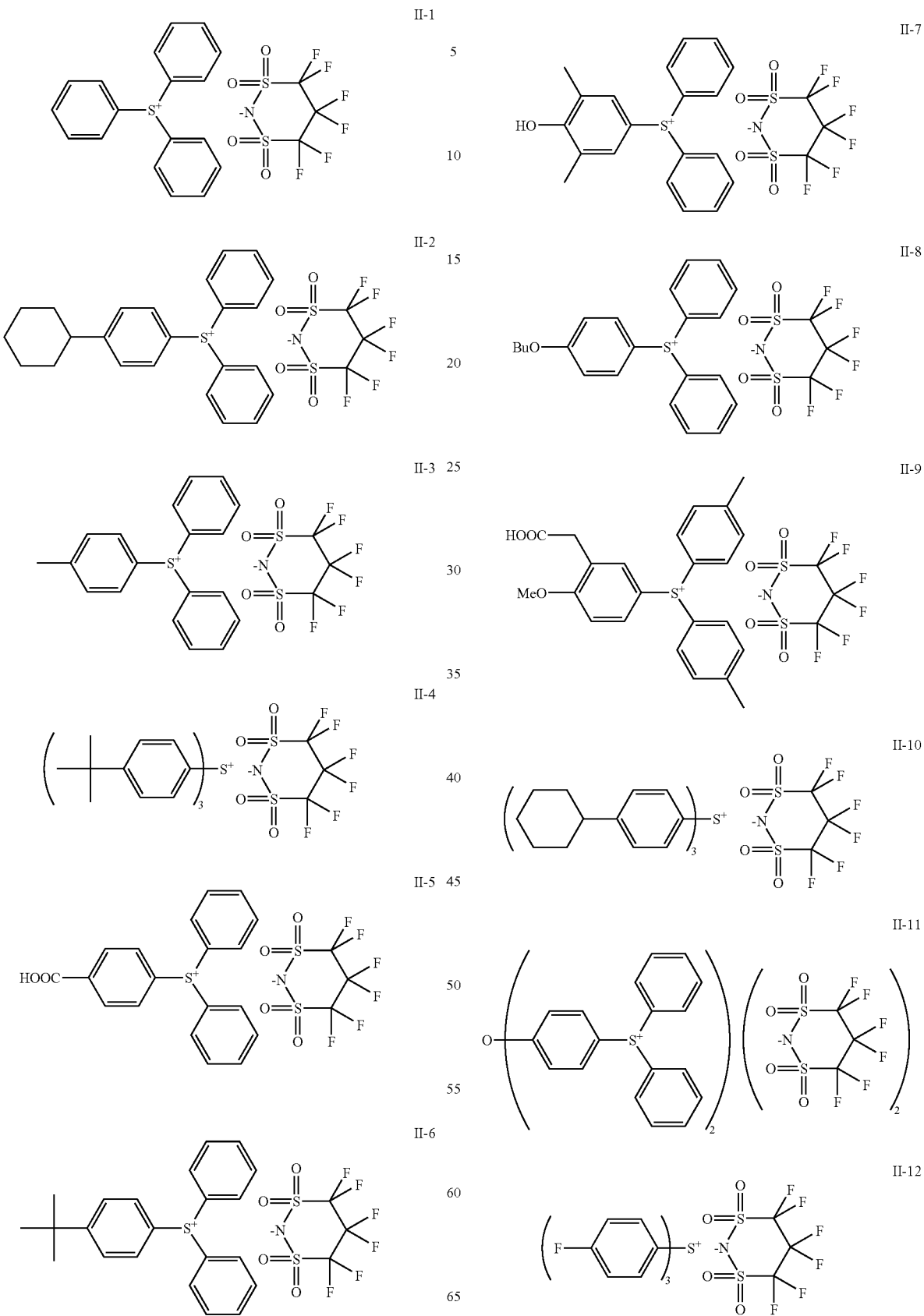

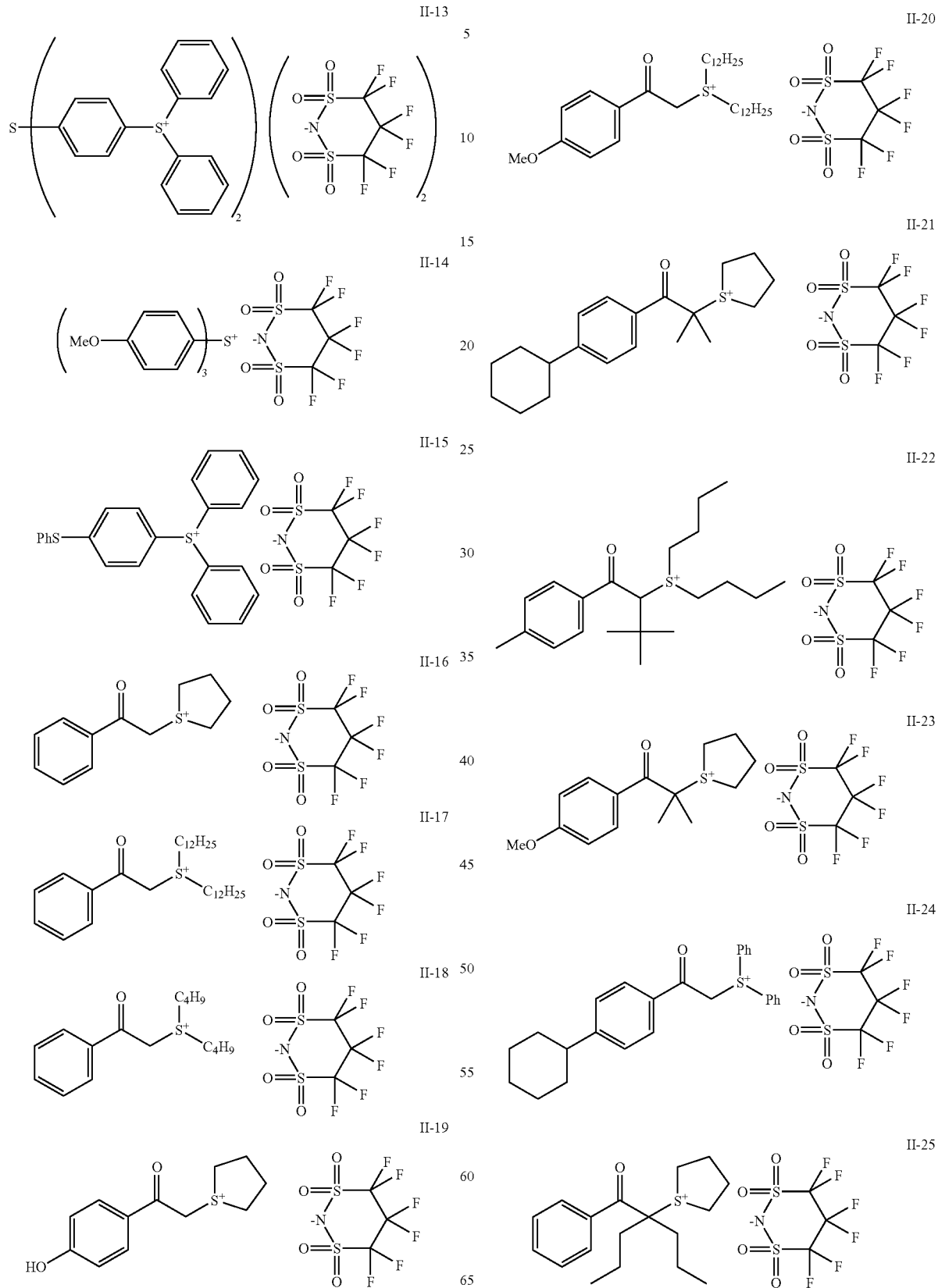

-continued

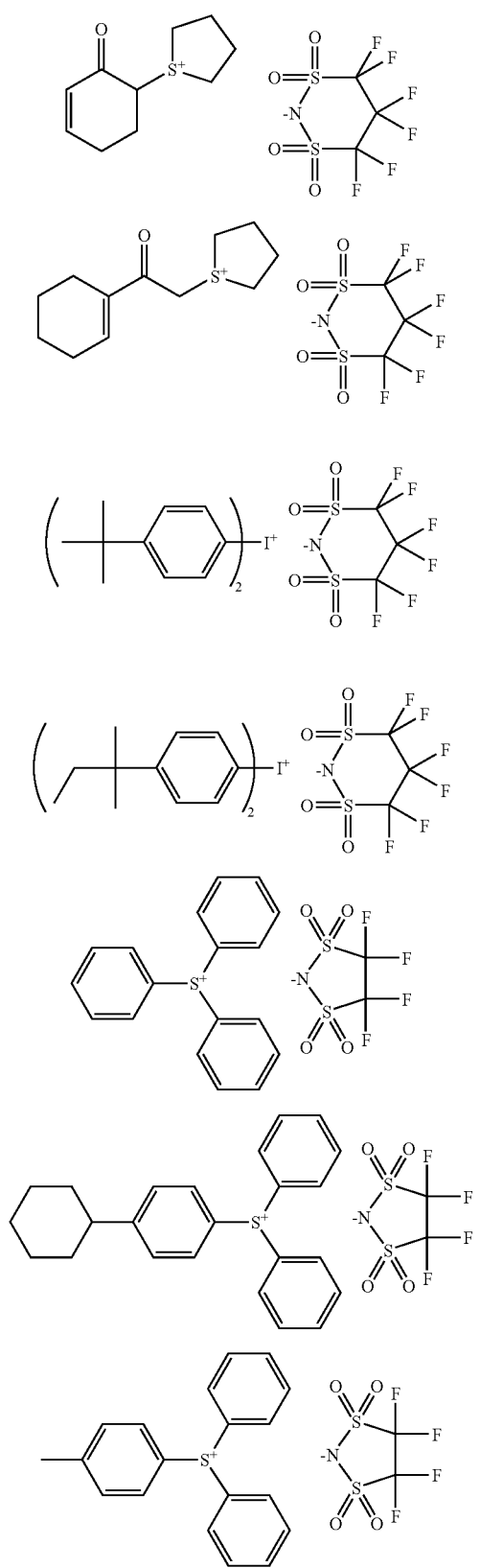

-continued

-continued
II-65
II-66
II-67
II-68
II-69
II-70
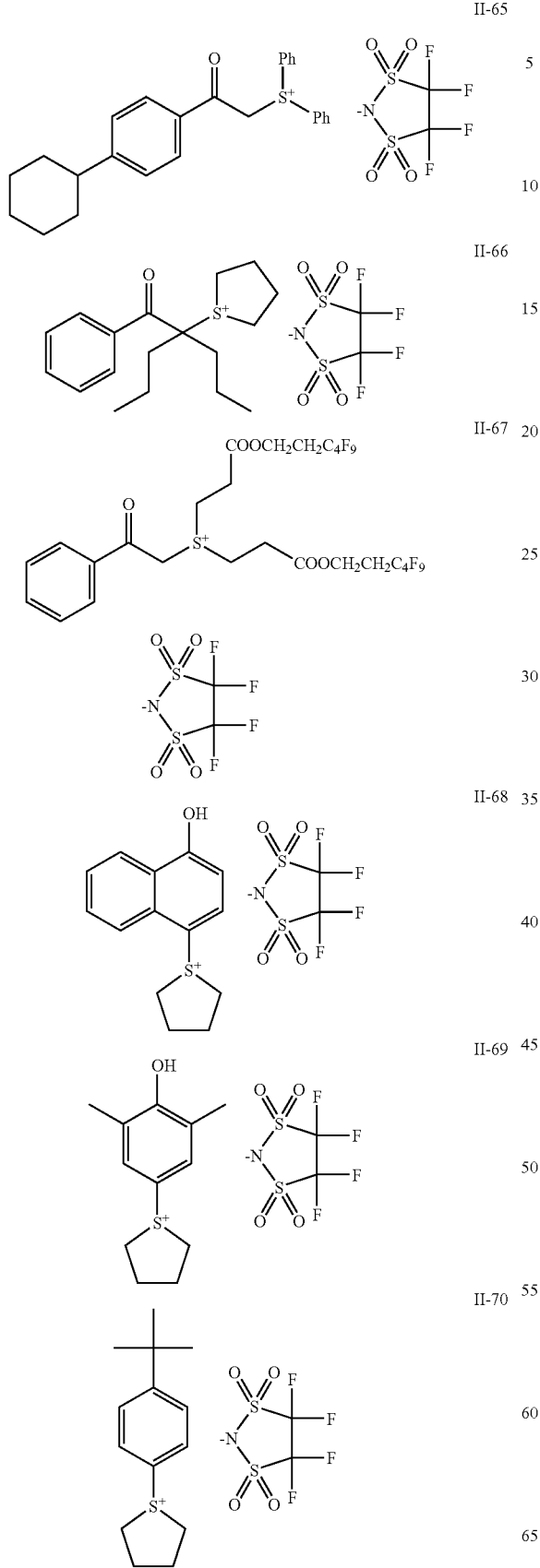
-continued
II-71
II-72
II-73
II-74
II-75
II-76
II-77
II-78
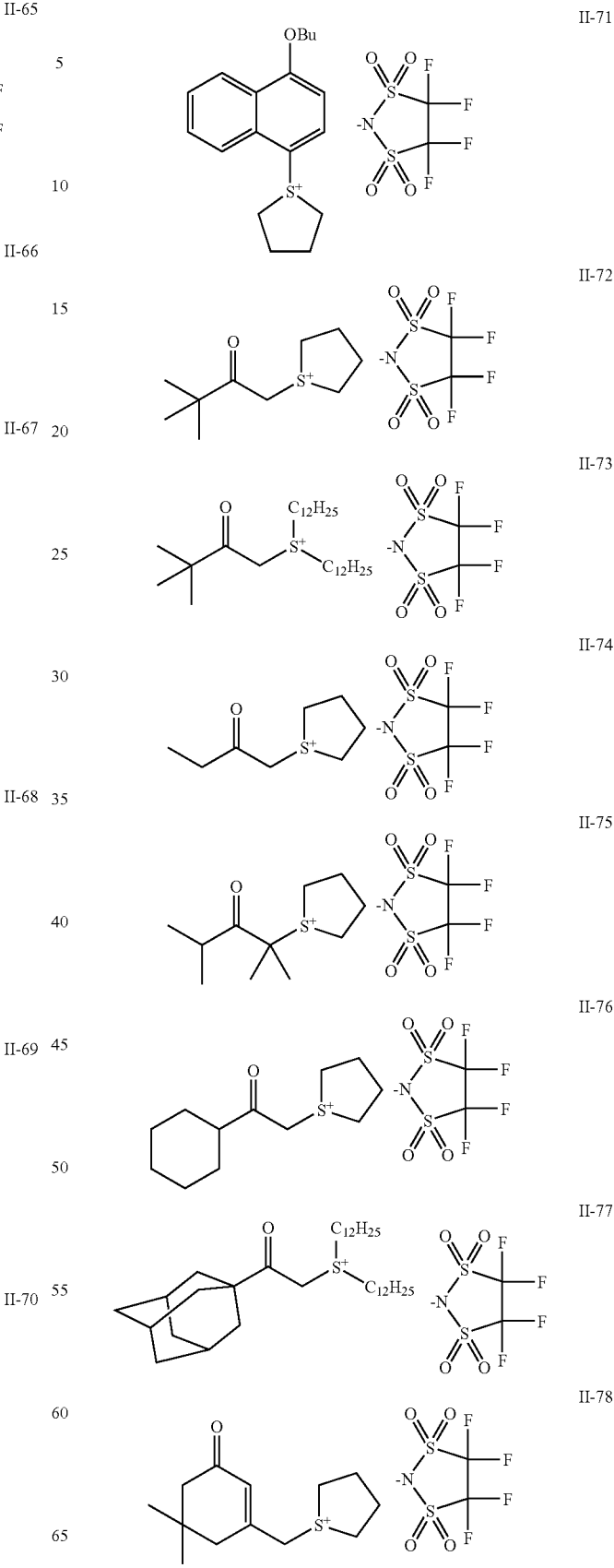

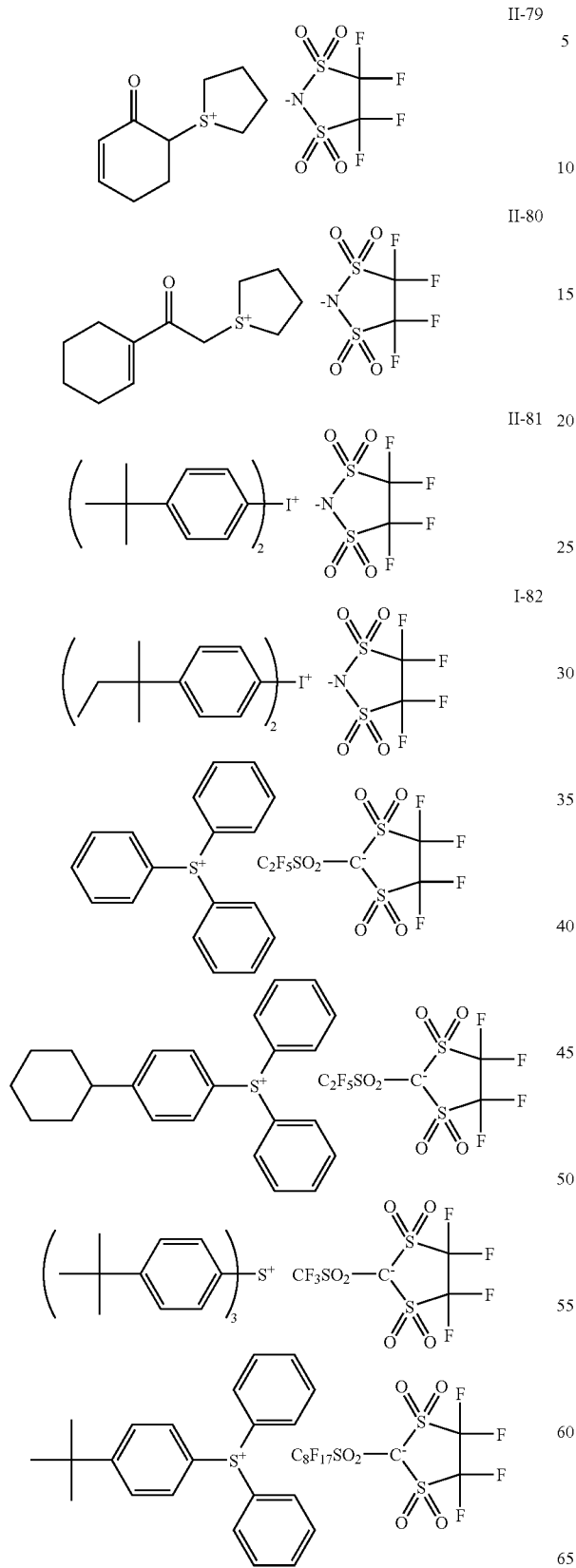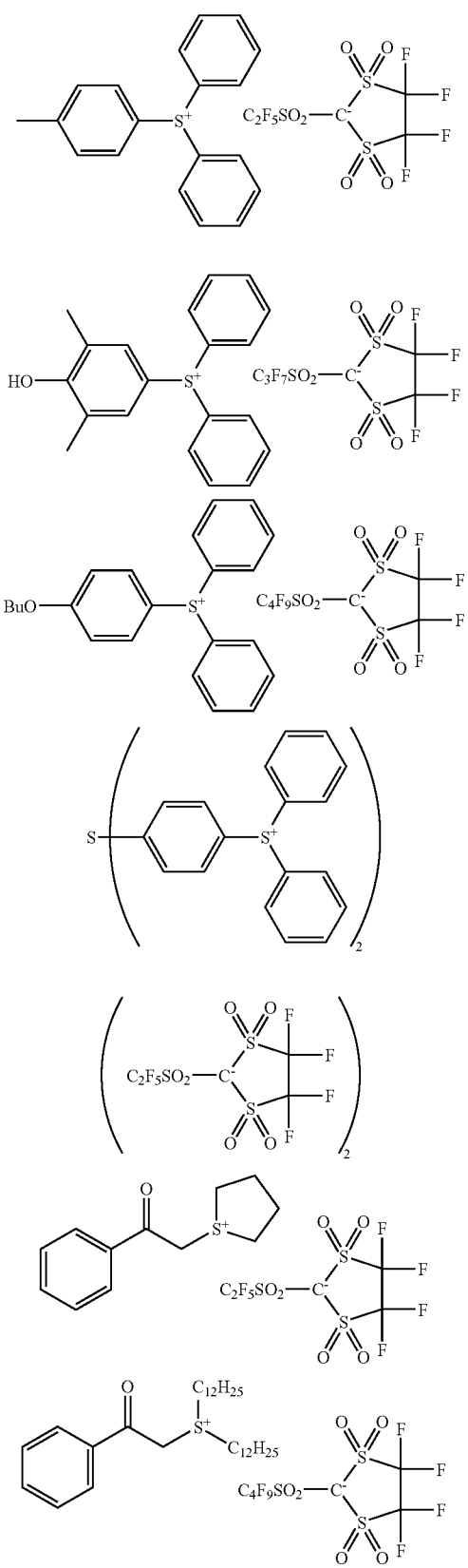

-continued
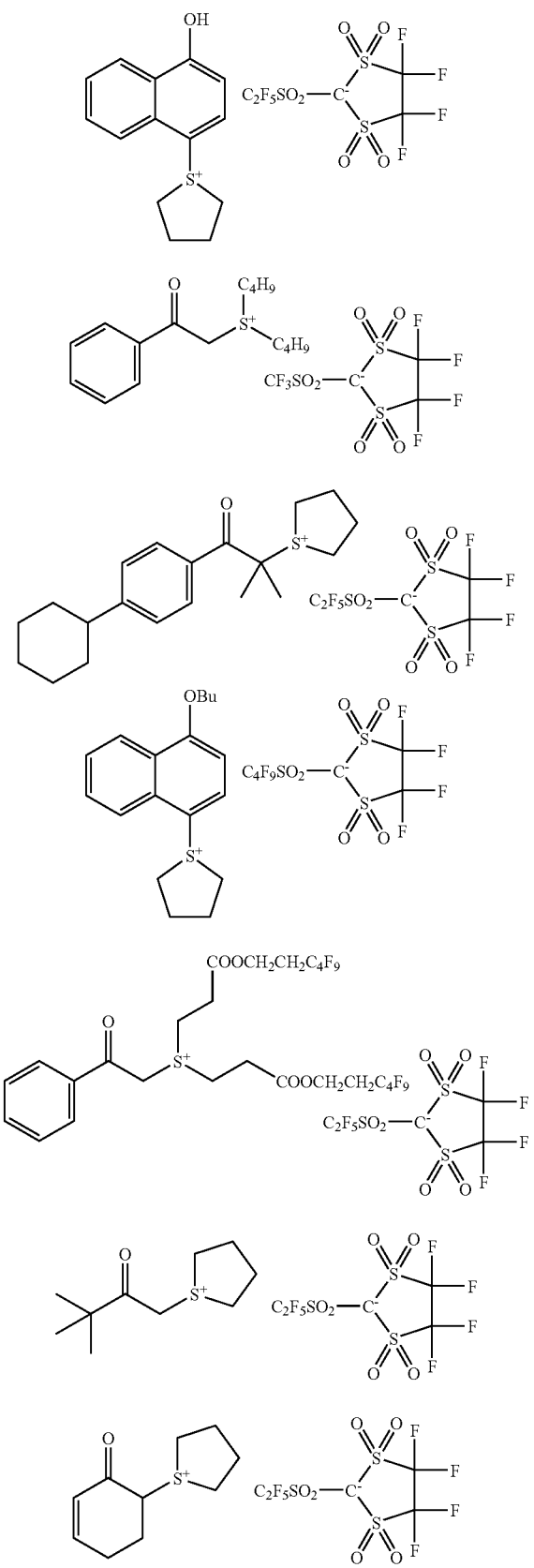
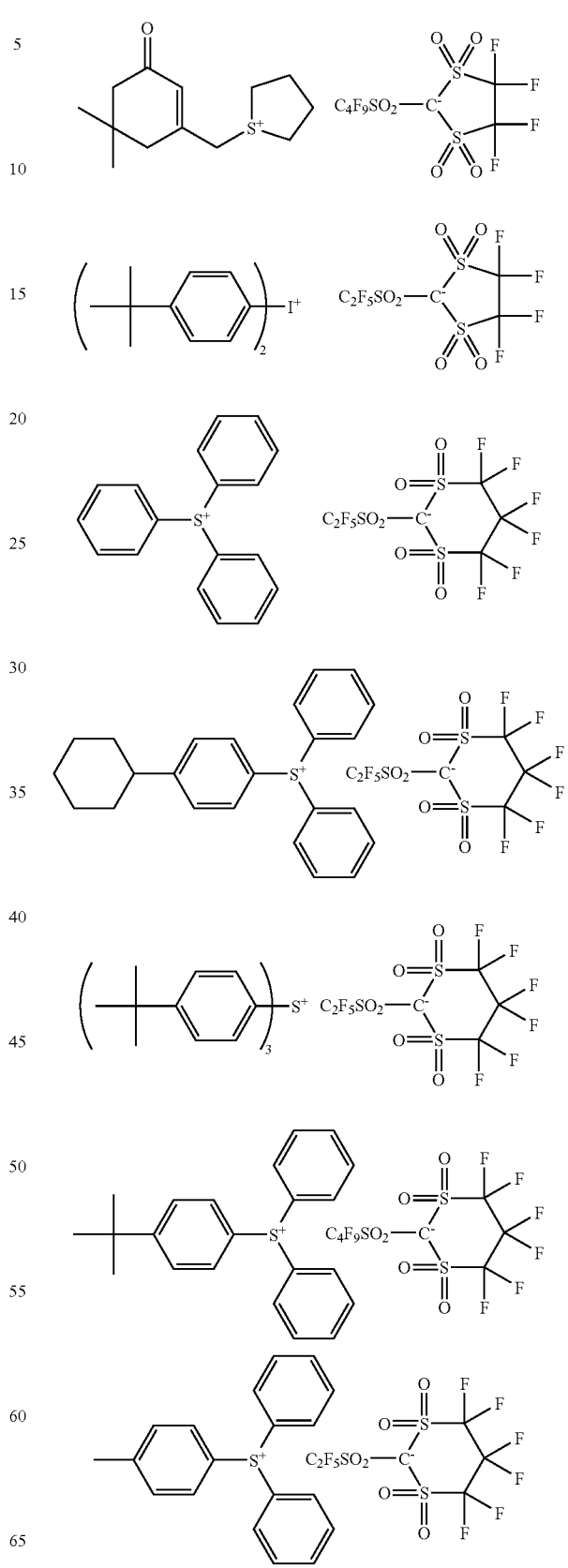

-continued
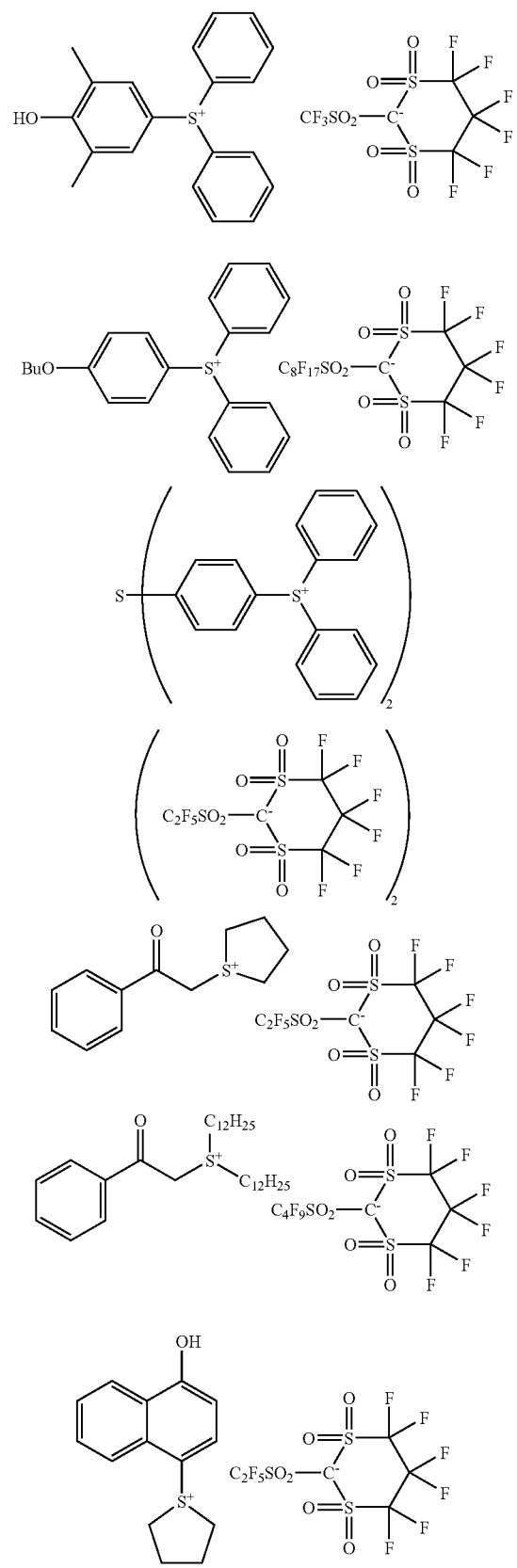
-continued
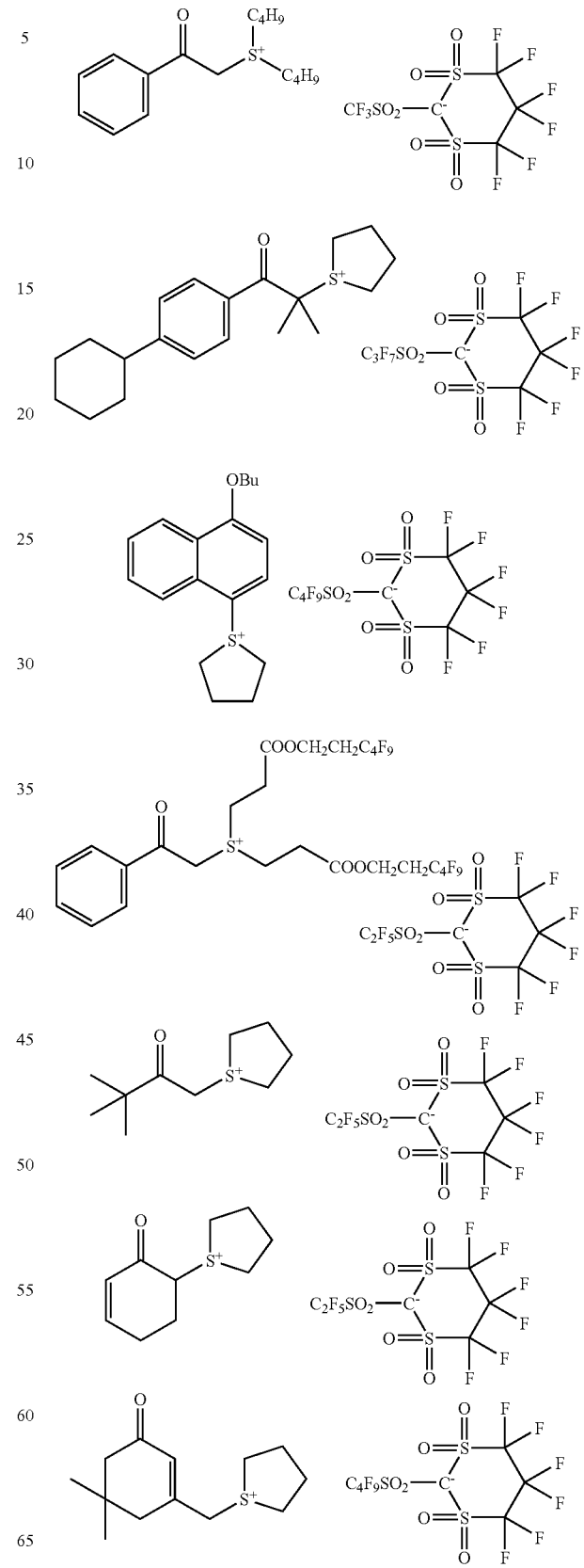

-continued

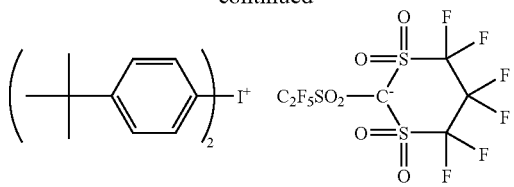

Sulfonium or iodonium salts having anions represented by formula (4) or (5) can by synthesized by causing salt interchange between metal or ammonium salts of anions represented by formula (4) or (5) and sulfonium or iodonium salt compounds (such as halide, acetate, tetrafluoroborate and perchlorate).

The total addition amount of compounds capable of generating organic acids represented by formula (2), (3), (3'), (4) or (5) upon irradiation with actinic rays or radiation is preferably from 0.1 to 20 mass %, far preferably from 0.5 to 10 mass %, further preferably from 1 to 7 mass % based on the total solids in the photosensitive composition.

[4] Acid Generators Usable in Combination with Compound (B)

In combination with Compound (B) capable of generating the organic acid specified by the invention upon irradiation with actinic rays or radiation, compounds capable of decomposing upon irradiation with actinic rays or radiation to generate acids (photo-acid generators) may further be used.

The ratio of the amount by mole of Compound B used to the amount by mole of photo-acid generators used in combination with Compound B (Compound (B)/other photo-acid generators ratio by mole) is generally from 100/0 to 20/80, preferably from 100/0 to 40/60, far preferably from 100/0 to 50/50.

Photo-acid generators usable in combination with the present Compound (B) can be appropriately selected from photo-initiators for cationic photopolymerization, photo-initiators for radical photopolymerization, photodecoloring agents for dyes, photodiscoloring agents, compounds used in microresist and known to generate acids by irradiation with actinic rays or radiation, and mixtures of two or more thereof. Examples of such compounds include diazonium salts, phosphonium salts, sulfonium salts, iodonium salts, imide sulfonates, oxime sulfonates, diazodisulfone, disulfone and o-nitrobenzylsulfonate.

In addition, polymeric compounds into whose main or side chains those groups or compounds capable of generating acids upon irradiation with actinic rays or radiation are introduced can also be used. Examples of such polymeric compounds include the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 136,712 can be used.

Of the compounds capable of decomposing upon irradiation with actinic rays or radiation to generate acids and usable in combination with Compound (B), compounds represented by the following formulae (ZI), (ZII) and (ZIII) respectively are preferable.

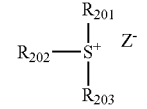

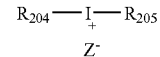

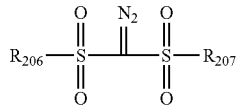

In the above formula (ZI), $R_{201}$, $R_{202}$ and $R_{203}$ each represent an organic group independently.

The number of carbon atoms in the organic group of $R_{201}$, $R_{202}$ and $R_{203}$ each is generally from 1 to 30, preferably from 1 to 20.

In addition: two of $R_{201}$, $R_{202}$ and $R_{203}$ may be combined with each other to form a ring structure, and the ring formed may contain an oxygen atom, a sulfur atom, an ester linkage, an amide linkage or a carbonyl group.

Examples of a group formed by combining two of $R_{201}$, $R_{202}$ and $R_{203}$ include alkylene groups (such as a butylene group and a pentylene group).

$Z^-$ represents a non-nucleophilic anion.

Examples of the non-nucleophilic anion as $Z^-$ include a sulfonic acid anion, a carboxylic acid anion, a sulfonylimide anion, a bis(alkylsulfonyl)imide anion and a tris(alkylsulfonyl)methide anion.

The term "a non-nucleophilic anion" is defined as an anion that has significantly low ability to cause nucleophilic reaction, and so that can inhibit aging decomposition by intramolecular nucleophilic reaction. By containing such an anion, the storage stability of resist can be enhanced.

Examples of a sulfonic acid anion include alkylsulfonic acid anions, arylsulfonic acid anions and camphorsulfonic acid anions.

Examples of a carboxylic acid anion include alkylcarboxylic acid anions, arylcarboxylic acid anions and aralkylcarboxylic acid anions.

The alkyl moiety of an alkylsulfonic acid anion may be either an alkyl group or a cycloalkyl group, and suitable examples thereof include 1-30C alkyl groups and 3-30C cycloalkyl groups such as a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

Suitable examples of the aryl moiety of an arylsulfonic acid anion include 6-14C aryl groups, such as a phenyl group, a tolyl group and a naphthyl group.

The alkyl or cycloalkyl moiety of the alkylsulfonic acid anion and the aryl moiety of the arylsulfonic acid anion may have substituents. Examples of such substituents include a nitro group, a halogen atom (including a fluorine atom, a chlorine atom, a bromine atom and an iodine atom), a carboxyl group, a hydroxyl group, an amino group, a cyano group, an alkoxy group (preferably containing 1 to 5 carbon atoms), a cycloalkyl group (preferably containing 3 to 15 carbon atoms), an aryl group (preferably containing 6 to 14 carbon atoms), an alkoxycarbonyl group (preferably containing 2 to 7 carbon atoms), an acyl group (preferably containing 2 to 12 carbon atoms) and an alkoxycaronyloxy group (preferably containing 2 to 7 carbon atoms). In addition to these substituents, the aryl moiety or the ring structure in each group may further have an alkyl group (preferably 1 to 15 carbon atoms) as a substituent.

Examples of alkyl moieties in the alkylcarboxylic acid anions include the alkyl groups and the cycloalkyl groups recited above as examples of alkyl moieties in the alkylsulfonic acid anions.

Examples of aryl moieties in the arylcarboxylic acid anions include the aryl groups recited above as examples of aryl moieties in the arylsulfonic acid anions.

Suitable examples of aralkyl moieties of the aralkylcarboxylic acid anions include 6-12C aralkyl groups, such as a benzyl group, a phenethyl group, a naphthylmethyl group and a naphthylethyl group.

The alkyl, cycloalkyl, aryl and aralkyl moieties in the alkyl-, aryl- and aralkylcarboxylic acid anions may further have substituents. Examples of such substituents include halogen atoms, alkyl groups, cycloalkyl groups, alkoxy groups and alkylthio groups as in the case of the arylsulfonic acid anions.

As to the sulfonylimide anions, a saccharin anion can be given as an example.

Suitable examples of alkyl moieties in the bis(alkylsulfonyl)imide anions and the tris(alkylsulfonyl)methide anions include 1-5C alkyl groups, such as a methyl group, an ethyl group, a propyl group, an isopropyl group, an n-butyl group, an isobutyl group, a sec-butyl group, a pentyl group and a neopentyl group. These alkyl groups may have substituents. Examples of such substituents include halogen atoms, alkyl groups substituted with halogen atoms, alkoxy groups and alkylthio groups. Of these substituents, alkyl groups substituted with fluorine atoms are preferred.

Examples of other non-nucleophilic anions include fluorophosphate ion, fluoroborate ion and fluoroantimonate ion.

Of the non-nucleophilic anions recited as $Z^-$, an alkanesulfonic acid anion substituted by a fluorine atom at the α-position of sulfonic acid group, an arylsulfonic acid anion substituted by a fluorine atom or a fluorine-containing group, an bis(alkylsulfonyl)imide anion the alkyl moieties of which are substituted by fluorine atoms and a tris(alkylsulfonyl)methide anion the alkyl moieties of which are substituted by fluorine atoms are preferred over the others. Among these non-nucleophilic anions, those preferred in particular are 4-8C perfluoroalkanesulfonic acid anions and fluorobenzenesulfonic acid anions, notably nonafluorobutanesulfonic acid anion, perfluorooctanesulfonic acid anion, pentafluorobenzenesulfonic acid anion and 3,5-bis(trifluoromethyl)benzenesulfonic acid anion.

Examples of an organic group represented by $R_{201}$, $R_{202}$ and $R_{203}$ each include the corresponding groups in compounds (Z1-1), (Z1-2) and (Z1-3) described hereinafter.

Incidentally, a photo-acid generator used in combination with Compound (B) may have two or more of structures represented by formula (ZI). For instance, it may be a compound having a structure that at least one of $R_{201}$, $R_{202}$ and $R_{203}$ in one compound represented by formula (ZI) is bound to at least one of $R_{201}$, $R_{202}$ and $R_{203}$ in another compound represented by formula (ZI).

Examples of a compound further preferred as the component (ZI) include compounds (Z1-1), (Z1-2) and (Z1-3) described below.

The compound (Z 1-1) is an arylsulfonium compound represented by the foregoing formula (ZI) in which at least one of $R_{201}$ to $R_{203}$ is an aryl group, namely a compound having an arylsulfonium as its cation.

In the arylsulfonium compound, all of $R_{201}$ to $R_{203}$ may be aryl groups, or one or two of $R_{201}$ to $R_{203}$ may be aryl groups and the remainder may be an alkyl group or a cycloalkyl group.

Examples of such an arylsulfonium compound include a triarylsulfonium compound, a diarylalkylsulfonium compound and an aryldialkylsulfonium compound.

The aryl group in the arylsulfonium compound is preferably a phenyl group or a naphthyl group, far preferably a phenyl group. When the arylsulfonium compound has two or more aryl groups, the two or more aryl groups may be the same or different.

Suitable examples of an alkyl group or a cycloalkyl group that the arylsulfonium compound has as required include 1-15C linear or branched alkyl groups and 3-15C cycloalkyl groups, such as a methyl group, an ethyl group, a propyl group, an n-butyl group, a sec-butyl group, a t-butyl group, a cyclopropyl group, a cyclobutyl group and a cyclohexyl group.

The aryl group, the alkyl group or the cycloalkyl group represented by any of $R_{201}$ to $R_{203}$ may have as a substituent an alkyl group (containing, e.g., 1 to 15 carbon atoms), a cycloalkyl group (containing, e.g., 3 to 15 carbon atoms), an aryl group (containing, e.g., 6 to 14 carbon atoms), an alkoxy group (containing, e.g., 1 to 15 carbon atoms), a halogen atom, a hydroxyl group or a phenylthio group. Suitable examples of such substituents include 1-12C linear or branched alkyl groups, 3-12C cycloalkyl groups and 1-12C linear, branched or cyclic alkoxy groups. Of these substituents, 1-4C alkyl groups and 1-4C alkoxy groups are preferred over the others. One of $R_{201}$ to $R_{203}$ may have such a substituent, or all of $R_{201}$ to $R_{203}$ may have such substituents. When $R_{201}$ to $R_{203}$ are aryl groups, it is preferable that each substituent is situated in the p-position of each aryl group.

Next, the compound (Z1-2) is described below.

The compound (Z1-2) is a compound represented by the formula (ZI) wherein $R_{201}$ to $R_{203}$ each independently represent an organic group having no aromatic ring. The term "aromatic ring" as used herein is intended to also include aromatic rings containing hetero atoms.

The number of carbon atoms in an organic group having no aromatic ring, which is represented by each of $R_{201}$ to $R_{203}$, is generally from 1 to 30, preferably from 1 to 20.

Each of $R_{201}$ to $R_{203}$ is preferably an alkyl group, a cycloalkyl group, an allyl group or a vinyl group, far preferably a linear or branched 2-oxoalkyl group, a 2-oxocycloalkyl group or an alkoxycarbonylmethyl group, particularly preferably a linear or branched 2-oxoalkyl group.

The alkyl or cycloalkyl group as each of $R_{201}$ to $R_{203}$ is preferably a 1-10C linear or branched alkyl group (such as a methyl group, an ethyl group, a propyl group, a butyl group or a pentyl group) or a 3-10C cycloalkyl group (such as a cyclopentyl group, a cyclohexyl group or a norbornyl group). Examples of an alkyl group preferable by far include 2-oxoalkyl groups and alkoxycarbonylmethyl groups. Examples of a cycloalkyl group preferable by far include 2-oxocycloalkyl groups.

The 2-oxoalkyl groups may be linear or branched ones, and suitable examples thereof include groups which are the same alkyl groups as recited above except that they have >C=O at their respective 2-positions.

The 2-oxocycloalkyl groups are preferably groups which are the same cycloalkyl groups as recited above except that they have >C=O at their respective 2-positions.

The alkyl moiety in the alkoxycarbonylmethyl group is preferably a 1-5C alkyl group (such as a methyl, ethyl, propyl, butyl or pentyl group).

Each of groups represented by $R_{201}$ to $R_{203}$ may further be substituted with a halogen atom, an alkoxy group (containing, e.g., 1 to 5 carbon atoms), a hydroxyl group, a cyano group or a nitro group.

Any two of $R_{201}$ to $R_{203}$ may combine with each other to form a ring structure, and may contain an oxygen atom, a sulfur atom, an ester linkage, an amide linkage or a carbonyl group in the ring formed. Examples of a group formed by combining any two of $R_{201}$ to $R_{203}$ include alkylene groups (such as a butylene group and a pentylene group).

The compound (Z1-3) is a compound represented by the following formula (Z1-3), namely a compound having a phenacylsulfonium salt structure.

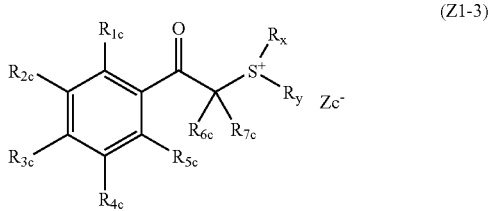

(Z1-3)

$R_{1c}$ to $R_{5c}$ each represent a hydrogen atom, an alkyl group, a cycloalkyl group, an alkoxy group or a halogen atom independently.

$R_{6c}$ and $R_{7c}$ each represent a hydrogen atom, an alkyl group or a cycloalkyl group.

$R_x$ and $R_y$ each represent an alkyl group, a cycloalkyl group, an allyl group or a vinyl group.

Any two or more of $R_{1c}$ to $R_{5c}$ may combine with one another to form a ring structure, and $R_x$ and $R_y$ may also combine with each other to form a ring structure. In such a ring structure, an oxygen atom, a sulfur atom, an ester linkage or an amide linkage may be contained.

$Z_c^-$ represents a non-nucleophilic anion, and examples thereof include the same non-nucleophilic anions as examples of $X^-$ in formula (ZI).

The alkyl group as $R_{1c}$ to $R_{5c}$ each may be either linear or branched, and examples thereof include 1-20C alkyl groups, preferably 1-12C linear and branched alkyl groups (such as a methyl group, an ethyl group, a linear or branched propyl group, linear or branched butyl groups, and linear or branched pentyl groups). Examples of the cycloalkyl group as $R_{1c}$ to $R_{5c}$ each include 3-8C cycloalkyl groups (such as a cyclopentyl group and a cyclohexyl group).

The alkoxy group as $R_{1c}$ to $R_{5c}$ each may be either linear, or branched, or cyclic, and examples thereof include 1-10C alkoxy groups, preferably 1-5C linear and branched alkoxy groups (such as a methoxy group, an ethoxy group, a linear or branched propoxy group, linear or branched butoxy groups, and linear or branched pentoxy groups) and 3-8C cycloalkoxy groups (such as a cyclopentyloxy group and a cyclohexyloxy group).

It is preferable that any of $R_{1c}$ to $R_{5c}$ is a linear or branched alkyl group, a cycloalkyl group or a linear, branched or cyclic alkoxy group, and it is far preferable that the number of total carbon atoms in $R_{1c}$ to $R_{5c}$ is from 2 to 15. By respond to this request, the solvent solubility can be enhanced, and development of particles during storage can be inhibited.

Examples of the alkyl group and the cycloalkyl group as each of $R_x$ and $R_y$ include the same groups as examples of the alkyl group and the cycloalkyl group as each of $R_{1c}$ to $R_{5c}$, preferably 2-oxoakyl groups, 2-oxocycloalkyl groups and alkoxycarbonylmethyl groups.

The 2-oxoalkyl group and the 2-oxocycloalkyl group include groups which are the same alkyl and cycloalkyl groups as $R_{1c}$ to $R_{5c}$ may represent, except that they have >C=O at their respective 2-positions.

The alkoxy moiety in the alkoxycarbonylmethyl group includes the same alkoxy groups as $R_{1c}$ to $R_{5c}$ each may represent.

The group formed by combining $R_x$ and $R_y$ may be a butylene group or a pentylene group.

Each of $R_x$ and $R_y$ is preferably an alkyl or cycloalkyl group containing at least 4 carbon atoms, far preferably an alkyl or cycloalkyl group containing at least 6 carbon atoms, further preferably an alkyl or cycloalkyl group containing at least 8 carbon atoms.

In formulae (ZII) and (ZIII) each, $R_{204}$ to $R_{207}$ each represent an aryl group, an alkyl group or a cycloalkyl group independently.

The aryl group as $R_{204}$ to $R_{207}$ each is preferably a phenyl group or a naphthyl group, far preferably a phenyl group.

The alkyl group and the cycloalkyl group as each of $R_{204}$ to $R_{207}$ may represent are preferably a 1-10C linear or branched alkyl group (such as a methyl group, an ethyl group, a propyl group, a butyl group or a pentyl group) and a 3-10C cycloalkyl group (such as a cyclopentyl group, a cyclohexyl group or a norbornyl group).

Examples of a substituent that $R_{204}$ to $R_{207}$ each may have include an alkyl group (containing, e.g., 1 to 15 carbon atoms), a cycloalkyl group (containing, e.g., 3 to 15 carbon atoms), an aryl group (containing, e.g., 6 to 15 carbon atoms), an alkoxy group (containing, e.g., 1 to 15 carbon atoms), a halogen atom, a hydroxyl group and a phenylthio group.

$Z^-$ represents a non-nucleophilic anion, and examples thereof include the same non-nucleophilic anions as the $Z^-$ in formula (ZI) may represent.

Examples of a compound which can decompose upon irradiation with actinic rays or radiation to generate an acid and can be suitably used in combination with Compound (B) further include compounds represented by the following formulae (ZIV), (ZV) and (ZVI).

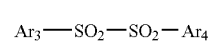

ZIV

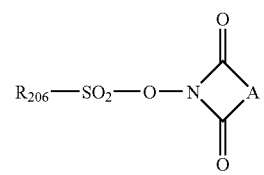

ZV

-continued

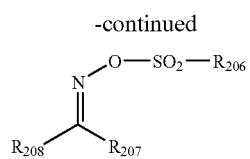

ZVI

In formulae (ZIV) to (ZVI), $Ar_3$ and $Ar_4$ each represent an aryl group independently.

$R_{206}$, $R_{207}$ and $R_{208}$ each represent an alkyl group, a cycloalkyl group or an aryl group.

A represents an alkylene group, an alkenylene group or an arylene group.

Of the compounds that can decompose upon irradiation with actinic rays or radiation to generate acids and may be used in combination with Compound (B), the compounds represented by (ZI) to (ZIII) are preferred over the others.

To be more specific, the compounds that can decompose upon irradiation with actinic rays or radiation to generate acids and may be used in combination with Compound (B) are preferably compounds each having one sulfonic acid group and capable of generating a sulfonic acid, far preferably compounds which each can generate a univalent perfluoroalkanesulfonic acid or compounds which each can generate an aromatic sulfonic acid substituted with a fluorine atom or a fluorine-containing group, particularly preferably sulfonium salts of univalent perfluoroalkanesulfonic acids.

Particularly preferred examples of compounds that can decompose upon irradiation with actinic rays or radiation to generate acids and may be used in combination with Compound (B) are illustrated below.

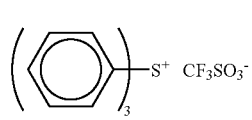 (z1)

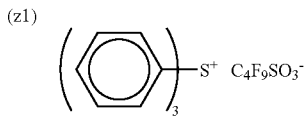 (z2)

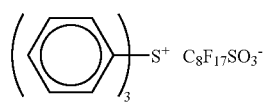 (z3)

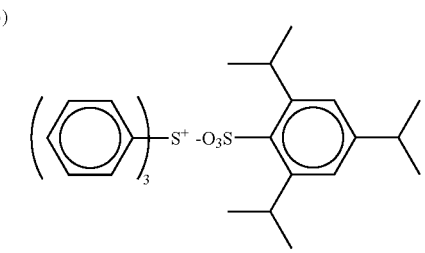 (z4)

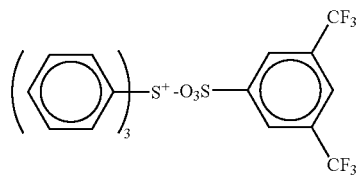 (z5)

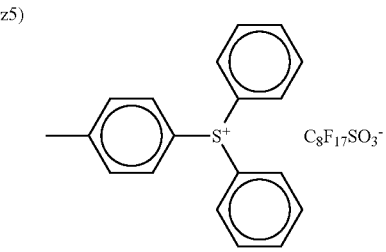 (z6)

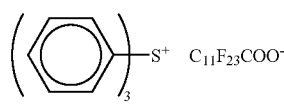 (z7)

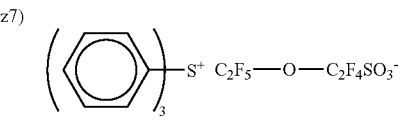 (z8)

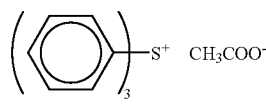 (z9)

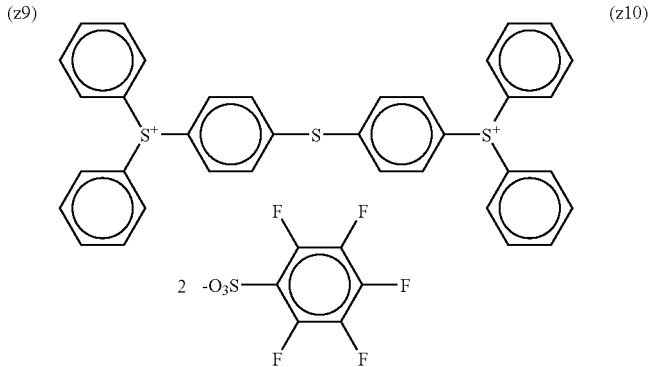 (z10)

-continued
(z11)
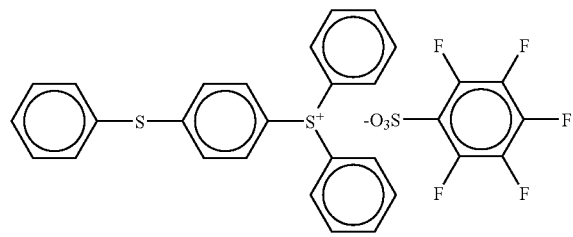
(z12)
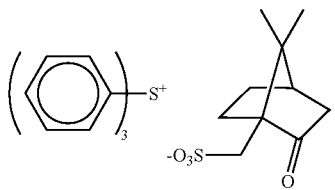
(z13)
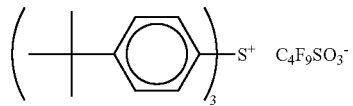
(z14)
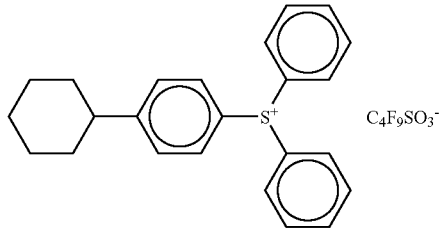
(z15)
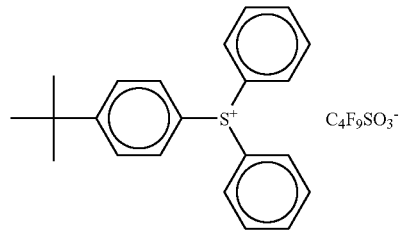
(z16)
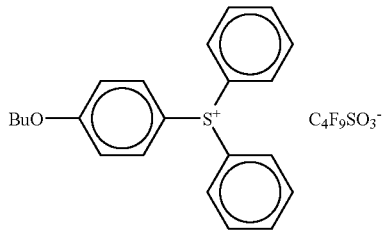
(z17)
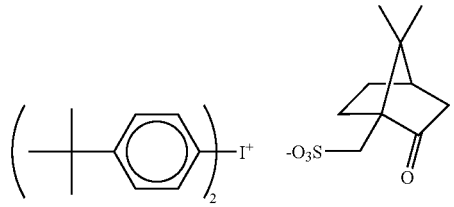
(z18)
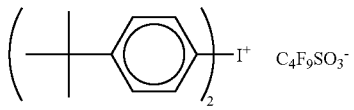
(z19)
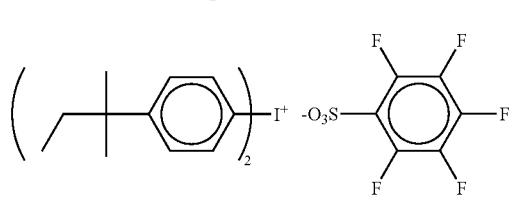
(z20)
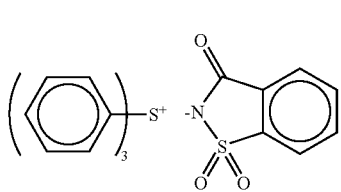
(z21)
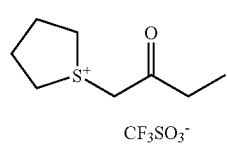
(z22)
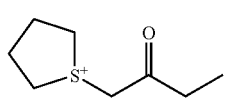
(z23)
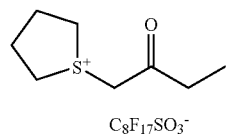
(z24)
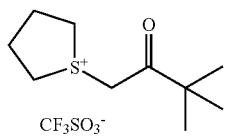
(z25)
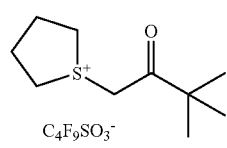
(z26)
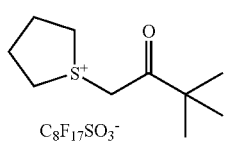

-continued
(z27)
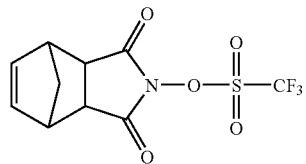
(z28)
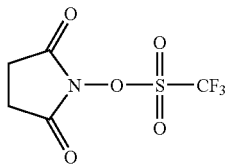
(z29)
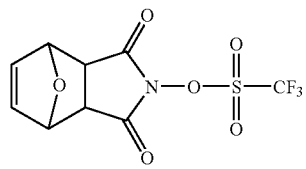
(z30)
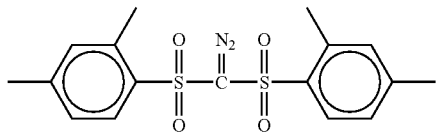
(z31)
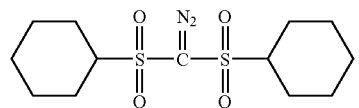
(z32)
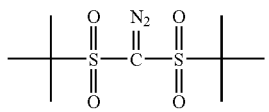
(z33)
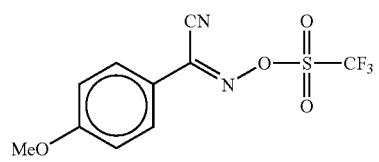
(z34)
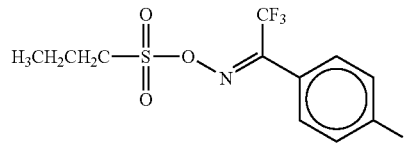
(z35)
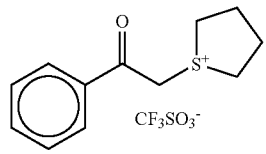
(z36)
(z37)
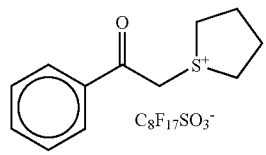
(z38)
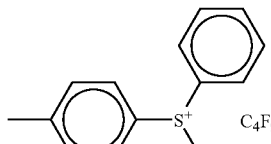
(z39)
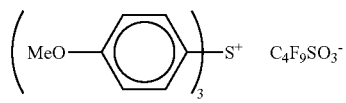
(z40)
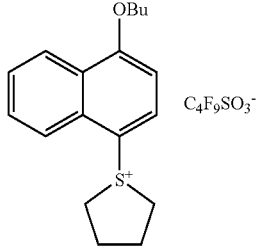
(z41)
(z42)

-continued
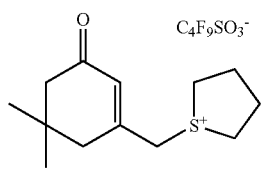
(z43)
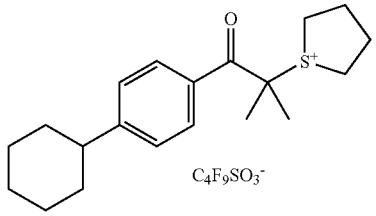
(z44)
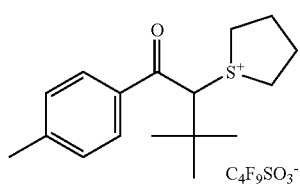
(z45)
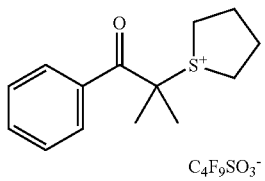
(z46)
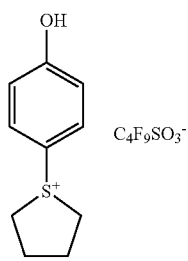
(z47)
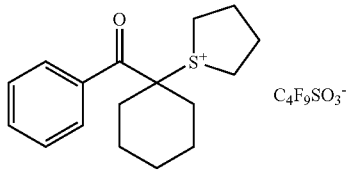
(z48)
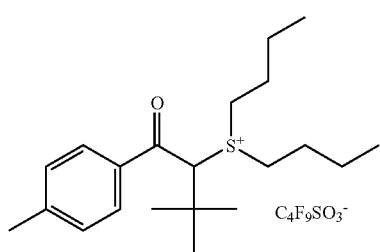
(z49)
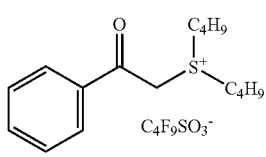
(z50)
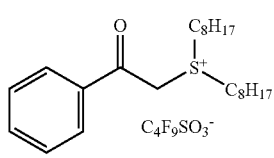
(z51)
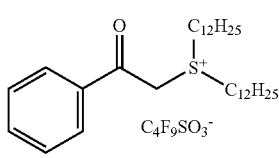
(z52)
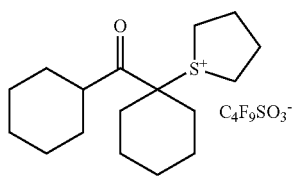
(z53)
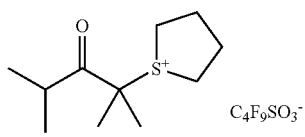
(z54)
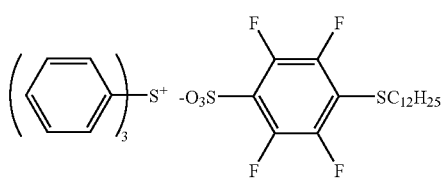
(z55)
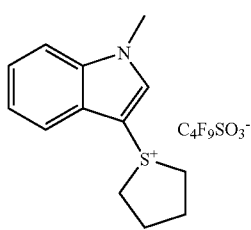
(z56)

[5] Solvent

The present positive-working photosensitive composition is prepared by dissolving its ingredients in a solvent.

Examples of such a solvent include organic solvents, such as ethylene chloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone and tetrahydrofuran.

The solvent used in the invention, though may be either a single solvent or a mixed solvent, is preferably a mixed solvent containing two or more kinds of solvents having different functional groups. By using such a mixed solvent, not only solubility of each ingredient is increased and particles can be prevented from developing by aging, but also satisfactory pattern profile can be obtained. Examples of a functional group appropriate for the solvent to have include an ester group, a lactone group, a hydroxyl group, a ketone group and a carbonate group. Suitable examples of a mixed solvent constituted of solvents differing in functional group include the mixed solvents (S1) to (S5) described below:

(S1) a mixed solvent prepared by mixing a solvent having a hydroxyl group and a solvent having no hydroxyl group, (S2) a mixed solvent prepared by mixing a solvent having an ester structure and a solvent having a ketone structure, (S3) a mixed solvent prepared by mixing a solvent having an ester structure and a solvent having a lactone structure, (S4) a mixed solvent prepared by mixing a solvent having an ester structure, a solvent having a lactone structure and a solvent having a hydroxyl group, and (S5) a mixed solvent prepared by mixing a solvent having an ester structure, a solvent having a carbonate structure and a solvent having a hydroxyl group.

By using such a mixed solvent, particle development during storage of the resulting resist solution can be reduced, and occurrence of defects at the time of coating can be suppressed.

Examples of a solvent having a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are preferred over the others.

Examples of a solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethyl sulfoxide. Of these solvents, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate, 2-heptanone and cyclohexanone are far preferred.

Examples of a solvent having a ketone structure include cyclohexanone and 2-heptanone, preferably cyclohexanone.

Examples of a solvent having a ester structure include propylene glycol monomethyl ether acetate, ethyl ethoxypropionate and butyl acetate, preferably propylene glycol monomethyl ether acetate.

An example of a solvent having a lactone structure is γ-butyrolactone.

Examples of a solvent having a carbonate structure include propylene carbonate and ethylene carbonate, preferably propylene carbonate.

The mixing ratio (by mass) between a solvent having a hydroxyl group and a solvent having no hydroxyl group is from 1/99 to 99/1, preferably from 10/90 to 90/10, far preferably from 20/80 to 60/40. The mixed solvent containing a solvent having no hydroxyl group in a proportion of 50 mass % or more is especially preferred in point of coating uniformity.

The mixing ratio (by mass) between a solvent having an ester structure and a solvent having a ketone structure is from 1/99 to 99/1, preferably from 10/90 to 90/10, far preferably from 40/60 to 80/20. The mixed solvent containing a solvent having an ester structure in a proportion of 50 mass % or more is especially preferred in point of coating uniformity.

The mixing ratio (by mass) between a solvent having an ester structure and a solvent having a lactone structure is from 70/30 to 99/1, preferably from 80/20 to 99/1, far preferably from 90/10 to 99/1. The mixed solvent containing a solvent having an ester structure in a proportion of 70 mass % or more is especially preferred in point of aging stability.

When a solvent having an ester structure, a solvent having a lactone structure and a solvent having a hydroxyl group are mixed, it is preferable that the proportion of the solvent having an ester structure is from 30 to 80 mass %, that of the solvent having a lactone structure is from 1 to 20 mass % and that of the solvent having a hydroxyl group is from 10 to 60 mass %.

When a solvent having an ester structure, a solvent having a carbonate structure and a solvent having a hydroxyl group are mixed, it is preferable that the proportion of the solvent having an ester structure is from 30 to 80 mass %, that of the solvent having a carbonate structure is from 1 to 20 mass % and that of the solvent having a hydroxyl group is from 10 to 60 mass %.

A more suitable formula of the solvent used is to contain an alkylene glycol monoalkyl ether carboxylate (preferably propylene glycol monomethyl ether acetate), far preferably to mix an alkylene glycol monoalkyl ether carboxylate with another solvent, specifically a solvent having at least one functional group selected from a hydroxyl group, a ketone group, a lactone group, an ester group, an ether group or a carbonate group, or a solvent having two or more functional groups selected from the above-recited ones. An especially suitable mixed solvent is a mixture of propylene glycol monomethyl ether acetate and at least one solvent selected from ethyl lactate, γ-butyrolactone, propylene glycol monomethyl ether, butyl acetate or cyclohexanone. By adopting such an especially suitable mixed solvent, development defectiveness can be improved.

The mixing ratio (by mass) between an alkylene glycol monoalkyl ether carboxylate and another solvent (the alkylene glycol monoalkyl ether carboxylate/another solvent ratio) is from 95/5 to 30/70, preferably from 95/5 to 40/60, far preferably from 80/20 to 50/50. By increasing the proportion of an alkylene glycol monoalkyl ether carboxylate, it is possible to reduce performance changes with the passage of time from coating to exposure.

The solids concentration in the present positive-working photosensitive composition is preferably from 3 to 15 mass %, far preferably from 4 to 10 mass %, further preferably from 5 to 8 mass %.

[6] (E): Dissolution-inhibiting Compound Capable of Decomposing by Action of Acid to Increase Solubility in Alkali Developer and Having Molecular Weight of 3,000 or Below The present positive-working photosensitive composition can contain a dissolution-inhibiting compound that can decompose by the action of an acid to increase solubility in an alkali developer and has a molecule weight of 3,000 or below (hereinafter abbreviated as "a dissolution-inhibiting compound" also).

As dissolution-inhibiting compounds, alicyclic or aliphatic compounds having acid-decomposable groups, including the cholic acid derivatives containing acid-decomposable groups described in *Proceeding of SPIE,* 2724, 355 (1996), are suitable because they causes no drop in transmittance at wavelengths of 220 nm or below. Examples of acid-decomposable groups and those of alicyclic structures include the same ones as recited in the description of the resin of Component (A).

The molecular weight of a dissolution-inhibiting compound is 3,000 or below, preferably from 300 to 3,000, far preferably from 500 to 2,500.

Such a dissolution-inhibiting compound is added in an amount of 3 to 50 mass %, preferably 5 to 40 mass %, based on the total solids in the positive-working photosensitive composition.

Examples of a dissolution-inhibiting compound are illustrated below, but these examples should not be construed as limiting the scope of the invention.

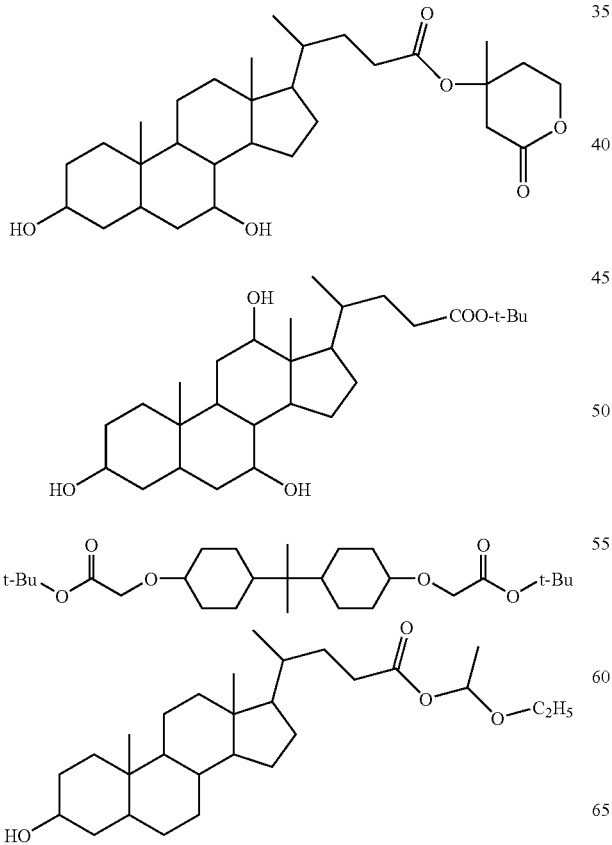

-continued

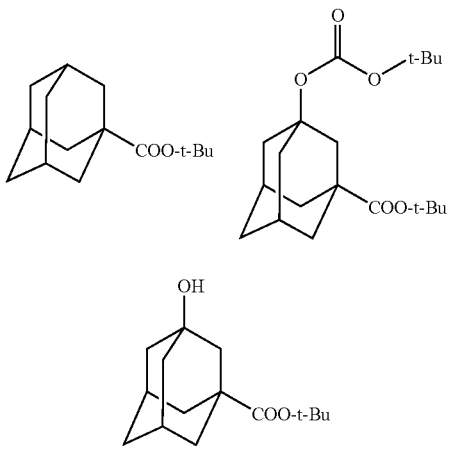

[7] (F): Basic Compound

For reducing performance changes with the passage of time from exposure to heating, or controlling intra-film diffusion of an acid generated by exposure, it is appropriate that the present positive-working photosensitive composition contain a basic compound.

Examples of such a basic compound include nitrogen-containing basic compounds and onium salt compounds.

Suitable examples of a nitrogen-containing basic compound include compounds having the following partial structures (A) to (E).

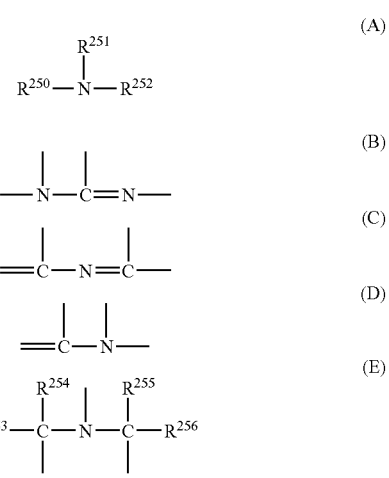

In formula (A), $R^{250}$, $R^{251}$ and $R^{252}$ each represent a hydrogen atom, a 1-20C alkyl group, a 3-20C cycloalkyl group or a 6-20C aryl group independently, or $R^{250}$ and $R^{251}$ may combine with each other to form a ring. These groups may have substituents. Suitable examples of an alkyl or cycloalkyl group having a substituent include 1-20C aminoalkyl groups or 3-20C cycloalkyl groups, and 1-20C hydroxyalkyl groups or 3-20C hydroxyalkyl groups. Additionally, these alkyl chains each may contain an oxygen atom, a sulfur atom or a nitrogen atom.

In formula (E), $R^{253}$, $R^{254}$, $R^{255}$ and $R^{256}$ each represent a 1-6C alkyl group or a 3-6C cycloalkyl group independently.

Examples of preferable compounds include guanidine, aminopyrrolidine, pyrazole, pyrazoline, piperazine, aminomorpholine, aminoalkylmorpholines and piperidine, and these compounds may have substituents. Examples of far preferable compounds include a compound having an imidazole structure, a compound having a diazabicyclo structure, a compound having an onium hydroxide structure, a compound having an onium carboxylate structure, a compound having a trialkylamine structure, a compound having a pyridine structure, an alkylamine derivative having a hydroxyl group and/or an ether linkage, and an aniline derivative having a hydroxyl group and/or an ether linkage.

Examples of the compound having an imidazole structure include imidazole, 2,4,5-triphenylimidazole and benzimidazole. Examples of the compound having a diazabicyclo structure include 1,4-diazabicyclo[2.2.2]octane, 1,5-diazabicyclo[4.3.0]nona-5-ene and 1,8-diazabicyclo[5.4.0]undeca-7-ene. Examples of the compound having an onium hydroxide structure include triarylsulfonium hydroxides, phenacylsulfonium hydroxides and sulfonium hydroxides having 2-oxoalkyl groups, and more specifically triphenylsulfonium hydroxide, tris(t-butylphenyl)sulfonium hydroxide, bis(t-butylphenyl)iodonium hydroxide, phenacylthiophenium hydroxide and 2-oxopropylthiphenium hydroxide. The compound having an onium carboxylate structure is the compound having the structure corresponding to the substitution of carboxylate for the anion moiety of the compound having an onium hydroxide structure, and examples thereof include acetate, adamantane-1-carboxylate and perfluoroalkylcarboxylates. Examples of the compound having a trialkylamine structure include tri(n-butyl)amine and tri(n-octyl)amine. Examples of the compound having an aniline structure include 2,6-diisopropylaniline and N,N-dimethylaniline. Examples of the alkylamine derivative having a hydroxyl group and/or an ether linkage include ethanolamine, diethanolamine, triethanolamine and tris(methoxyethoxyethyl)amine. An example of the compound having a hydroxyl group and/or an ether linkage is N,N-bis(hydroxyethyl)aniline.

These basic compounds are used alone or as combinations of two or more thereof. They are added in an amount of generally 0.001 to 10 mass %, preferably 0.01 to 5 mass %, based on the total solids in the positive-working photosensitive composition. From the viewpoint of attaining sufficient addition effect, 0.001 mass % or more is preferable, while 10 mass % or below is preferable in terms of sensitivity and developability in unexposed areas.

[8] (E): Surfactant Containing at Least One Fluorine and/or at Least One Silicon Atom It is preferable that the present positive-working photosensitive composition further contains a surfactant containing at least one fluorine atom and/or at least one silicon atom (namely either a surfactant containing at least one fluorine atom, or a surfactant containing at least one silicon atom, or a surfactant containing both fluorine and silicon atoms), or a combination of at least two of these surfactants.

Incorporation of a surfactant containing at least one fluorine atom and/or at least one silicon atom into the present positive-working photosensitive composition makes it possible to provide resist patterns having strong adhesion and reduced development defectiveness while ensuring the composition both satisfactory sensitivity and high resolution at the time of using an exposure light source of 250 nm or below, especially 220 nm or below.

Examples of a surfactant containing at least one fluorine atom and/or at least one silicon atom include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable herein include fluorine-containing surfactants and silicon-containing surfactants, such as Eftop EF301 and EF303 (produced by Shin-Akita Kasei K. K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.), and Troysol S-366 (produced by Troy Chemical Industries, Inc.). In addition, organosiloxane polymer KP-341 (produced by Shin-Etsu Chemical Co., Ltd.) can be used as a silicon-containing surfactant.

In addition to known surfactants as recited above, the surfactants usable in the invention include surfactants using polymers containing fluorinated aliphatic groups derived from fluorinated aliphatic compounds synthesized by a telomerization method (also referred to as a telomer method) or an oligomerization method (also referred to as an oligomer method). These fluorinated aliphatic compounds can be synthesized according to the methods disclosed in JP-A-2002-90991.

The polymers suitable as the polymers containing fluorinated aliphatic groups are copolymers of fluorinated aliphatic group-containing monomers and poly(oxyalkylene) acrylates and/or poly(oxyalkylene) methacrylates, wherein the fluorinated aliphatic group-containing units may be distributed randomly or in blocks. Examples of such poly(oxyalkylene) groups include a poly(oxyethylene) group, a poly(oxypropylene) group and a poly(oxybutylene) group. In addition, the poly(oxyalkylene) groups may be units containing alkylene groups of different chain lengths in their respective oxyalkylene chains, such as poly(oxyethylene block-oxypropylene block-oxyethylene block combination) groups and poly(oxyethylene block-oxypropylene block combination) groups. Further, the copolymers of fluorinated aliphatic group-containing monomers and poly(oxyalkylene) acrylates (or methacrylates) may be binary copolymers or at least ternary copolymers prepared by copolymerizing at least two different kinds of fluorinated aliphatic group-containing monomers and at least two different kinds of poly(oxyalkylene) acrylates (or methacrylates) all together.

Examples of a fluorinated aliphatic group-containing polymer commercially available as surfactant include Megafac F178, F-470, F-473, F-475, F-476 and F-472 (produced by Dainippon Ink & Chemicals, Inc.). Additional examples of a fluorinated aliphatic group-containing polymer include a copolymer of $C_6F_{13}$ group-containing acrylate (or methacrylate) and poly(oxyalkylene) acrylate (or methacrylate), a terpolymer of $C_6F_{13}$ group-containing acrylate (or methacrylate), poly(oxyethylene) acrylate (or methacrylate) and poly(oxypropylene) acrylate (or methacrylate), a copolymer of $C_8F_{17}$ group-containing acrylate (or methacrylate) and poly(oxyalkylene) acrylate (or methacrylate), and a terpolymer of $C_8F_{17}$ group-containing acrylate (or methacrylate), poly(oxyethylene) acrylate (or methacrylate) and poly(oxypropylene) acrylate (or methacrylate).

It is appropriate that the surfactant containing at least one fluorine atom or/and at least one silicon atom be used in an amount of 0.0001 to 2 mass %, preferably 0.001 to 1 mass %, based on the total ingredients (exclusive of a solvent) in the positive-working photosensitive composition.

[9] Other Additives

The present positive-working photosensitive composition can further contain, if needed, dyes, plasticizers, surfactants other than the above-recited ones, photo-sensitizers and compounds capable of promoting dissolution in developers.

The compounds capable of promoting dissolution in developers which can be used in the invention are low-molecular compounds each having at least two phenolic OH groups or at least one carboxyl group and a molecular weight of 1,000 or below. Herein, the compounds having carboxyl groups are preferably alicyclic or aliphatic compounds.

The suitable addition amount of these dissolution promoting compounds is from 2 to 50 mass %, preferably from 5 to 30 mass % of the total amount of resins used. The proportion of such compounds is preferably at most 50 mass % from the viewpoints of controlling development residues and preventing pattern deformation from occurring at the time of development.

Those polyhydric phenol compounds having molecular weight of 1,000 or below can be synthesized with ease by persons skilled in the art when they consult JP-A-4-122938, JP-A-2-28531, U.S. Pat. No. 4,916,210 and European Patent No. 219,294.

Examples of an alicyclic or aliphatic compound having at least one carboxyl group include carboxylic acid derivatives having steroid structures, such as cholic acid, deoxycholic acid and lithocholic acid; adamantane carboxylic acid derivatives; adamantane dicarboxylic acids; cyclohexanecarboxylic acids; and cyclohexanedicarboxylic acids, but not limited to the acids recited above.

[10] Pattern Forming Method

The present positive-working photosensitive composition is used in a state that the ingredients as recited above are dissolved in a specified solvent, preferably any of the mixed solvents recited above, passed through a filter, and then coated on a designated substrate in the manner as mentioned below. The filter used for filtration is preferably made from polytetrafluoroethylene, polyethylene or nylon and has a pore size of 0.1 micron or below, preferably 0.05 micron or below, far preferably 0.03 micron or below.

For instance, the positive-working photosensitive composition is coated on a substrate as used in fabrication of high-precision integrated circuit devices (e.g., silicon/silicon dioxide coating) according to an appropriate coating method, such as a method of using a spinner or a coater, and dried to form a photosensitive film. On the substrate, a known antireflective film may be coated in advance, if needed.

The thickness of the photosensitive film formed is preferably from 50 to 300 nm, far preferably from 70 to 200 nm, further preferably from 80 to 150 nm. The present positive-working photosensitive composition can produce its effects more remarkably when it is formed into a rather thinner film.

The photosensitive film is irradiated with an actinic ray or radiation via a given mask, preferably baked (heated), and then developed and rinsed. By these operations, patterns of good quality can be obtained.

The irradiation with an actinic ray or radiation may be performed in a condition that the space between the photosensitive film and a lens is filled with a liquid having a higher refractive index than the air (immersion exposure). By doing so, the resolution can be heightened. As the immersion medium, any liquid may be used as long as it has a higher refractive index than the air, but it is preferable to use purified water. Additionally, in order to avoid direct contact between the immersion liquid and the photosensitive film during the operation of immersion exposure, an overcoat layer may further be provided on the photosensitive film. By the overcoat layer, elution of ingredients from the photosensitive film into the immersion liquid can be inhibited, and development defects can be reduced.

Examples of an actinic ray or radiation include infrared light, visible light, ultraviolet light, far-ultraviolet light, X rays and electron beams, preferably far-ultraviolet light of 250 nm or below, especially 220 nm or below, more specifically KrF excimer laser (248 nm), ArF excimer laser (193 nm), $F_2$ excimer laser (157 nm), X rays and electron beams, particularly preferably ArF excimer laser, $F_2$ excimer laser, EUV (13 nm) and electron beams.

In a development process, an alkali developer is used as follows. The alkali developer usable for the photosensitive composition is an alkaline aqueous solution containing as an alkali an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcholamine such as dimethylethanolamine or triethanolamine, a quaternary ammonium salt such as tetramethylammonium hydroxide or tetraethylammonium hydroxide, or a cyclic amine such as pyrrole or piperidine.

Further, an alcohol compound and a surfactant can be added in appropriate amounts to the alkali developer as recited above.

An alkali concentration of the alkali developer used is generally from 0.1 to 20 mass %.

The pH of the alkali developer used is generally from 10.0 to 15.0.

EXAMPLES

The invention will now be illustrated in more detail by reference to the following examples, but these examples should not be construed as limiting the scope of the invention in any way.

Synthesis Example 1

Synthesis of Monomer (A))

In 150 ml of toluene, 9.8 g of hydroxydiamantane, 3.7 g of methacrylic anhydride and 0.5 g of conc. sulfuric acid were dissolved. These reacting species were allowed to react with each other under reflux for 2 hours. The reaction solution was washed with a water solution of sodium hydrogen carbonate, then washed with distilled water, and further dried over anhydrous sodium sulfate. The resulting solution was concentrated to give a crude product. The crude product was purified by column chromatography. Thus, 6.3 g of Monomer (A) was obtained.

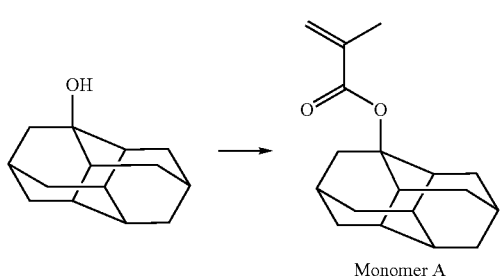

Monomer A

Synthesis 2

Synthesis of Monomer (B)

To 160 ml of bromine cooled to −7° C., 40 g of diamantane was added gradually while keeping the reaction solution at a temperature of −3° C. or below. Thereafter, 2.16 g of aluminum bromide was further added gradually while keeping the reaction solution at a temperature of 0° C. or below. Then, the reaction solution was stirred for 30 minutes as the temperature thereof was maintained at −7° C., and poured slowly to a solution containing 500 g of sodium sulfite and 160 g of sodium hydroxide in 3 L of water. The precipitate thus deposited was filtered off, and washed with acetonitrile to give 63 g of dibromodiamantane.

Concentrated nitric acid in an amount of 80 ml was added gradually to 20 g of dibromodiamantane, and heated up to 70° C. Therein, reaction was run for 30 minutes. The reaction solution thus obtained was poured into 300 ml of water, and rendered alkaline by addition of 72 g of solution hydroxide/500 ml of water. The precipitate thus deposited was filtered off, and washed with water to give 7 g of dihydroxydiamantane.

In the same manner as in synthesis of Monomer (A) except for the use of dihydroxydiamantane, Monomer (B) was obtained in an amount of 3 g.

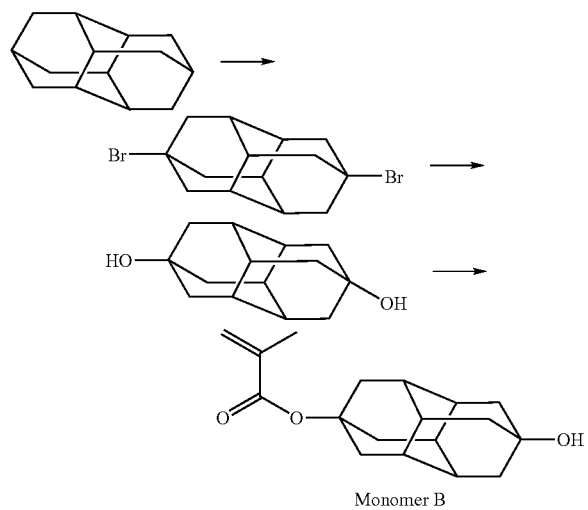

Monomer B

Synthesis 3

Synthesis of Resin (RA-1) (Drop Polymerization)

In a three-necked flask, 5.1 g of propylene glycol monomethyl ether acetate and 3.4 g of propylene glycol monomethyl ether were placed and heated up to 80° C. in a stream of nitrogen. Thereto, 2.7 g of Monomer (A), 4.7 g of 3-hydroxyadamantane methacrylate, 7.0 g of 2-methyl-2-adamantyl methacrylate, 6.8 g of γ-butyrolactone methacrylate and a solution prepared by dissolving a 4 mol %, based on the total monomers, of initiator V-601 (produced by Wako Pure Chemical Industries, Ltd.) in a mixture of 46 g of propylene glycol monomethyl ether acetate and 30.7 g of propylene glycol monomethyl ether were added dropwise over a 6-hour period. After the conclusion of the addition, the reaction was further continued at 80° C. for 2 hours. The reaction solution obtained was allowed to stand until it was cooled to room temperature, and thereinto a mixture of 720 ml of hexane and 80 ml of ethyl acetate was poured. The powdery matter thus deposited was filtered off, and dried to give 18 g of Resin (RA-1). The weight-average molecular weight of Resin (RA-1) was found to be 10,700 as measured by GPC and calculated in terms of polystyrene, and the dispersion degree (Mw/Mn) was found to be 1.81.

In the similar manner to described above, Resin (RA-2) to Resin (RA-18) were synthesized.

Synthesis 4

Synthesis of Resin (RA-1') (Drop Polymerization)

Resin (RA-1') having the same structure as Resin (RA-1) was synthesized by carrying out the same operations as in Synthesis 3, except that the addition amount of initiator V-601 (produced by Wako Pure Chemical Industries, Ltd.) was changed to 1 mol % based on the total monomers. The weight-average molecular weight of Resin (RA-1') was found to be 33,600 as measured by GPC and calculated in terms of polystyrene, and the dispersion degree (Mw/Mn) was found to be 2.6.

Synthesis 5

Synthesis of Resin (RA-1") (Batch Polymerization)

In a stream of nitrogen, 2.7 g of Monomer (A), 4.7 g of 3-hydroxyadamantane methacrylate, 7.0 g of 2-methyl-2-adamantyl methacrylate and 6.8 g of γ-butyrolactyone methacrylate were dissolved in a mixture of 51 g of propylene glycol monomethyl ether acetate and 34 g of propylene glycol monomethyl ether, and heated to 80° C. Thereto, an initiator V-601 (produced by Wako Pure Chemical Industries, Ltd.) was added in an amount of 3 mol % based on the total monomers, and the reaction was run at 80° C. for 5 hours. The reaction solution obtained was allowed to stand until it was cooled to room temperature, and thereinto a mixture of 720 ml of hexane and 80 ml of ethyl acetate was poured. The powdery matter thus deposited was filtered off, and dried to give 17 g of Resin (RA-1") having the same structure as Resin (RA-1). The weight-average molecular weight of Resin (RA-1") was found to be 35,200 as measured y GPC and calculated in terms of polystyrene, and the dispersion degree (Mw/Mn) was found to be 3.6.

Structures, compositional ratios, weight-average molecular weights and dispersion degrees of Resins (RAi-1) to (RA-18) are illustrated below.

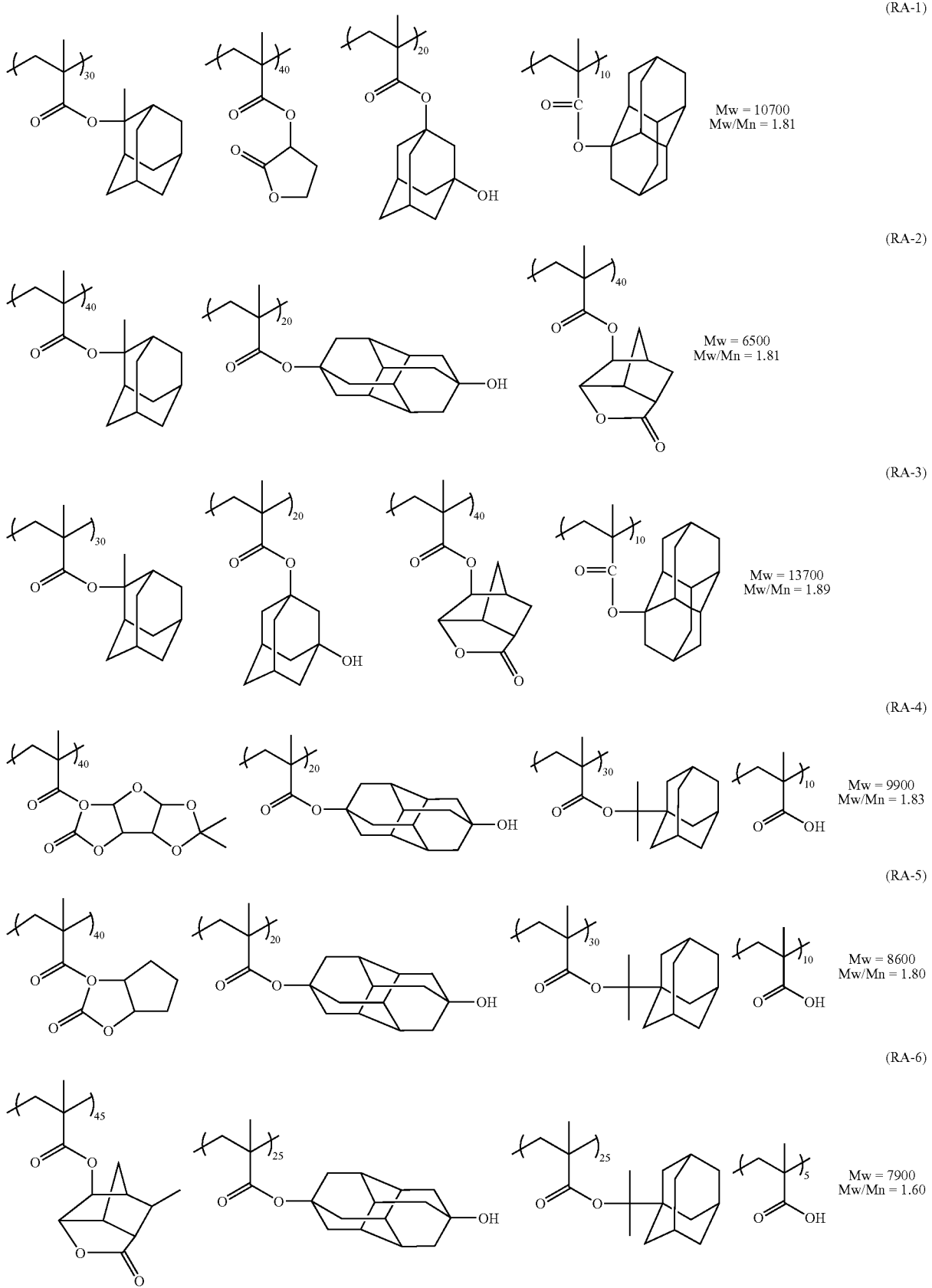

-continued
(RA-7)
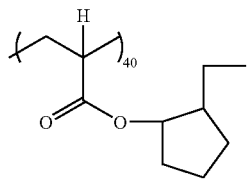 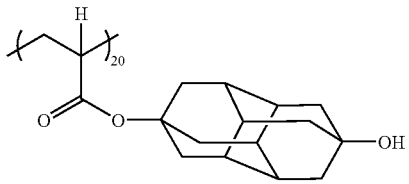 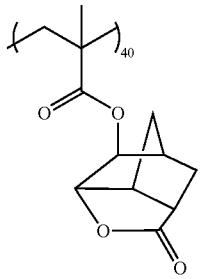
Mw = 8600
Mw/Mn = 1.50
(RA-8)
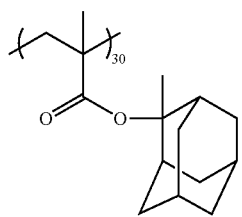 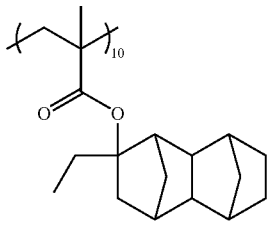 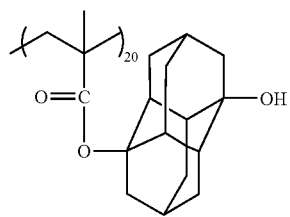 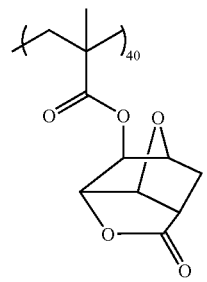
Mw = 7800
Mw/Mn = 1.81
(RA-9)
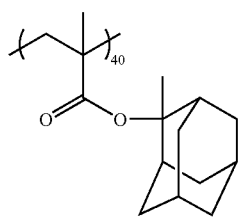 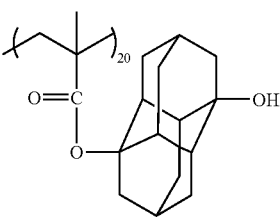 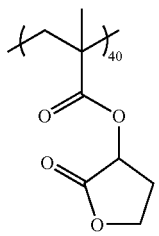
Mw = 8500
Mw/Mn = 1.83
(RA-10)
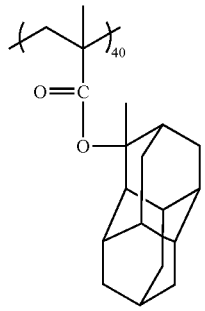 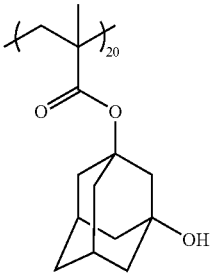 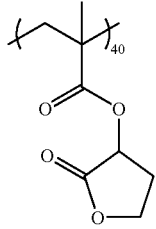
Mw = 10500
Mw/Mn = 2.03
(RA-11)
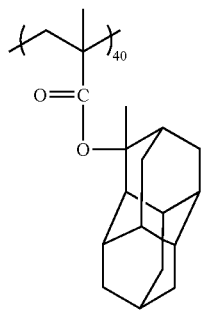 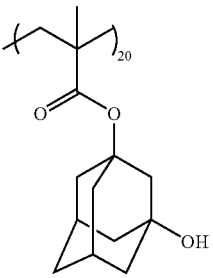 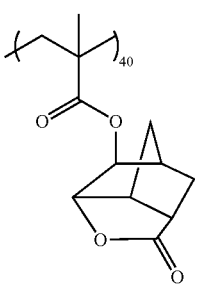
Mw = 9000
Mw/Mn = 1.90

-continued
(RA-12)
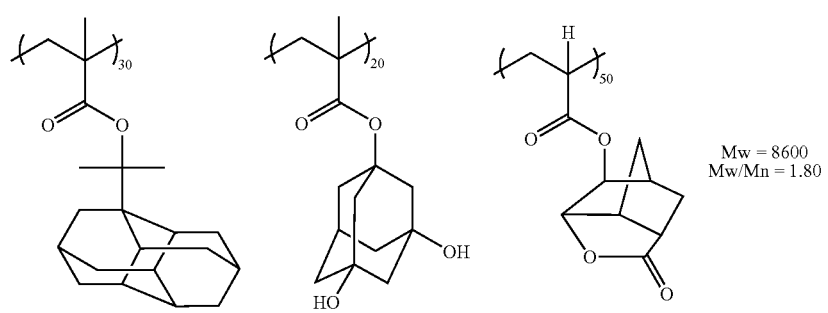
Mw = 8600
Mw/Mn = 1.80
(RA-13)
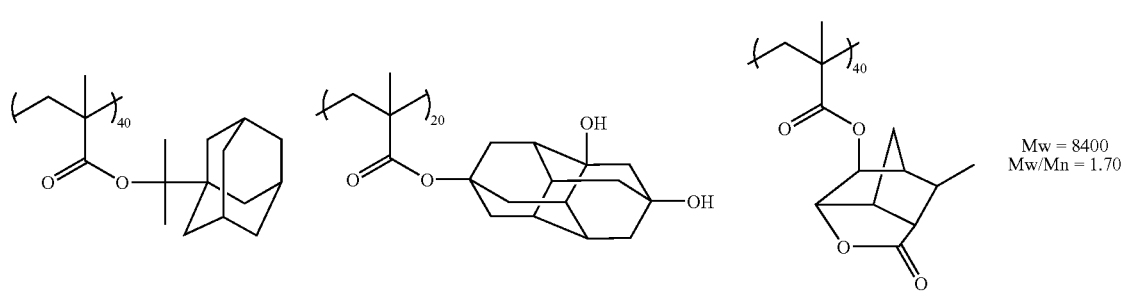
Mw = 8400
Mw/Mn = 1.70
(RA-14)
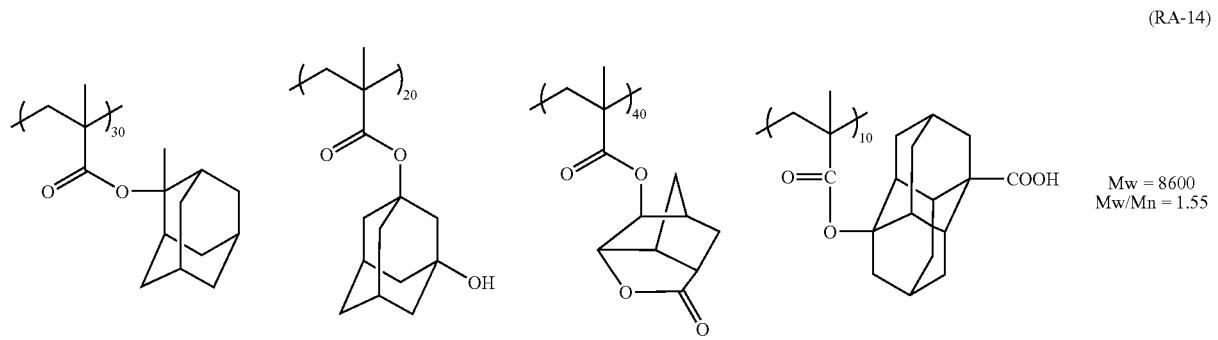
Mw = 8600
Mw/Mn = 1.55
(RA-15)
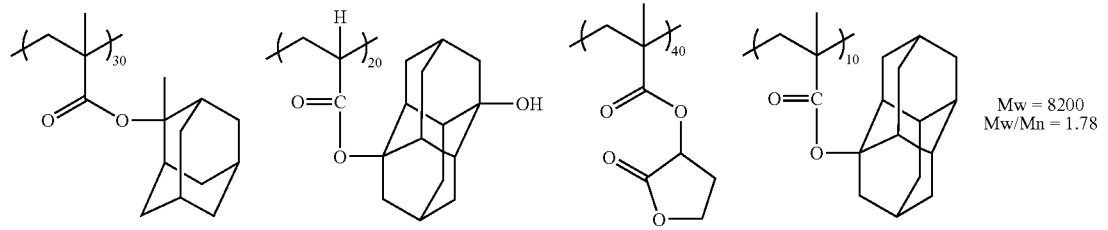
Mw = 8200
Mw/Mn = 1.78
(RA-16)
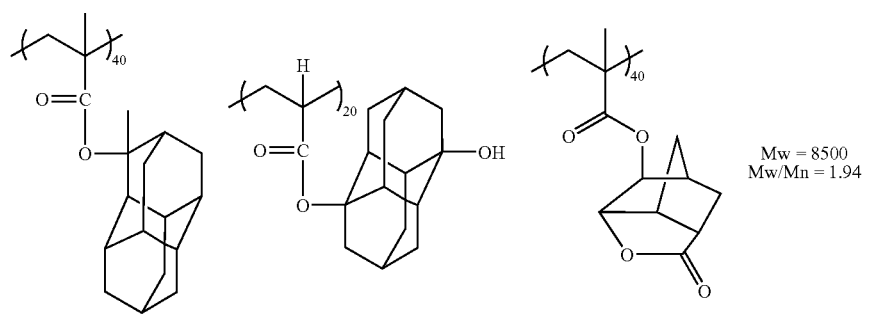
Mw = 8500
Mw/Mn = 1.94

-continued (RA-17)

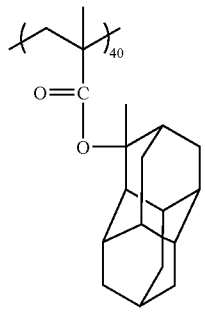 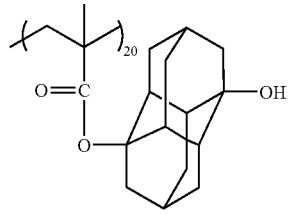 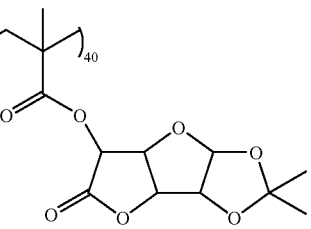

Mw = 13300
Mw/Mn = 2.03

(RA-18)

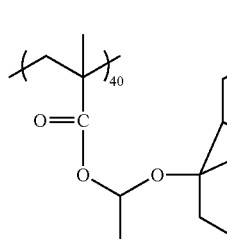 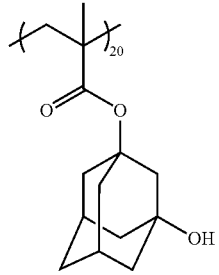 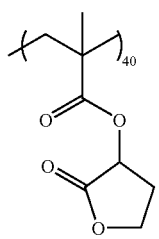

Mw = 27000
Mw/Mn = 1.90

Synthesis Examples of Acid Generators

Synthesis Example 1

Synthesis of Compound (A-1)

A mixture of 13.2 g (43.4 mmol) of ethylpropanyl pentafuorobenzenesulfonate, 12.1 g (65.1 mmol) of 1-dodecanol, 1.47 g (4.34 mmol) of tetrabutylammonium hydrogen sulfate, 130 mL of a 1M water solution of sodium hydroxide and 130 mL of toluene was stirred for 12 hours at 70° C. The reaction solution thus obtained was rendered neutral by addition of dilute sulfuric acid, and the organic layer was dried with magnesium sulfate. After removal of the solvent, the residue was purified by column chromatography (SiO₂, ethyl acetate/hexane=10/1) to give a colorless transparent oil (17.4 g). This oil was dissolved in 160 mL of acetonitrile, and thereto 5.93 g (39.6 mmol) of sodium iodide was added and stirred for 6 hours at room temperature. The reaction solution thus obtained was cooled by means of an ice bath. The solid matter thus deposited was filtered off, and then vacuum-dried to give 17.4 g (37 mmol, 85% yield) of 4-dodecyloxy-2,3,5,6-tetrafluorobenzenesulfonic acid as a whitish-yellow solid.

$^1$H-NMR (300 MHz, (CD₃)₂SO) δ 0.854 (t, 3H), 1.243 (bs, 16H), 1.392 (quintet, 2H), 1.655 (quintet, 2H), 4.212 (t, 2H)

$^{19}$F-NMR (300 MHz, (CD₃)₂SO) δ-137.11 (m, 2F), –152.66 (m, 2F)

A mixture of 2.82 g (7.21 mmol) of triphenylsulfonium iodide, 1.26 g (7.57 mmol) of silver acetate, 80 mL of acetonitrile and 40 mL of water was stirred for one hour at room temperature. The reaction solution thus obtained was filtered to obtain a triphenylsulfonium acetate solution. To this solution, 3.00 g (6.87 mmol) of sodium salt of the sulfonic acid prepared in advance was added and stirred for 3 hours at room temperature. To the resulting solution, 300 mL of chloroform was added, and the organic layer was washed with successive water, a saturated aqueous solution of ammonium chloride, and water. The resulting organic layer was passed through a 0.1-μm filter, and the solvent was removed. Thus, the intended compound (4.40 g, 84% yield) was obtained as a colorless transparent oil.

$^1$H-NMR (300 MHz, CDCl₃) δ 0.877 (t, 3H), 1.262 (bs, 16H), 1.427 (quintet, 2H), 1.729 (m, 2H), 4.177 (t, 2H), 7.662-7.813 (m, 15H)

$^{19}$F-NMR (300 MHz, CDCl₃) δ-140.01 (m, 2F), –156.21 (m, 2F)

(A-1)

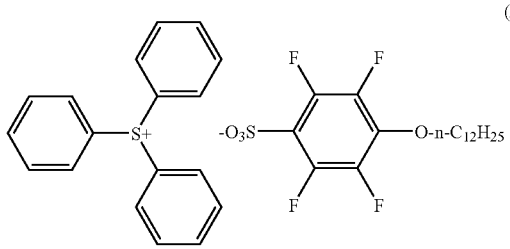

Synthesis 2

Synthesis of Compound I-1

I-1: Triphenylsulfonium-1,1,2,2,3,3-hexafluoro-3-(piperidine-1-sulfonyl)propane-1-sulfonate In a stream of nitrogen, a mixture of 4.0 g (12.65 mmol) of 1,1,2,2,3,3-hexafluoropropane-1,3-disulfonyl difluoride, 2.56 g (25.3 mmol) of triethylamine and 30 mL of diisopropyl ether were cooled by means of an ice bath, and thereto a mixed solution of 1.08 g (12.6 mmol) of piperidine and 15 mL of diisopropyl ether was added dropwise over a 30-minute period. The resulting solution was stirred for one hour as it was cooled by means of an ice bath, and further stirred for one hour at room temperature. The organic layer was washed with successive water, a saturated aqueous solution of ammonium chloride, and water, and the resulting organic layer was dried with sodium sulfate. The solvent was removed, and the residue was admixed with 20 mL of ethanol and 200 mg of sodium hydroxide and stirred for 2 hours at room temperature. The reaction solution thus obtained was rendered neutral by addition of dilute hydrochloric acid. Thus, an ethanol solution of sulfonic acid illustrated by the following formula was obtained.

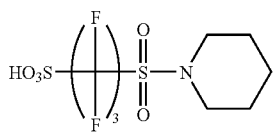

To the sulfonic acid solution obtained, a triphenylsulfonium acetate solution was added and stirred for 2 hours at room temperature. Thereto, 300 mL of chloroform was added, and the organic layer was washed with successive water, a saturated aqueous solution of ammonium chloride, and water. The thus washed organic layer was purified by column chromatography (SiO$_2$, chloroform/methanol=5/1) to give 3.0 g (4.68 mmol) of white solid.

Incidentally, the triphenylsulfonium acetate solution was prepared by admixing 5.07 g (13 mmol) of triphenylsulfonium iodide, 2.25 g (13.5 mmol) of silver acetate, 120 mL of acetonitrile and 60 mL of water, stirring the admixture for 1 hour at room temperature, and filtering the resulting reaction solution.

$^1$H-NMR (300 MHz, CDCl$_3$) δ 1.64 (bs, 6H), 3.29 (bs, 2H), 3.64 (bs, 2H), 7.70 (m, 15H)

$^{19}$F-NMR (300 MHz, CDCl$_3$) δ-111.1 (t, 2F), −114.3 (t, 2F), −119.4 (m, 2F)

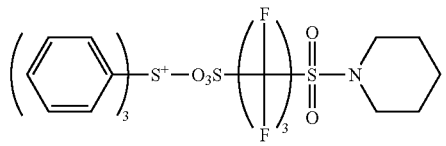

(I-1)

Synthesis Example 3

Synthesis of Compound (II-1)

In a 2:1 (by mass) mixture of acetonitrile and distilled water, 3.3 g of triphenylsulfonium iodide was dissolved. To this solution, 1.5 g of silver acetate was added, and stirred for 30 minutes. The silver compound thus deposited was filtered out, and to the filtrate was added a solution prepared by dissolving 3.0 g of Compound (IA) illustrated below in a 2:1 (by mass) mixture of acetonitrile and distilled water. The reaction solution was concentrated, and dissolved in 200 ml of chloroform. The resulting solution was washed with successive distilled water, an aqueous solution of ammonium chloride, and water. The organic phase was passed through a 0.1-μm polyfluorotetraethylene filter, and concentrated to give 4.2 g of Compound II-1.

$^1$H-NMR (300 MHz, CHCl$_3$) δ 7.6-7.8 (m, 15H)
$^{19}$F-NMR (300 MHz, CHCl$_3$) δ 115.59 (4F), δ 122.29 (2F)

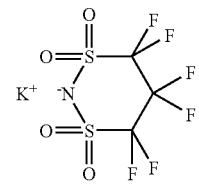

(IA)

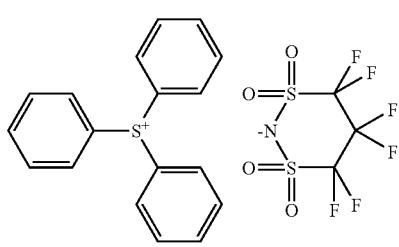

II-1

In accordance with the synthesis methods mentioned above, photo-acid generators used in the following Examples were synthesized.

Examples 1 to 18 and Comparative Examples 1 and 2

<Preparation of Resist>

Positive resist solutions were prepared by dissolving their individual combinations of ingredients shown in Table 1 in their individual mixed solvents shown in Table 1 so as to have the same solids concentration of 8 mass %, and then by passing the resulting solutions each through a 0.05-μm polyethylene filter. The positive resist solutions thus prepared were evaluated by the methods described below, and results obtained are also shown in Table 1.

TABLE 1

| Example | Photo-acid Generator (0.06 g) | Resin (2 g) | Basic Compound (4 mg) | Surfactant (0.1 mg) | Solvent | Number of Microbridge Development Defects (Number/cm$^2$) | MEF |
|---|---|---|---|---|---|---|---|
| 1 | A-1 | RA-3 | N-1 | W-1 | S1/S4 = 95/5 | 0.31 | 2.1 |
| 2 | A-7 | RA-6 | N-9 | W-4 | S1/S6 = 80/20 | 0.03 | 2.3 |
| 3 | A-5 | RA-8 | N-8 | W-4 | S1/S5 = 80/20 | 0.16 | 1.9 |
| 4 | A-4 | RA-17 | N-2 | W-2 | S1/S3 = 60/40 | 0.06 | 2.4 |
| 5 | A-1/z1 = 50/50 | RA-18 | N-5 | W-3 | S1/S5/S7 = 70/28/2 | 0.03 | 1.8 |
| 6 | A-7/z2 = 30/70 | RA-10 | N-4 | W-3 | S1/S2 = 80/20 | 0.05 | 1.9 |
| 7 | A-4/z36 = 70/30 | RA-1 | N-6 | W-1 | S1/S6 = 70/30 | 0.23 | 2.2 |
| 8 | A-5/z56 = 60/40 | RA-15 | N-3 | W-3 | S1/S5 = 60/40 | 0.11 | 2.3 |

TABLE 1-continued

| Example | Photo-acid Generator (0.06 g) | Resin (2 g) | Basic Compound (4 mg) | Surfactant (0.1 mg) | Solvent | Number of Microbridge Development Defects (Number/cm$^2$) | MEF |
|---|---|---|---|---|---|---|---|
| 9 | I-1/z2 = 50/50 | RA-9 | N-2/N-7 = 7/3 | W-4 | S1/S4 = 95/5 | 0.3 | 2.1 |
| 10 | I-89/z56 = 80/20 | RA-2 | N-10 | W-4 | S1/S2 = 80/20 | 0.25 | 1.9 |
| 11 | I-43/z1 = 60/40 | RA-7 | N-8 | W-2 | S1/S3 = 60/40 | 0.26 | 1.8 |
| 12 | II-3 | RA-13 | N-8 | W-3 | S1/S5/S7 = 70/28/2 | 0.06 | 2.1 |
| 13 | II-30 | RA-16 | N-10 | W-3 | S1/S6 = 70/30 | 0.08 | 1.8 |
| 14 | II-2 | RA-4 | N-9 | W-1 | S1/S4 = 95/5 | 0.24 | 2.2 |
| 15 | II-1 | RA-12 | N-6 | W-2 | S1/S5 = 80/20 | 0.18 | 2.0 |
| 16 | II-1/z56 = 30/70 | RA-14 | N-2 | W-4 | S1/S3 = 60/40 | 0.18 | 1.9 |
| 17 | II-3/z55 = 50/50 | RA-11 | N-4 | W-4 | S1/S6 = 80/20 | 0.42 | 2.3 |
| 18 | II-3/z1 = 80/20 | RA-5 | N-3 | W-1 | S1/S3 = 60/40 | 0.29 | 2.0 |
| Compar. Example 1 | z1 | RA-1' | N-8 | W-1 | S1/S4 = 95/5 | 25.61 | 4.6 |
| Compar. Example 2 | z2 | RA-1" | N-4 | W-4 | S1/S5 = 60/40 | 10.31 | 4.3 |

All ratios set forth in Table 1 when two or three constituents were used for each ingredient are by mass.
The ingredients expressed by symbols in Table 1 denote the following ones.
(Basic Compound)
N-1: 2,4,5-Triphenylimidazole
N-2: 2-Phenylbenzimidazole
N-3: Triphenylsulfonium acetate
N-4: 2,6-Diisopropylaniline
N-5: Dicyclohexylmethylamine
N-6: Tripentylamine
N-7: Hydroxyantipyrine
N-8: Tetrabutylammonium hydroxide
N-9: Tris(methoxyethoxyethyl)amine
N-10: N-Phenyldiethanolamine
(Surfactant)
W-1: Megafac F176 (fluorine-containing surfactant, manufactured by Dainippon Ink & Chemicals, Inc.)
W-2: Megafac R08 (fluorine- and silicon-containing surfactant, manufactured by Dainippon Ink & Chemicals, Inc.)
W-3: Organopolysiloxane polymer KP-341 (silicone surfactant, manufactured by Shin-Etsu Chemical Co., Ltd.)
W-4: Troysol S-336 (manufactured by Troy Chemical Industries, Inc.)
(Solvent)
S1: Propylene glycol methyl ether acetate
S2: 2-Heptane
S3: Cyclohexanone
S4: γ-Butyrolactone
S5: Propylene glycol methyl ether
S6: Ethyl lactate
S7: Propylene carbonate <Resist Evaluation>

On a silicon substrate, ARC-29A produced by Brewer Science Inc. was coated in a thickness of 780 angstroms by means of a spin coater, and then dried at 205° C. for 60 seconds to form an antireflective coating. On this coating, each of the positive resist compositions was further coated with a spin coater, and dried at 110° C. for 60 seconds, thereby forming a resist film having a thickness of 180 nm.

Each of the thus formed resist films was subjected to pattern exposure via a halftone phase-shift mask having a transmittance of 6% by using an ArF excimer laser stepper (made by ASML: NA=0.75, 2/3 zone) through a mask. Thereafter, each resist film was heated for 60 seconds on a 120° C. hot plate. Then, it was developed with a 2.38 mass % aqueous solution of tetramethylammonium hydroxide for 30 seconds (at 23° C.), rinsed with purified water for 30 seconds, and then spin-dried to form patterns.

Development Defectiveness Evaluation Method

Over the whole area on an 8-inch wafer were formed 90-nm dense patterns with a line/space ratio of 1:1 (pitch=180 nm), and then evaluations of development defectiveness were performed on the line patterns by use of KLA2360 (made by KLA-Tencor Corporation). Based on the development defect coordinate obtained, reviews were further made with a Critical Dimension scanning electron microscope (S-8840, made by Hitachi Ltd.), and thereby the number of microbridge defects was quantified. Herein, the development defectiveness was defined as (total number of microbridge defects counted/area of observed region), and its scale was in number/cm$^2$. So, the smaller the number the better the performance.

MEF Evaluation Method

The resist patterns used for evaluation were 90-nm dense patterns with a line/space ratio of 1:1 (pitch=180 nm). The exposure amount (Eopt) reproducing the foregoing mask size was determined with a Critical Dimension scanning electron microscope (S-8840, made by Hitachi Ltd.), and the finished sizes of 86-nm and 94-nm line mask patterns (90 nm±4 nm, with the pitch fixed to 180 nm) were further measured assuming that the mask sizes under the Eopt determined would vary. Herein, the finished sizes of 86-nm and 94-nm line pattern masks were symbolized by CD1 (nm) and CD2 (nm), and (CD2-CD1)/(94-86) was defined as MEF performance.

This ratio represents a variance of finished size per 1 nm of variation in mask sizes. So, the smaller the numerical value thereof the better the MEF performance.

As can be seen from the results shown in Table 1, the photosensitive compositions according to the invention are reduced in both development defectiveness and MEF, and deliver excellent performances.

Even when they are used for formation of fine patterns 100 nm or below in line width, positive-working photosensitive compositions according to the invention have reduced development defectiveness and mask error factor, and can consistently form fine patterns of good quality.

The entire disclosure of each and every foreign patent application from which the benefit of foreign priority has been claimed in the present application is incorporated herein by reference, as if fully set forth.

What is claimed is:

1. A positive-working photosensitive composition comprising:
   (A) a resin that comprises a repeating unit having a diamantane structure and can decompose under action of an acid to increase solubility in an alkali developer, and wherein the resin (A) has a weight-average molecular weight of 3,000 to 30,000 and a dispersion degree of 1.4 to 2.1;
   (B) a compound that can generate an organic acid represented by formula (2), (3), (3'), (4) or (5) upon irradiation with an actinic ray or radiation; and
   (C) a solvent,

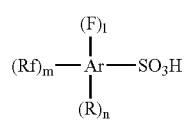

(2)

in formula (2), Rf represents an organic group having a fluorine atom, R represents a hydroxyl group or an organic group, Ar represents an aromatic group, l represents an integer of 1 to 6, m represents an integer of 0 to 4, and n represents an integer of 0 to 4, provided that m+n is an integer of 1 or above,

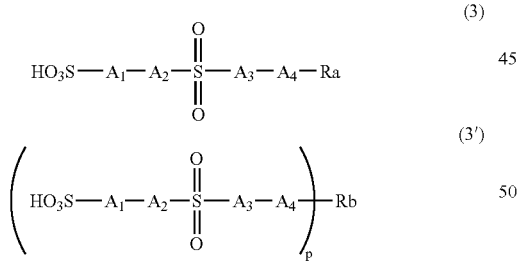

in formulae (3) and (3'), $A_1$ represents a divalent linkage group, $A_2$ and $A_3$ each independently represents a single bond, an oxygen atom or —N(Rx)—, Rx represents a hydrogen atom, an aryl group, an alkyl group or a cycloalkyl group, $A_4$ represents a single bond or —C(=O)—, Ra represents a hydrogen atom or an organic group, p represents 2 or 3, Rb represents a p-valent linkage group, and when $A_3$ is —N(Rx)—, Ra and Rx, or Rb and Rx may combine with each other to form a ring,

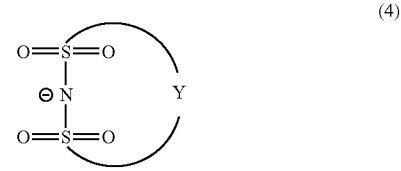

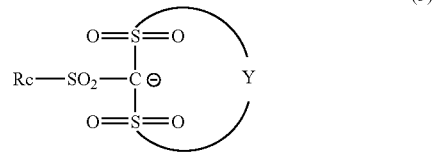

in formulae (4) and (5), Y represents an alkylene group substituted with at least one fluorine atom, and Rc represents an alkyl group or a cycloalkyl group.

2. The positive-working photosensitive composition according to claim 1, wherein the resin (A) has a weight-average molecular weight of 6,500 to 27,000 and a dispersion degree of 1.50 to 2.03.

3. The positive-working photosensitive composition according to claim 1, wherein the resin (A) further comprises a repeating unit having an adamantane structure.

4. The positive-working photosensitive composition according to claim 1, wherein the resin (A) further comprises an acid-indecomposable repeating unit.

5. The positive-working photosensitive composition according to claim 1, wherein the solvent (C) comprises an alkylene glycol monoalkyl ether carboxylate.

6. The positive-working photosensitive composition according to claim 5, wherein the solvent (C) further comprises at least one additional solvent selected from solvents each having at least one functional group selected from a hydroxyl group, a ketone group, a lactone group, an ester group, an ether group or a carbonate group.

7. The positive-working photosensitive composition according to claim 6, wherein the alkylene glycol monoalkyl ether carboxylate is propylene glycol monomethyl ether acetate, and said at least one additional solvent is at least one solvent selected from propylene glycol monomethyl ether, cyclohexanone, γ-butyrolactone, butyl acetate or ethyl lactate.

8. The positive-working photosensitive composition according to claim 1, wherein the resin (A) is a resin synthesized by drop polymerization.

9. A pattern forming method comprising:
   forming a photosensitive film from the positive-working photosensitive composition according to claim 1; and exposing and developing the photosensitive film.

* * * * *